US012610683B2

(12) United States Patent
Yamazaki et al.

(10) Patent No.: US 12,610,683 B2
(45) Date of Patent: Apr. 21, 2026

(54) DISPLAY DEVICE, METHOD FOR MANUFACTURING DISPLAY DEVICE, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Atsugi (JP); Ryota Hodo, Atsugi (JP); Yuichi Yanagisawa, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 346 days.

(21) Appl. No.: 18/257,629

(22) PCT Filed: Dec. 7, 2021

(86) PCT No.: PCT/IB2021/061384
§ 371 (c)(1),
(2) Date: Jun. 15, 2023

(87) PCT Pub. No.: WO2022/130117
PCT Pub. Date: Jun. 23, 2022

(65) Prior Publication Data
US 2024/0107861 A1     Mar. 28, 2024

(30) Foreign Application Priority Data

| | | |
|---|---|---|
| Dec. 18, 2020 | (JP) | 2020-210405 |
| Dec. 24, 2020 | (JP) | 2020-214449 |
| Dec. 29, 2020 | (JP) | 2020-219838 |

(51) Int. Cl.
*H10K 59/80* (2023.01)
*H10K 50/11* (2023.01)
(Continued)

(52) U.S. Cl.
CPC ......... *H10K 50/11* (2023.02); *H10K 59/1201* (2023.02); *H10K 59/1213* (2023.02);
(Continued)

(58) Field of Classification Search
CPC ............... H10K 50/11; H10K 59/1201; H10K 59/1213; H10K 59/878
(Continued)

(56) References Cited

U.S. PATENT DOCUMENTS 8,237,361 B2     8/2012   Imai et al.
11,183,669 B2   11/2021   Lim et al.
(Continued)

FOREIGN PATENT DOCUMENTS

CN       101326858 A     12/2008
CN       110581228 A     12/2019
(Continued)

OTHER PUBLICATIONS

International Search Report (Application No. PCT/IB2021/061384) Dated Feb. 22, 2022.
(Continued)

*Primary Examiner* — Dzung Tran
(74) *Attorney, Agent, or Firm* — Fish & Richardson P.C.

(57) ABSTRACT

A display device capable of displaying high-quality images can be provided. A display device includes a first light-emitting element, a second light-emitting element, a first protective layer, a second protective layer, and a gap. The first light-emitting element includes a first lower electrode, a first EL layer over the first lower electrode, a first upper electrode over the first EL layer, and the second light-emitting element includes a second lower electrode, a second EL layer over the second lower electrode, and a second upper electrode over the second EL layer. The first light-emitting element and the second light-emitting element are
(Continued)

adjacent to each other. The first protective layer is provided over the first light-emitting element and the second light-emitting element and includes a region in contact with the side surface of the first EL layer and the side surface of the second EL layer. The second protective layer is provided over the first protective layer. The gap is provided between the first EL layer and the second EL layer and is provided between the first protective layer and the second protective layer.

10 Claims, 37 Drawing Sheets

(51) Int. Cl.

| | |
|---|---|
| *H10K 59/12* | (2023.01) |
| *H10K 59/121* | (2023.01) |
| *H10K 59/131* | (2023.01) |
| *H10K 102/00* | (2023.01) |

(52) U.S. Cl.
CPC ......... *H10K 59/878* (2023.02); *H10K 59/131* (2023.02); *H10K 59/80518* (2023.02); *H10K 59/879* (2023.02); *H10K 2102/3026* (2023.02)

(58) Field of Classification Search
USPC ........................................................ 257/40
See application file for complete search history.

(56) References Cited

U.S. PATENT DOCUMENTS

| | | |
|---|---|---|
| 2012/0020085 A1 | 1/2012 | Ikeda et al. |
| 2012/0033119 A1 | 2/2012 | Shinohara |
| 2012/0217516 A1 | 8/2012 | Hatano et al. |
| 2012/0280614 A1 | 11/2012 | Imai et al. |
| 2012/0306357 A1 | 12/2012 | Yamamoto et al. |
| 2013/0248827 A1 | 9/2013 | Togano et al. |
| 2014/0361260 A1 | 12/2014 | Kim et al. |
| 2016/0181532 A1 | 6/2016 | Ando et al. |
| 2019/0379006 A1 | 12/2019 | Lim et al. |
| 2020/0057330 A1 | 2/2020 | Yamazaki et al. |
| 2020/0144342 A1 | 5/2020 | Shim et al. |
| 2022/0238836 A1 | 7/2022 | Okazaki et al. |
| 2022/0255045 A1 | 8/2022 | Yamazaki et al. |

FOREIGN PATENT DOCUMENTS

| | | |
|---|---|---|
| EP | 3581985 A | 12/2019 |
| JP | 2007-080713 A | 3/2007 |
| JP | 2007-184251 A | 7/2007 |
| JP | 2010-251117 A | 11/2010 |
| JP | 2013-222599 A | 10/2013 |
| JP | 2019-215541 A | 12/2019 |
| KR | 2008-0073320 A | 8/2008 |
| KR | 2019-0140348 A | 12/2019 |
| TW | 200735702 | 9/2007 |
| WO | WO-2018/087625 | 5/2018 |

OTHER PUBLICATIONS

Written Opinion (Application No. PCT/IB2021/061384) Dated Feb. 22, 2022.

FIG. 1

FIG. 2A
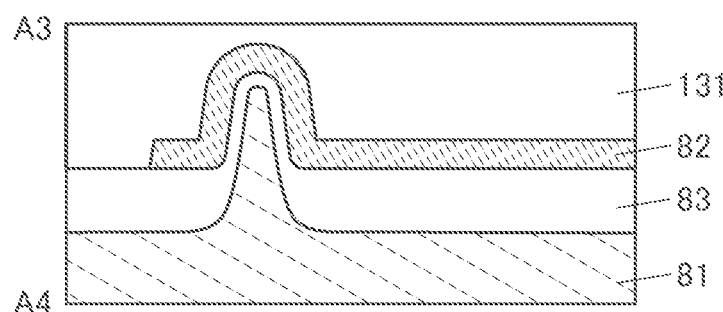
FIG. 2B
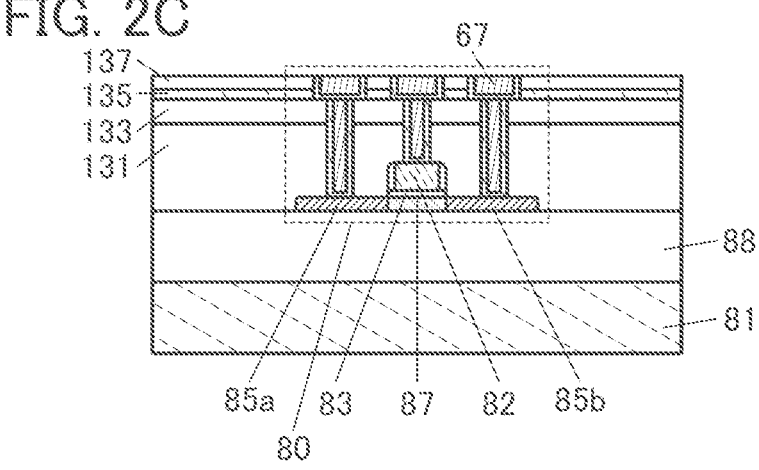
FIG. 2C

FIG. 5
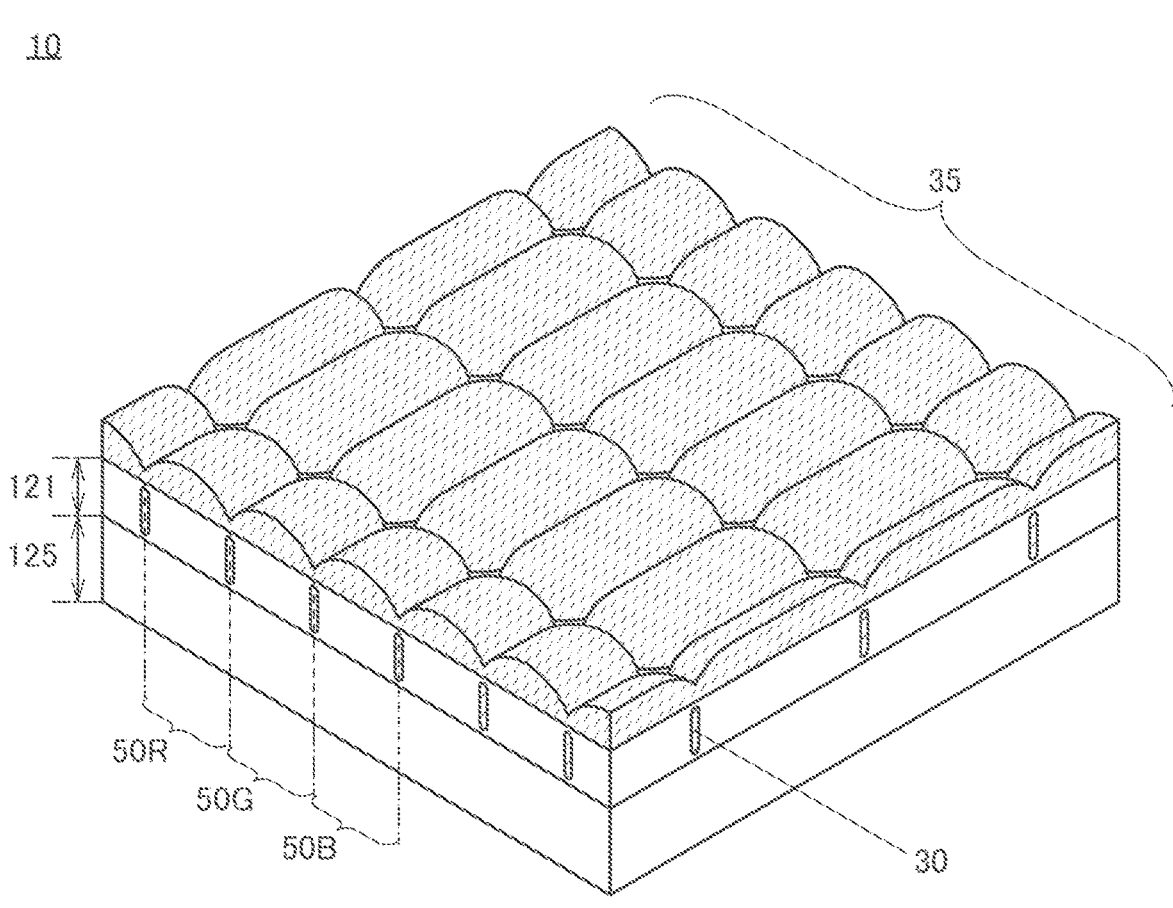

FIG. 11
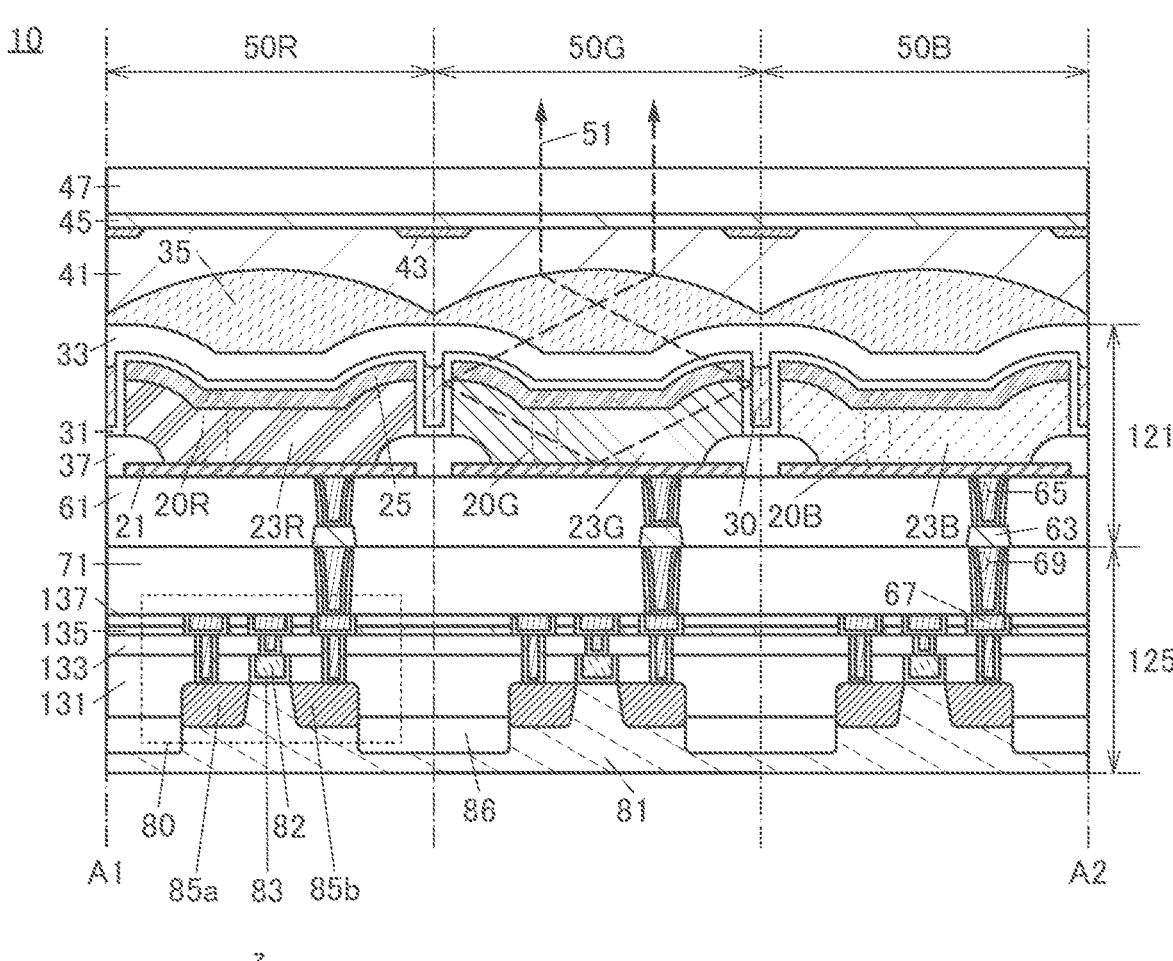

10

50R    50G    50B 47
45
35    43
41
33
31
37
61    21    20R    23R    25    20G    23G    30 20B    23B    63    65
70
71
137
135    67
133
131

80    82    86    81

A1    A2

85a    83    85b 121
123
125

51 z
y    x 10     50R          50G          50B 47
45
41     35          43
39
38          30
31
61     21  20R  23R     25     20G     23G 23B     20B  63     65
71                                                          69
137                                                  67
135
133
131

80          82     86     81
A1     85a  83  85b          A2

121

125 z
y ⊗ → x

FIG. 18A
10
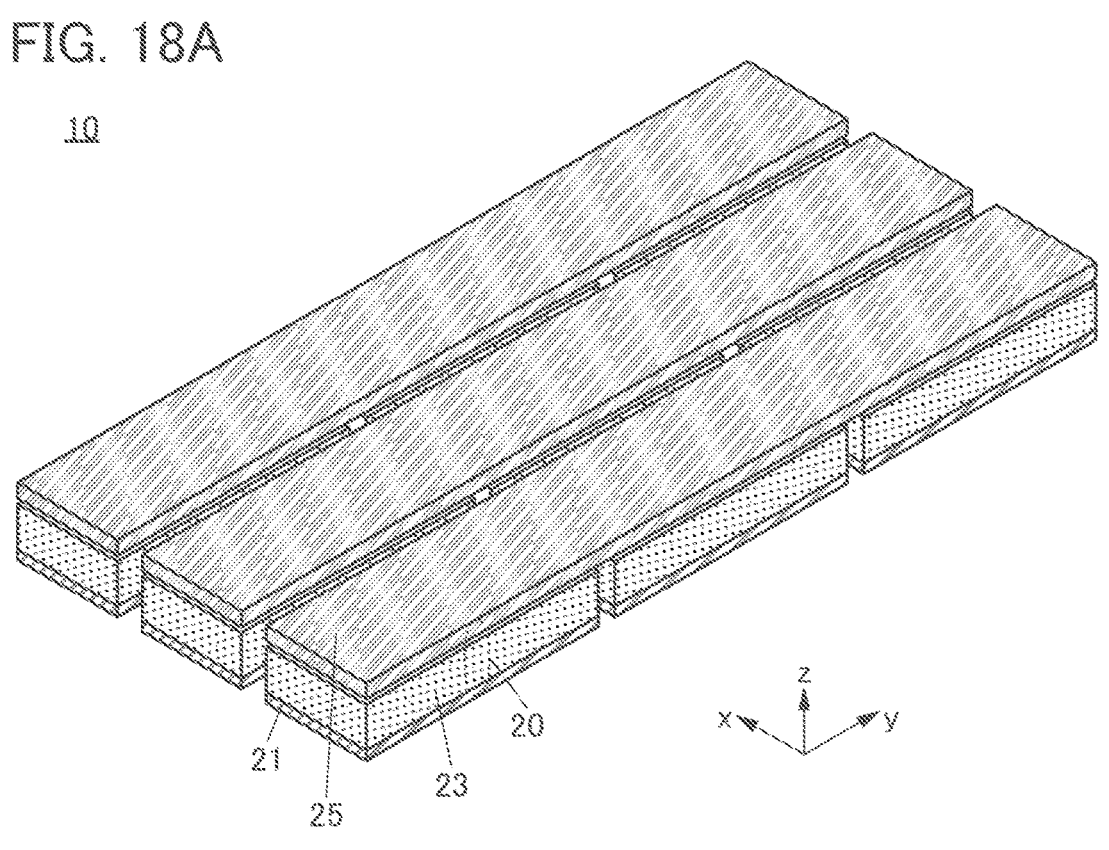
FIG. 18B
FIG. 18C
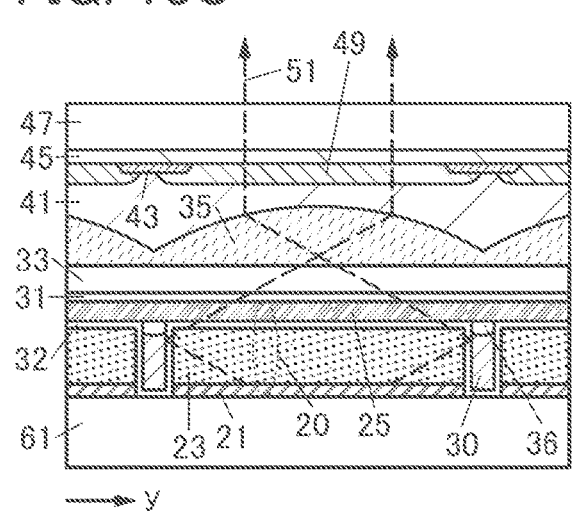

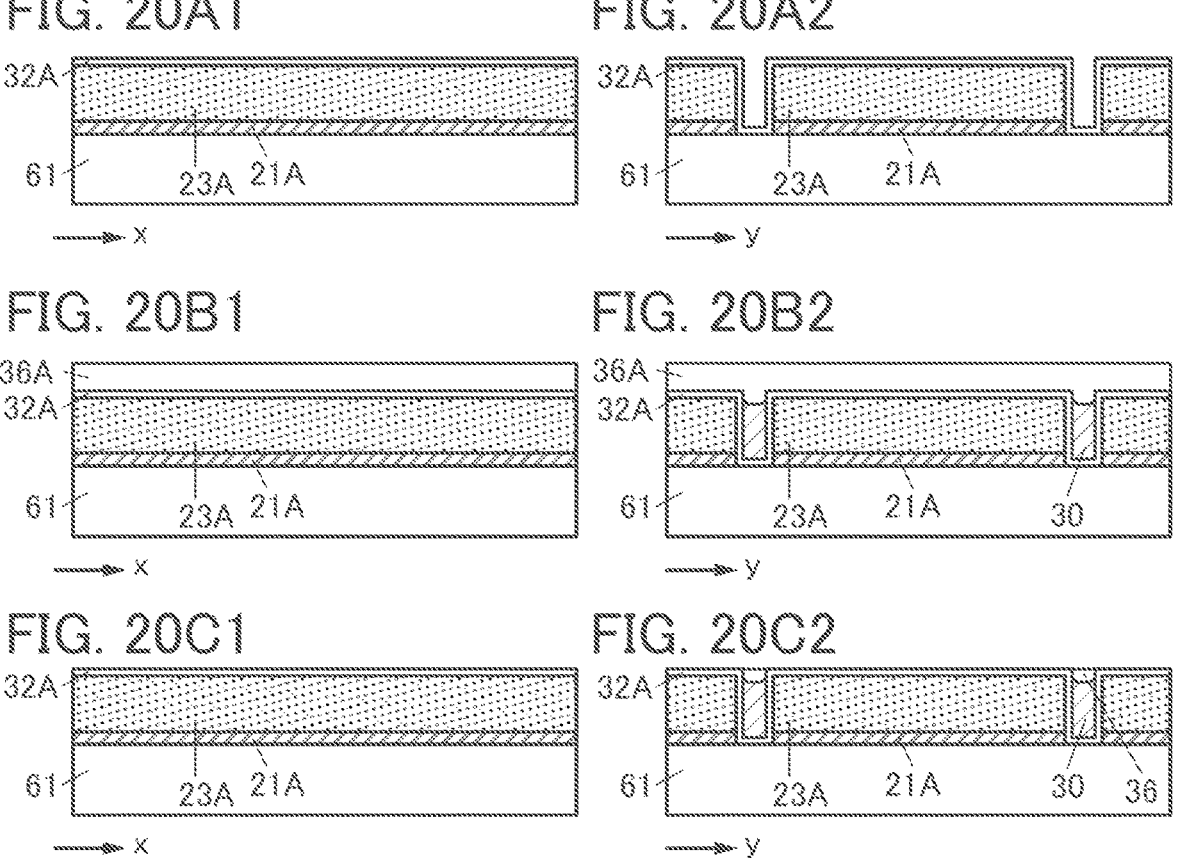

FIG. 26A1        FIG. 26A2
FIG. 26B1        FIG. 26B2
FIG. 26C1        FIG. 26C2
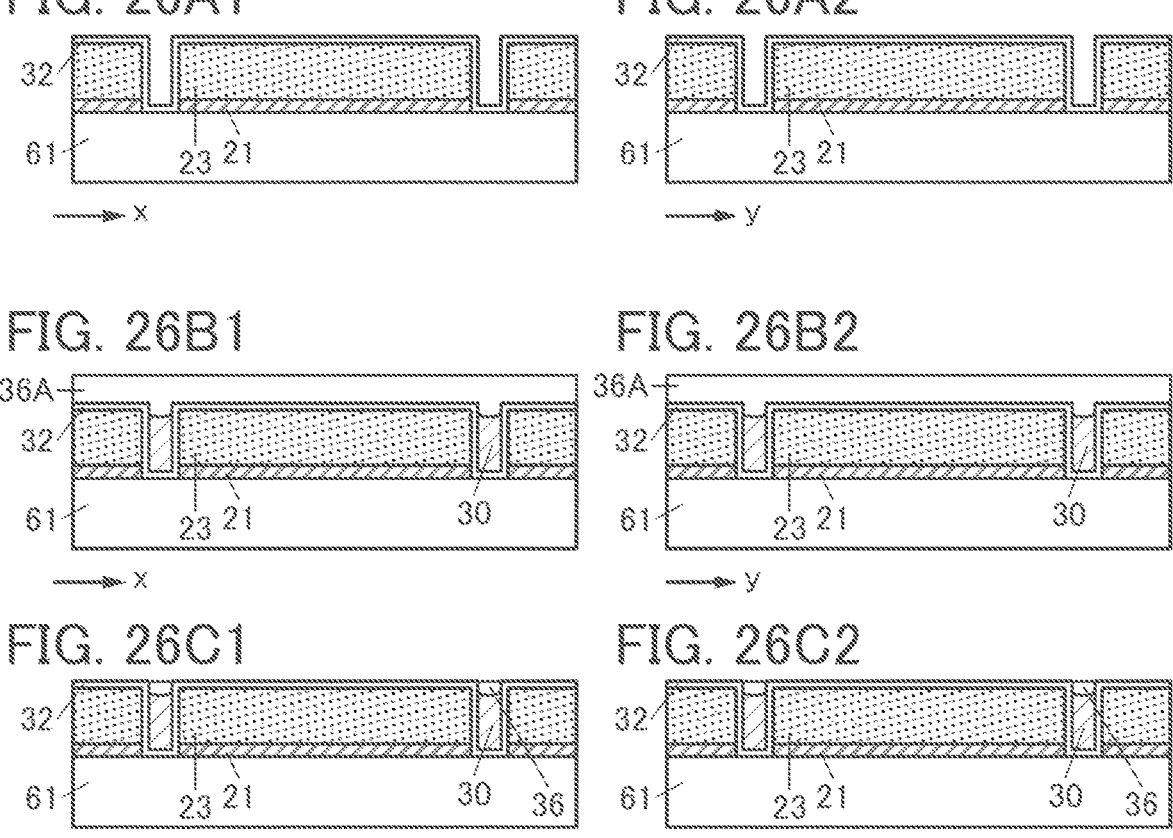

FIG. 31A
FIG. 31C
FIG. 31B
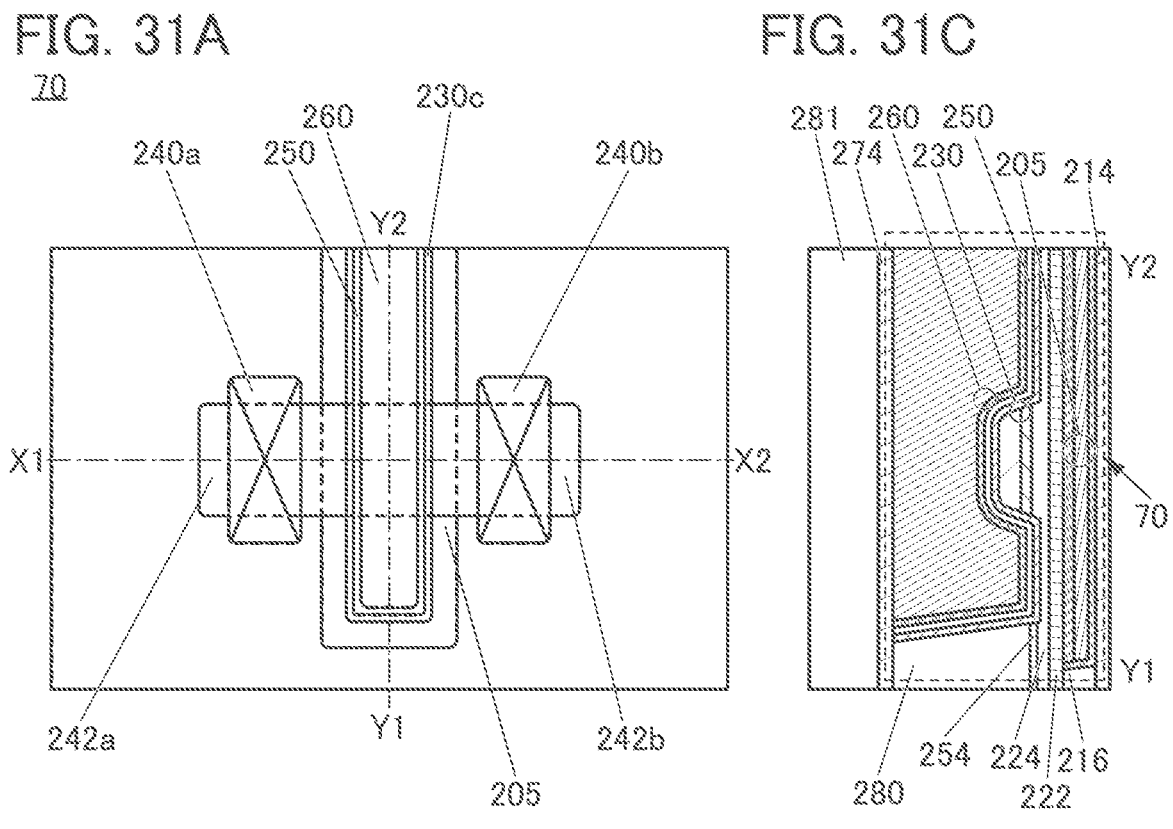
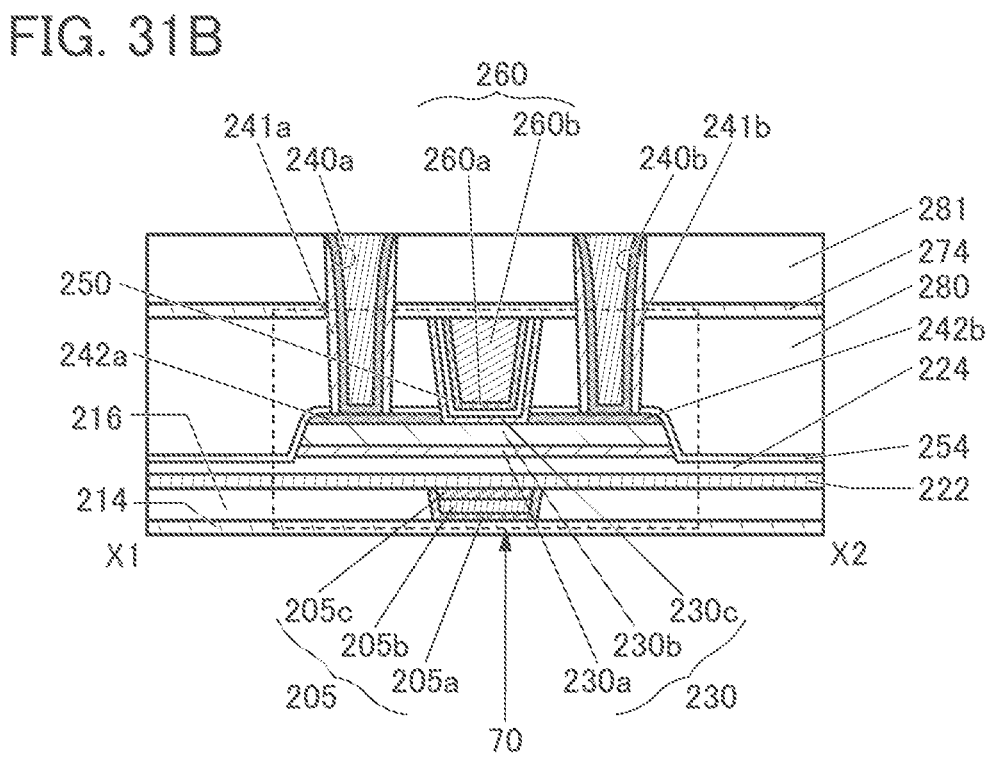

FIG. 32A
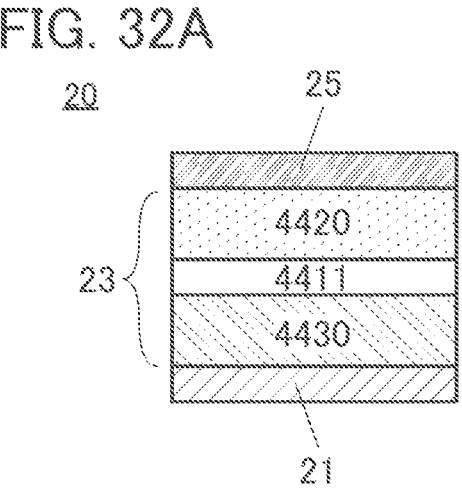
FIG. 32B
FIG. 32C
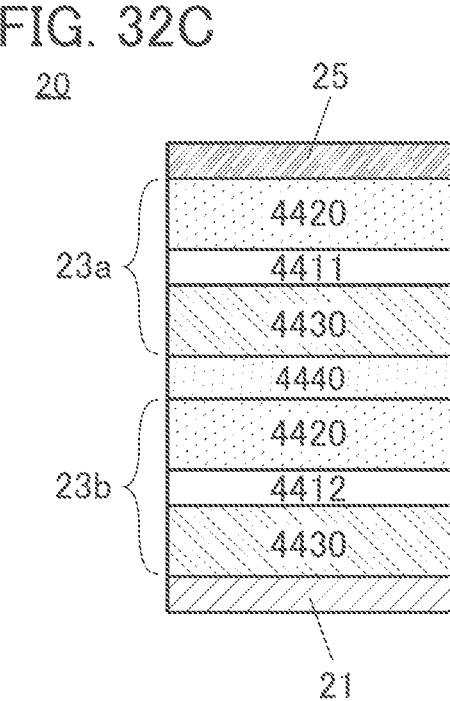

FIG. 33A
Intermediate state
New crystalline phase
| Amorphous | Crystalline | Crystal |
|---|---|---|
| ·completely amorphous | ·CAAC<br>·nc<br>·CAC<br><br>excluding single crystal and poly crystal | ·single crystal<br>·poly crystal |
FIG. 33B
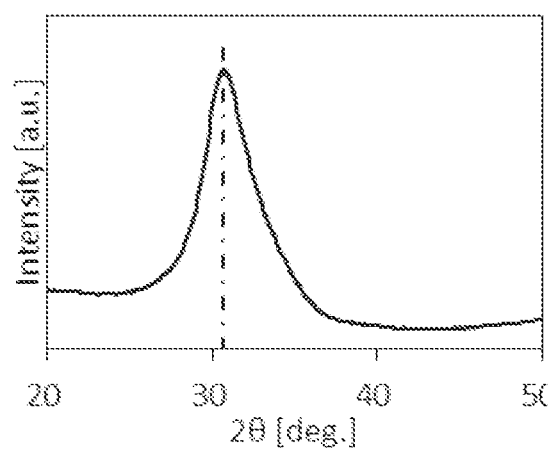
FIG. 33C
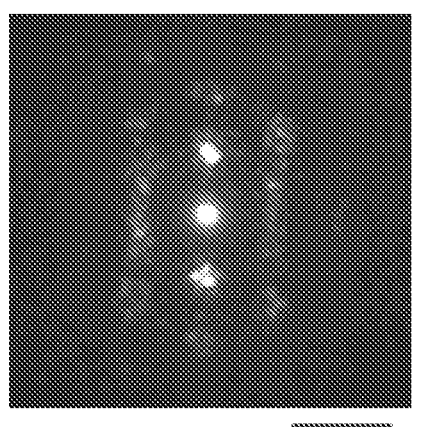
5nm⁻¹

8200

8201

8206

8202

8205

8203

8204

8300

8301

8304

8306

8300

8301

8302

8305

8304

8300

8305

8301

8302

9101

9003
9007
9000
9001
9050
9005
9051
9009
9006
9006

9200

9003
9006
9000
9251
9001
9252
9253
9005
9007
9009

FIG. 37A
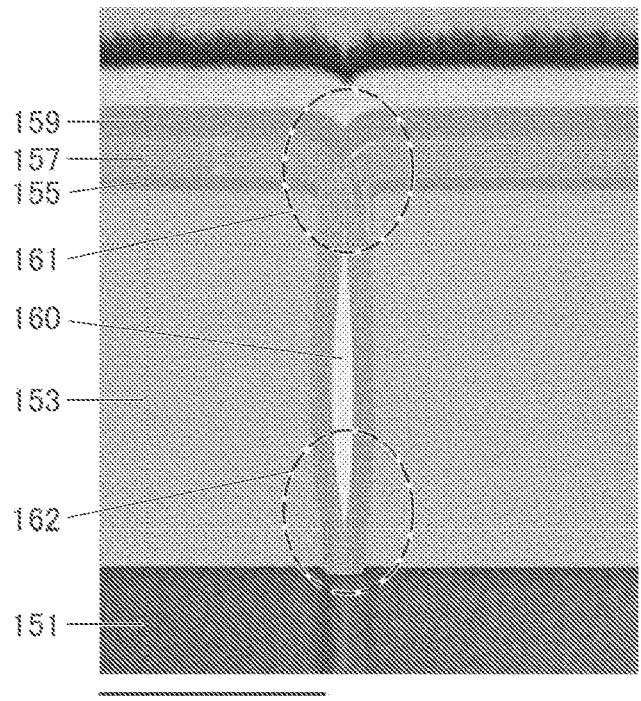
300nm
FIG. 37B1
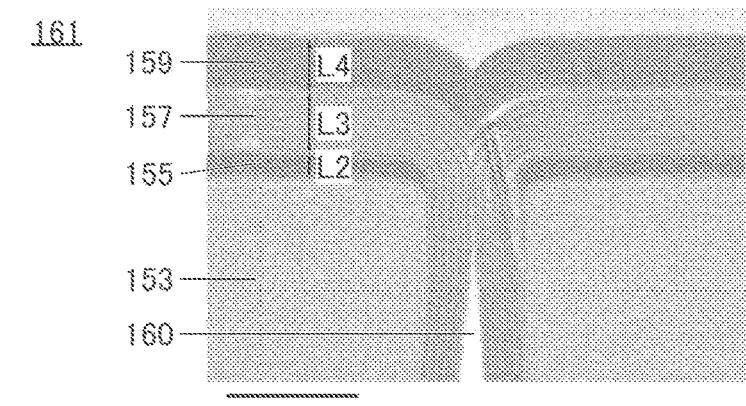
100nm
FIG. 37B2
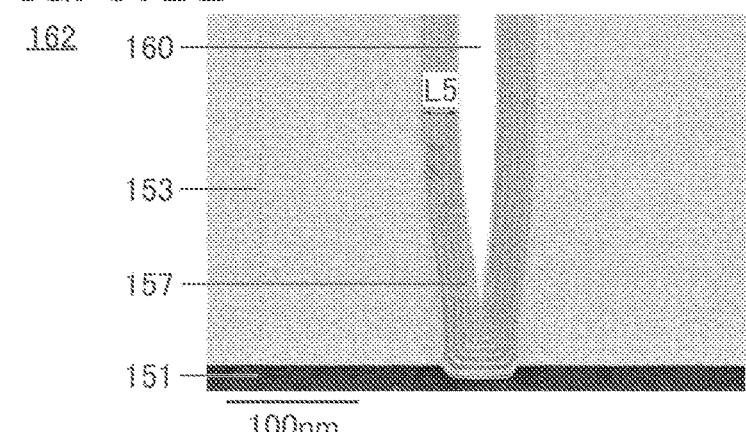
100nm

DISPLAY DEVICE, METHOD FOR MANUFACTURING DISPLAY DEVICE, AND ELECTRONIC DEVICE

CROSS REFERENCE TO RELATED APPLICATIONS

This application is a U.S. National Phase Application under 35 U.S.C. § 371 of International Application PCT/IB2021/061384, filed on Dec. 7, 2021, which is incorporated by reference and claims the benefit of foreign priority applications filed in Japan on Dec. 18, 2020, as Application No. 2020-210405, on Dec. 24, 2020, as Application No. 2020-214449, and on Dec. 29, 2020, as Application No. 2020-219838.

TECHNICAL FIELD

One embodiment of the present invention relates to a display device and a method for manufacturing the display device. One embodiment of the present invention relates to an electronic device.

Note that one embodiment of the present invention is not limited to the above technical field. The technical field of one embodiment of the invention disclosed in this specification and the like relates to an object, a method, or a method for manufacturing. Alternatively, one embodiment of the present invention relates to a process, a machine, manufacture, or a composition of matter. Thus, more specifically, examples of the technical field of one embodiment of the present invention disclosed in this specification include a semiconductor device, a display device, a light-emitting apparatus, a power storage device, a memory device, driving methods thereof, or methods for manufacturing them.

Background Art

In recent years, display devices have been expected to be applied to a variety of uses. Examples of uses for a large display device include a television device for home use (also referred to as a TV or a television receiver), digital signage, and a PID (Public Information Display). In addition, a smartphone, a tablet terminal, and the like including a touch panel are being developed as portable information terminals.

Furthermore, higher resolution of display devices have been required. For example, devices for virtual reality (VR), augmented reality (AR), substitutional reality (SR), or mixed reality (MR) are given as devices requiring high-resolution display devices and have been actively developed in recent years.

Light-emitting apparatuses including light-emitting elements (also referred to as light-emitting devices) have been developed as display devices, for example. In particular, light-emitting elements (also referred to as EL elements or EL devices) utilizing an electroluminescence (hereinafter referred to as EL) phenomenon have features such as ease of reduction in thickness and weight, high-speed response to an input signal, and driving with a direct-constant voltage source, and have been used in display devices.

Patent Document 1 discloses a display device for VR using organic EL elements (also referred to as organic EL devices).

[Reference]

[Patent Document]

[Patent Document 1] International Publication No. WO2018/087625

SUMMARY OF THE INVENTION

Problems to be Solved by the Invention

An object of one embodiment of the present invention is to provide a display device that displays a high-quality image. Another object of one embodiment of the present invention is to provide a display device with high light extraction efficiency. Another object of one embodiment of the present invention is to provide a display device with a high aperture ratio. Another object of one embodiment of the present invention is to provide a high-resolution display device. Another object of one embodiment of the present invention is to provide a low-cost display device. Another object of one embodiment of the present invention is to provide a highly reliable display device. Another object of one embodiment of the present invention is to provide a novel display device.

Another object of one embodiment of the present invention is to provide a method for manufacturing a display device that displays high-quality images. Another object of one embodiment of the present invention is to provide a method for manufacturing a display device with high light extraction efficiency. Another object of one embodiment of the present invention is to provide a method for manufacturing a display device with a high aperture ratio. Another object of one embodiment of the present invention is to provide a method for manufacturing a high-resolution display device. Another object of one embodiment of the present invention is to provide a method for manufacturing a display device with a simple process. Another object of one embodiment of the present invention is to provide a method for manufacturing a highly reliable display device. Another object of one embodiment of the present invention is to provide a method for manufacturing a novel display device.

Note that the description of these objects does not preclude the existence of other objects. Note that one embodiment of the present invention does not have to achieve all the objects. Note that other objects will be apparent from the description of the specification, the drawings, the claims, and the like, and other objects can be derived from the description of the specification, the drawings, the claims, and the like.

Means for Solving the Problems

One embodiment of the present invention is a display device including a first light-emitting element, a second light-emitting element, a first protective layer, a second protective layer, and a gap. The first light-emitting element includes a first lower electrode, a first EL layer over the first lower electrode, and a first upper electrode over the first EL layer, and the second light-emitting element includes a second lower electrode, a second EL layer over the second lower electrode, and a second upper electrode over the second EL layer. The first light-emitting element is adjacent to the second light-emitting element, the first protective layer is provided over the first light-emitting element and the second light-emitting element, and includes regions that are in contact with the side surface of the first EL layer and the side surface of the second EL layer, the second protective layer is provided over the first protective layer, and the gap is provided between the first EL layer and the second EL layer and between the first protective layer and the second protective layer.

Alternatively, in the above embodiment, a region where a distance between the side surface of the first EL layer and the side surface of the second EL layer is less than or equal to 1 lam may be included.

Alternatively, in the above embodiment, the gap may include one or more elements of nitrogen, oxygen, carbon dioxide, and a Group 18 element.

Alternatively, in the above embodiment, the Group 18 element may include one or more of helium, neon, argon, xenon, and krypton.

Alternatively, in the above embodiment, the refractive index of the first protective layer may be higher than the refractive index of the gap.

Alternatively, in the above embodiment, a microlens array may be included and the microlens array may be provided over the second protective layer.

Alternatively, in the above embodiment, the first EL layer and the second EL layer may each have a function of emitting light of different colors.

Alternatively, in the above embodiment, a first transistor and a second transistor may be included, one of a source and a drain of the first transistor may be electrically connected to the first lower electrode, one of a source and a drain of the second transistor may be electrically connected to the second lower electrode, and each of the first transistor and the second transistor may include silicon or a metal oxide in its channel formation region.

Another embodiment of the present invention is an electronic device including the display device of one embodiment of the present invention and a lens.

Another embodiment of the present invention is a method for manufacturing a display device. The method includes forming a first light-emitting element including a first lower electrode, a first EL layer over the first lower electrode, and a first upper electrode over the first EL layer, and a second light-emitting element including a second lower electrode, a second EL layer over the second lower electrode, and a second upper electrode over the second EL layer and being adjacent to the first light-emitting element; forming a first protective layer over the first light-emitting element and the second light-emitting element so as to include regions that are in contact with the side surface of the first EL layer and the side surface of the second EL layer; and forming a second protective layer such that a gap is provided between the first EL layer and the second EL layer.

Alternatively, in the above embodiment, the first protective layer may be formed by an ALD method, and the second protective layer may be formed by a sputtering method or a CVD method.

Alternatively, in the above embodiment, a microlens array may be formed over the second protective layer.

Alternatively, in the above embodiment, the refractive index of the first protective layer may be higher than the refractive index of the gap.

Alternatively, in the above embodiment, each of the first EL layer and the second EL layer may have a function of emitting light of different colors.

Effect of the Invention

One embodiment of the present invention can provide a display device that displays a high-quality image. Another embodiment of the present invention can provide a display device with high light extraction efficiency. Another embodiment of the present invention can provide a display device with a high aperture ratio. Another embodiment of the present invention can provide a high-resolution display device. Another embodiment of the present invention can provide an inexpensive display device. Another embodiment of the present invention can provide a highly reliable display device. Another embodiment of the present invention can provide a novel display device.

Another embodiment of the present invention can provide a method for manufacturing a display device that displays high-quality images. Another embodiment of the present invention can provide a method form manufacturing a display device with high light extraction efficiency. Another embodiment of the present invention can provide a method for manufacturing a display device with a high aperture ratio. Another embodiment of the present invention can provide a method for manufacturing a high-resolution display device. Another embodiment of the present invention can provide a method for manufacturing a display device with a simple process. Another embodiment of the present invention can provide a method for manufacturing a highly reliable display device. Another embodiment of the present invention can provide a method for manufacturing a novel display device.

Note that the description of these effects does not preclude the existence of other effects. One embodiment of the present invention does not have to have all these effects. Note that other effects will be apparent from and can be derived from the description of the specification, the drawings, the claims, and the like.

BRIEF DESCRIPTION OF THE DRAWINGS

FIG. 1 is a cross-sectional view illustrating a structure example of a display device.

FIG. 2A to FIG. 2C are cross-sectional views illustrating structure examples of a transistor.

FIG. 5 is a perspective view illustrating a structure example of a display device.

FIG. 11 is a cross-sectional view illustrating a structure example of a display device.

FIG. 18A is a perspective view illustrating a structure example of a display device. FIG. 18B and FIG. 18C are cross-sectional views illustrating structure examples of the display device.

FIGS. 20A1, FIGS. 20A2, FIGS. 20B1, FIGS. 20B2, FIGS. 20C1, and FIGS. 20C2 are cross-sectional views of examples of a method for manufacturing the display device.

FIG. 23A1, FIG. 23A2, FIG. 23B1, and FIG. 23B2 are cross-sectional views illustrating an example of a method for manufacturing of a display device.

FIG. 24A is a perspective view illustrating a structure example of a display device. FIG. 24B and FIG. 24C are cross-sectional views illustrating structure examples of the display device.

FIG. 26A1, FIG. 26A2, FIG. 26B1, FIG. 26B2, FIG. 26C1, and FIG. 26C2 are cross-sectional views illustrating an example of a method for manufacturing of a display device.

FIG. 31A is a top view illustrating a structure example of a transistor. FIG. 31B and FIG. 31C are cross-sectional views illustrating the structure example of the transistor.

FIG. 32A to FIG. 32C are cross-sectional views illustrating examples of a light-emitting element.

FIG. 33A is a table showing classifications of crystal structures of IGZO. FIG. 33B is a graph showing an XRD spectrum of a CAAC-IGZO film. FIG. 33C is an image showing nanobeam electron diffraction patterns of a CAAC-IGZO film.

FIG. 37A, FIG. 37B1, and FIG. 37B2 are STEM images of the sample in Example.

MODE FOR CARRYING OUT THE INVENTION

Figure 3:
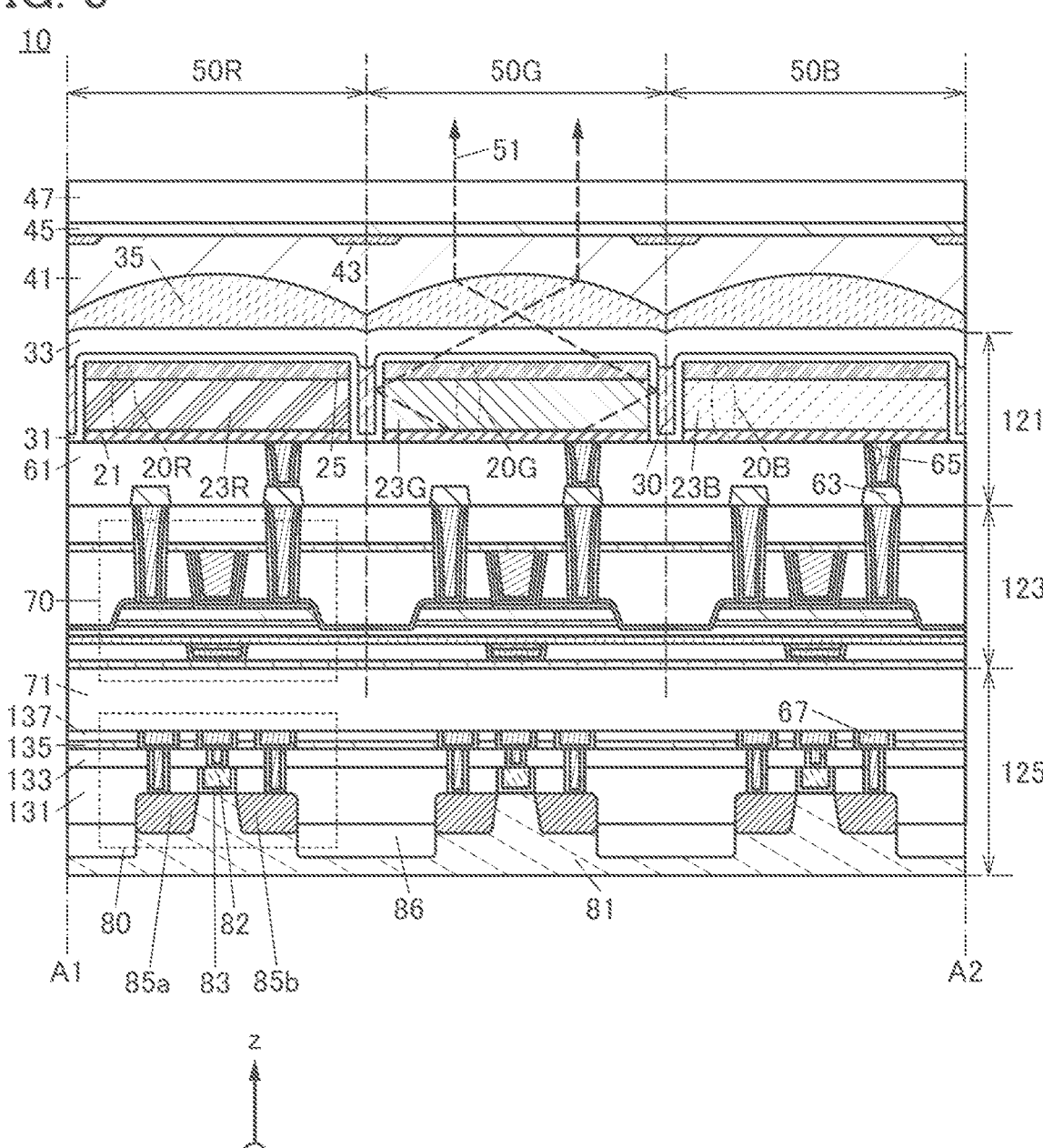
FIG. 3 is a cross-sectional view illustrating a structure example of a display device.

In this specification and the like, a semiconductor device refers to a device that utilizes semiconductor characteristics, and means a circuit including a semiconductor element (e.g., a transistor, a diode, and a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting apparatus, a lighting device, an electronic device, and the like themselves are semiconductor devices, or include semiconductor devices in some cases. In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow an electrical connection between X and Y (e.g., a switch, a transistor, a capacitor, an inductor, a resistor, a diode, a display element, a light-emitting element, a load, or the like) can be connected between X and Y. Note that a switch has a function of being controlled to be in an on state or an off state. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "node" can be referred to as a terminal, a wiring, an electrode, a conductive layer, a conductor, an impurity region, or the like depending on the circuit configuration, the device structure, or the like. Furthermore, a terminal, a wiring, or the like can be referred to as "node."

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and for example, a potential supplied to a wiring, a potential applied to a circuit and the like, a potential output from a circuit, and the like also change with a change of the reference potential.

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments, the scope of claims, or the like. As another example, a "first" component in one embodiment in this specification and the like can be omitted in other embodiments, the scope of claims, or the like.

In this specification and the like, the terms for describing positioning, such as "over" "under", "above" and "below" are sometimes used for convenience to describe the positional relationship between components with reference to drawings. The positional relation between components is changed as appropriate in accordance with a direction in which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

In addition, in this specification and the like, the terms "film," "layer," and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms such as "electrode", "wiring", and "terminal" do not limit the functions of such components. For example, an "electrode" is used as part of a wiring in some cases, and vice versa. Furthermore, the terms "electrode" or "wiring" can also include the case where a plurality of "electrodes" or "wirings" are formed in an integrated manner. For example, a "terminal" is used as part of a "wiring" or an "electrode" in some cases, and vice versa. Furthermore, the term "terminal" can also mean the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms such as "electrode", "wiring", and "terminal" are sometimes replaced with the term "region" depending on the case, for example.

In this specification and the like, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an "OS transistor" is described, the OS transistor can also be referred to as a transistor including a metal oxide or an oxide semiconductor.

In this specification and the like, a metal oxide containing nitrogen is also collectively referred to as a metal oxide in some cases. Furthermore, a metal oxide containing nitrogen may be referred to as a metal oxynitride. In this specification and the like, "gap" means a region containing a gas.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. Moreover, some components are omitted in a perspective view, a top view, or the like for easy understanding of the diagrams in some cases.

In the drawings in this specification, the size, the layer thickness, or the region is exaggerated for clarity in some cases. Therefore, embodiments of the present invention are not limited to the size, aspect ratio, and the like shown in the drawings. Note that the drawings are schematic views illustrating ideal examples, and embodiments of the present invention are not limited to shapes or values shown in the drawings. For example, variation in signal, voltage, or current due to noise, variation in signal, voltage, or current due to difference in timing, or the like can be included.

In this specification and the like, a device formed using a metal mask or an FMM (fine metal mask) is referred to as a device having an MM (metal mask) structure in some cases. In this specification and the like, a device formed without using a metal mask or an FMM is referred to as a device having an MML (metal maskless) structure in some cases.

Embodiment 1

In this embodiment, a display device of one embodiment of the present invention and a method for manufacturing the display device will be described with reference to drawings.

One embodiment of the present invention relates to a display device in which pixels each including a light-emitting element such as an organic EL element are arranged in a matrix. In the display device of one embodiment of the present invention, the light-emitting elements provided in adjacent pixels are isolated by a gap containing a gas such as air. Light emitted in the oblique direction from the light-emitting element can be totally reflected by the gap. This can inhibit light emitted from the light-emitting element from entering an adjacent pixel.

Structure Example_1 of Display Device

Figure 1:
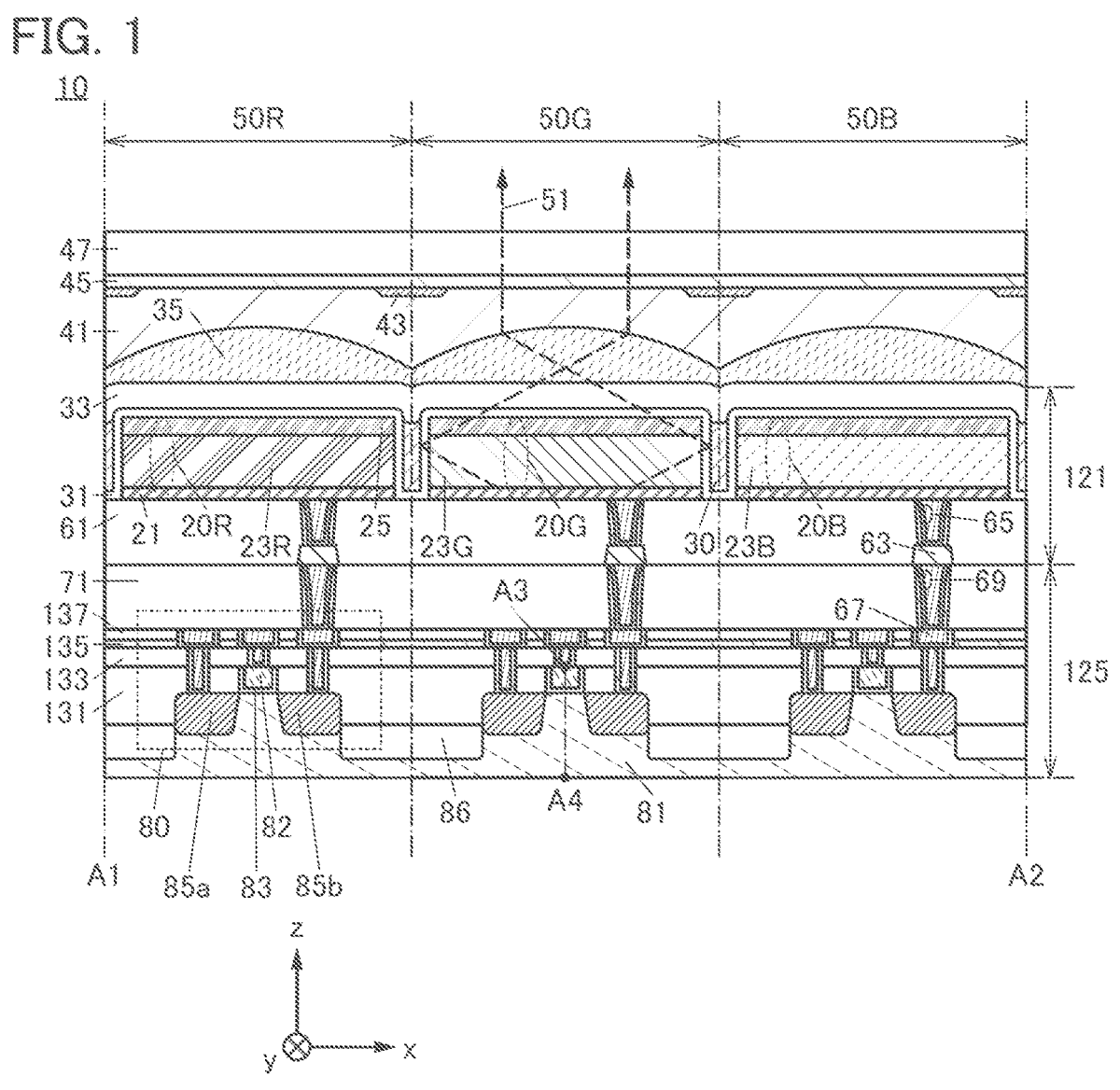

FIG. 1 is a cross-sectional view illustrating a structure example of the display device 10. In FIG. 1, the left end and the right end of the cross-sectional view are denoted by A1 and A2, respectively.

The display device 10 includes a transistor 80 and an element isolation layer 86 over a substrate 81. An insulating layer 131, an insulating layer 133, an insulating layer 135, and an insulating layer 137 are provided over the substrate 81.

The display device 10 includes an insulating layer 71 over the insulating layer 137; an insulating layer 61 over the insulating layer 71; a light-emitting element 20R, a light-emitting element 20G, a light-emitting element 20B over the insulating layer 61; a protective layer 31 over the light-emitting element 20R, the light-emitting element 20G, and the light-emitting element 20B; a protective layer 33 over the protective layer 31; a microlens array 35 over the protective layer 33; an adhesive layer 41 over the microlens array 35; a light-blocking layer 43 over the adhesive layer 41; an insulating layer 45 over the adhesive layer 41 and the light-blocking layer 43; and a substrate 47 over the insulating layer 45. The microlens array 35 is attached to the insulating layer 45 and the light-blocking layer 43 with the adhesive layer 41. Note that FIG. 1 illustrates a structure provided with the insulating layer 71; however the structure is not a limiting example. For example, a structure in which the insulating layer 61 is provided over the insulating layer 137, without the insulating layer 71, may be employed.

The display device 10 further includes a conductive layer 63, a conductive layer 65, a conductive layer 67, and a conductive layer 69. Here, the conductive layer 67 is embedded in the insulating layer 131, the insulating layer 133, the insulating layer 135, and the insulating layer 137; the conductive layer 69 is embedded in the insulating layer 71; and the conductive layer 63 and the conductive layer 65 are embedded in the insulating layer 61. The conductive layer 67 can be substantially level with the insulating layer 137, the conductive layer 69 can be substantially level with the insulating layer 71, and the conductive layer 65 can be substantially level with the insulating layer 61.

In FIG. 1, the A1-A2 direction is referred to as x direction and the height direction of the display device 10 is referred to as z direction. In addition, the direction perpendicular to the xz plane is referred to as y direction. The same expression applies to the other diagrams in some cases.

In the case where the expression "B over A" or "B under A" is used in this specification and the like, for example, A and B do not always need to include a region where they are in contact with each other.

In this specification and the like, the term "element" can be replaced with the term "device" in some cases. For example, a light-emitting element can be referred to as a light-emitting device.

In this specification and the like, when a common matter to the light-emitting element 20R, the light-emitting element 20G, and the light-emitting element 20B is described or it is unnecessary to differentiate between the three elements, they are simply referred to as a "light-emitting element 20". The same applies to other elements.

The light-emitting element 20 and the transistor 80 are stacked as illustrated in FIG. 1. Here, a layer in which the light-emitting element 20 is formed is referred to as a layer 121, and a layer in which the transistor 80 is formed is referred to as a layer 125.

The light-emitting element 20R includes a lower electrode 21, an EL layer 23R, and an upper electrode 25. The light-emitting element 20G includes the lower electrode 21, an EL layer 23G, and the upper electrode 25. The light-emitting element 20B includes the lower electrode 21, an EL layer 23B, and the upper electrode 25. The light-emitting element 20 can be a top-emission light-emitting element. In the case where the light-emitting element 20 is a top-emission light-emitting element, the lower electrode 21 has a function of reflecting visible light, and the upper electrode 25 has a function of transmitting visible light. The lower electrode 21 has a function of a pixel electrode of the display device 10.

The display device 10 includes a pixel 50R, a pixel 50G, and a pixel 50B. The light-emitting element 20R is formed in the pixel 50R, the light-emitting element 20G is formed in the pixel 50G, and the light-emitting element 20B is formed in the pixel 50B. Furthermore, the transistor 80 is formed in each of the pixel 50R, the pixel 50G, and the pixel 50B. One of a source and a drain of the transistor 80 is electrically connected to the lower electrode 21 of the light-emitting element 20R, the lower electrode 21 of the light-emitting element 20G, or the lower electrode 21 of the light-emitting element 20B through the conductive layer 67, the conductive layer 69, the conductive layer 63, and the conductive layer 65.

The conductive layer 63 serves as, for example, a wiring. The conductive layer 69 has a function of a plug for electrically connecting the conductive layer 67 to the conductive layer 63, for example, and the conductive layer 65 has a function of a plug for electrically connecting the conductive layer 63 to the lower electrode 21, for example.

Furthermore, in this specification and the like, a wiring and a plug electrically connected to the wiring may be one body. In other words, part of the conductive layer can function as a wiring and another part thereof can function as a plug.

In the layer 125, a transistor included in a driver circuit such as a scan line driver circuit can be formed in addition to the transistor included in the pixel 50. In this specification and the like, the transistor formed in the layer 125 is the transistor 80.

The transistor 80 can be a transistor including silicon in a channel formation region (Si transistor). Silicon included in the Si transistor can be single crystal silicon, polycrystalline silicon (polysilicon), amorphous silicon, or the like. In particular, the channel formation region of the transistor 80 is preferably formed using single crystal silicon.

The transistor 80 includes a conductive layer 82 having a function of a gate electrode, the insulating layer 83 having a function of a gate insulating layer, and part of the substrate 81. In addition, the transistor 80 includes a semiconductor region including a channel formation region, a low-resistance region 85a having a function of one of a source region and a drain region, and a low-resistance region 85b having a function of the other of the source and the drain region. The transistor 80 may be either a p-channel transistor or an n-channel transistor. Alternatively, the transistor 80 may be a CMOS (Complementary Metal Oxide Semiconductor) transistor in which an n-channel transistor and a p-channel transistor are combined.

The transistor 80 is electrically isolated from other transistors by the element isolation layer 86. In FIG. 1, the transistors 80 are electrically isolated from each other by the element isolation layer 86. The element isolation layer 86 can be formed by a LOCOS (LOCal Oxidation of Silicon) method, an STI (Shallow Trench Isolation) method, or the like.

FIG. 2A is a cross-sectional view illustrating a structure example in the channel width direction (A3-A4 direction) of the transistor 80 illustrated in FIG. 1.

As illustrated in FIG. 1 and FIG. 2A, the semiconductor region of the transistor 80 includes a protrusion shape. Moreover, the conductive layer 82 is provided to cover the side surface and the top surface of the semiconductor region with the insulating layer 83 therebetween. A material with which the work function can be adjusted can be used for the conductive layer 82.

A transistor having a semiconductor region with a protrusion shape, like the transistor 80 illustrated in FIG. 1 and FIG. 2A, can be referred to as a fin-type transistor because a protrusion portion of a semiconductor substrate is used. An insulator having a function of a mask for forming a protrusion portion may be provided in contact with an upper portion of the protrusion portion. Although FIG. 1 illustrates the structure in which the protrusion portion is formed by processing part of the substrate 81, a semiconductor having a protrusion shape may be formed by processing an SOI (Silicon On Insulator) substrate.

FIG. 2B and FIG. 2C are cross-sectional views each illustrating a structural example of the transistor 80 in the channel length direction (A1-A2 direction in FIG. 1) and variation examples of the transistor 80 illustrated in FIG. 1. The transistor 80 illustrated in FIG. 2B is a planar transistor, which is different from the transistor 80 illustrated in FIG. 1. In addition, the structure illustrated in FIG. 2C is different from that illustrated in FIG. 1 in that an insulating layer 88 is provided over the substrate 81 and the transistor 80 is provided over the insulating layer 88.

The transistor 80 illustrated in FIG. 2C includes a semiconductor layer 87. The semiconductor layer 87 can be a thin film, e.g., a thin film including silicon. Specifically, the semiconductor layer 87 can be a thin film including amorphous silicon or low-temperature polysilicon. The semiconductor layer 87 can be single crystal silicon (SOI) formed over the insulating layer 88.

The insulating layer 131, the insulating layer 133, the insulating layer 135, the insulating layer 137, the insulating layer 71, and the insulating layer 61 illustrated in FIG. 1 each function as an interlayer film. The insulating layer 131, the insulating layer 133, the insulating layer 135, the insulating layer 137, the insulating layer 71, and the insulating layer 61 may each have a function of a planarization layer with which a roughness shape thereunder is coated.

The EL layer 23R, the EL layer 23G, and the EL layer 23B each include at least a light-emitting layer. The light-emitting layers can have a function of emitting light of different colors. For example, the light-emitting layer included in the EL layer 23R has a function of emitting red light, the light-emitting layer included in the EL layer 23G has a function of emitting green light, and the light-emitting layer of the EL layer 23B has a function of emitting blue light. Note that the light-emitting layer included in the EL layer 23R, the light-emitting layer included in the EL layer 23G, and the light-emitting layer included in the EL layer 23B may each have a function of emitting light of cyan, magenta, yellow, or the like. In addition, although three kinds of EL layers 23 are illustrated in FIG. 1, the display device 10 may include four or more kinds of EL layers 23. For example, the display device 10 may include an EL layer 23 emitting white light in addition to the EL layer 23R emitting red light, the EL layer 23G emitting green light, and the EL layer 23B emitting blue light.

In this specification and the like, light emitted from a light-emitting layer included in the EL layer is simply referred to as light emitted from the EL layer in some cases.

A structure of the light-emitting element 20 in which the EL layer 23R, the EL layer 23G, and the EL layer 23B emit light of different colors is referred to as an SBS (Side By Side) structure. When the light-emitting element 20 has the SBS structure, power consumption of the display device 10 can be lowered as compared with the case where all EL layers 23 emit light of the same color.

The light-blocking layer 43 is provided in a boundary portion between adjacent pixels 50 and in the surrounding portion thereof. With the structure, mixture of light of different colors can be inhibited, so that the display device 10 can display an image with high image quality. Although the structure where the light-blocking layer 43 is provided is described as an example in this embodiment, the light-blocking layer 43 can be omitted without being limited to the structure.

The protective layer 31 includes regions that are in contact with the side surface of the light-emitting element 20R, the side surface of the light-emitting element 20G, and the side surface of the light-emitting element 20B. Specifically, the protective layer 31 includes regions that are in contact with the side surface of the lower electrode 21, the side surface of the EL layer 23R, the side surface of the EL layer 23G, the side surface of the EL layer 23B, and the side surface of the upper electrode 25. The protective layer 31 is formed such that an opening portion that isolates the adjacent light-emitting elements 20 from each other is coated with the protective layer 31. The protective layer 31 can be an insulating layer, and for example, a metal oxide film or a metal nitride film can be used. The metal oxide film can be a layer containing aluminum oxide or hafnium oxide, for example. The metal nitride film can be a layer containing aluminum nitride or hafnium nitride.

The protective layer 31 is a layer through which impurities such as water and hydrogen are less likely to diffuse. Alternatively, the protective layer 31 can be a layer that can capture impurities such as water and hydrogen (also referred to as gettering). This can inhibit intrusion of impurities into the light-emitting element 20, specifically, into the EL layer 23, for example. Thus, the reliability of the display device 10 can be increased.

The protective layer 33 is formed over the protective layer 31. The protective layer 33 can be an insulating layer, and an oxide, a nitride, or an oxynitride can be used, for example. The protective layer 33 can be a layer containing silicon oxide, aluminum oxide, or hafnium oxide as the oxide. In addition, the protective layer 33 can be a layer can be a layer containing silicon nitride or aluminum nitride as the nitride. The protective layer 33 can be a layer containing silicon oxynitride, nitride oxide, aluminum oxynitride, or aluminum nitride oxide as the oxynitride.

Note that in this specification, silicon oxynitride refers to a material that contains more oxygen than nitrogen, and silicon nitride oxide refers to a material that contains more nitrogen than oxygen. Furthermore, in this specification, aluminum oxynitride refers to a material that contains more oxygen than nitrogen, and aluminum nitride oxide refers to a material that contains more nitrogen than oxygen.

The protective layer 33 can be a semiconductor layer, for example, a layer containing a metal oxide containing In, Ga, and Zn (also referred to as IGZO). The protective layer 33 may have a stacked-layer structure including two or more layers. For example, a stacked-layer structure of an insulating layer and a semiconductor layer may be used, and a stacked-layer structure of a layer containing silicon nitride and a layer containing a metal oxide may be used. Specifically, the protective layer 33 may have a two-layer stacked structure in which the lower layer is a layer containing silicon nitride and the upper layer is a layer containing a metal oxide.

Note that in the case where the above IGZO is used for the protective layer 33, a wet etching method or a dry etching method can be used for processing. For example, in the case where IGZO is used as the protective layer 33, a chemical solution of oxalic acid, phosphoric acid, a chemical solution such as a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3: 6.7: 3.3: 36.7 or in the neighborhood thereof.

Like the protective layer 31, the protective layer 33 is preferably a layer through which impurities such as water and hydrogen are less likely to diffuse, or a layer that can capture impurities such as water and hydrogen (also referred to as gettering). Thus, the reliability of the display device 10 can be increased.

The protective layer 33 is preferably deposited by a method offering lower coverage than the coverage with the protective layer 31. For example, the protective layer 31 is deposited by an atomic layer deposition (ALD) method, and the protective layer 33 is deposited by a sputtering method or a chemical vapor deposition (CVD) method. Accordingly, the opening portion that isolates the adjacent light-emitting elements 20 is not coated with the protective layer 33, and thus a gap 30 is formed.

As the distance in e.g., the x direction between the lower electrodes 21 is shorter, the aspect ratio of the opening portion (the distance in the z direction/the distance in the x direction) is increased, and thus, the gap 30 is easily formed. For example, when the distance in the x direction can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or 10 nm, the gap 30 can be suitably formed. In other words, a region is included in which the distance between the side surface of the EL layer 23R and the side surface of the EL layer 23G or the distance between the side surface of the EL layer 23G and the side surface of the EL layer 23B is less than or equal to 1 μm, preferably less than or equal to 0.5 μm (500 nm), further preferably less than or equal to 200 nm or less than or equal to 100 nm, still further preferably less than or equal to 90 nm.

The gap 30 includes one or more of air, nitrogen, oxygen, carbon dioxide, and a Group 18 element, for example. Furthermore, for example, a gas used during the deposition of the protective layer 33 is sometimes included in the gap 30. For example, in the case where the protective layer 33 is deposited by a sputtering method, the gap 30 includes a Group18 element (typically, helium, neon, argon, xenon, krypton, or the like) in some cases. In the case where a gas is included in the gap 30, the gas can be identified with a gas chromatography method or the like. Alternatively, in the case where the protective layer 33 is deposited by a sputtering method, a gas used in the sputtering is sometimes contained in the protective layer 33. In this case, an element such as argon is sometimes detected when the protective layer 33 is analyzed by an energy dispersive X-ray analysis (EDX analysis) or the like, for example.

In the case where the refractive index of the gap 30 is lower than that of the protective layer 31, light 51 that is emitted from the EL layer 23 and is incident on the interface between the protective layer 31 and the gap 30 is totally reflected. In this manner, the light 51 can be inhibited from entering the adjacent pixel 50. Specifically, the light 51 emitted from the EL layer 23G can be inhibited from entering the pixel 50R or the pixel 50B, for example. Thus, since the mixture of light of different colors can be inhibited, the display device 10 can display an image with high quality.

In the case where the refractive index of the adhesive layer 41 is lower than the refractive index of the microlens included in the microlens array 35, the microlens can converge light emitted from the EL layer 23. This can inhibit light emitted from the EL layers 23 from being mixed and the light from being incident on the light-blocking layer 43. Thus, the display device 10 can display a high-quality image and have high light extraction efficiency. Accordingly, when the user of the display device 10 look at the display surface from the front of the display surface of the display device 10, the user can view a bright image.

For example, materials that can be used for the components illustrated in FIG. 1 are described below.

[Substrate]

There is no great limitation on a material used for the substrate 81 and the substrate 47. The material is determined by the purpose in consideration of whether it has a light-transmitting property, heat resistance high enough to withstand heat treatment, or the like. For example, a glass substrate such as barium borosilicate glass or aluminosilicate glass; a ceramics substrate; a quartz substrate; a sapphire substrate; or the like can be used. Alternatively, a semiconductor substrate, a flexible substrate, an attachment film, a base film, or the like may be used.

Examples of the semiconductor substrate include a semiconductor substrate using silicon, germanium, or the like as a material and a compound semiconductor substrate using silicon carbide, silicon germanium, gallium arsenide, indium phosphide, zinc oxide, or gallium oxide as a material. As the semiconductor substrate, a single-crystal semiconductor or a polycrystalline semiconductor may be used.

In order that the flexibility of the display device 10 can be increased, a flexible substrate, an attachment film, a base film, or the like may be used as the substrate 81 and the substrate 47.

As the materials of the flexible substrate, the attachment film, the base film, and the like, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamideimide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used.

When the above-described material is used for the substrate, a lightweight display device can be provided. Furthermore, when the above-described material is used for the substrate, a shock-resistant display device can be provided. Moreover, when the above-described material is used for the substrate, a display device that is less likely to be broken can be provided.

The flexible substrate used as the substrate 81 and the substrate 47 preferably has a lower coefficient of linear expansion because deformation due to an environment is inhibited. For the flexible substrate used as the substrate 81 and the substrate 47, for example, a material whose coefficient of linear expansion is lower than or equal to $1 \times 10^{-3}$/K, lower than or equal to $5 \times 10^{-5}$/K, or lower than or equal to $1 \times 10^{-5}$/K is used. In particular, aramid is preferable for the flexible substrate because of its low coefficient of linear expansion.

[Insulating Layer]

For each of the insulating layers, a single layer of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like or a stacked layer of such materials is used. A material in which a plurality of materials of an oxide material, a nitride material, an oxynitride material, and a nitride oxide material are mixed may be used.

Note that in this specification and the like, a nitride oxide refers to a compound that contains more nitrogen than oxygen. An oxynitride refers to a compound that contains more oxygen than nitrogen. The content of each element can be measured by Rutherford backscattering spectrometry (RBS), for example.

A surface of the insulating layer may be subjected to CMP treatment, for example. By the CMP treatment, unevenness of a sample surface can be reduced, and coverage with an insulating layer and a conductive layer that are formed later can be increased.

[Conductive Layer]

As each of conductive materials that can be used for the gate, the source, and the drain of the transistor and conductive layers such as various wirings, plugs, and electrodes included in the display device, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing the above metal element as a component; an alloy containing the above metal elements in combination; or the like can be used. Alternatively, a semiconductor typified by polycrystalline silicon containing an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

As the conductive material that can be used for the conductive layer, a conductive material containing oxygen, such as an indium tin oxide (ITO), an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added, can also be used. Moreover, a conductive material containing nitrogen, such as titanium nitride, tantalum nitride, or tungsten nitride, can be used. In addition, a stacked-layer structure in which a conductive material containing oxygen, a conductive material containing nitrogen, and a material containing the above-described metal element are combined as appropriate can be used. The conductive material that can be used for the conductive layer may have a single-layer structure or a stacked-layer structure of two or more layers. For example, the conductive layer may have a single layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, or a three-layer structure including a titanium layer, an aluminum layer stacked over the titanium layer, and a titanium layer formed thereover. Alternatively, an aluminum alloy containing one or more elements of titanium, tantalum, tungsten, molybdenum, chromium, neodymium, and scandium may be used as the conductive material.

In the case where the light-emitting element 20 is a top-emission light-emitting element, the lower electrode 21 is preferably formed using a conductive material that efficiently reflects light emitted from the EL layer 23. Note that the structure of the lower electrode 21 may have a stacked-layer structure of a plurality of layers without limitation to a single-layer structure. For example, in the case where the lower electrode 21 is used as an anode, a layer in contact with the EL layer 23 may be a light-transmitting layer, such as an indium tin oxide layer, and a layer having high reflectance (e.g., aluminum, an alloy containing aluminum, or silver) may be provided in contact with the layer. When the upper electrode 25 is formed using a light-transmitting conductive material, light emitted from the EL layer 23 can be efficiently extracted to the outside of the display device 10.

As the conductive material that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material and/or the alloy. Furthermore, an alloy containing aluminum (an aluminum alloy) such as an alloy of aluminum and titanium, an alloy of aluminum and nickel, or an alloy of aluminum and neodymium may be used. Alternatively, an alloy containing silver, such as an alloy of silver and copper, an alloy of silver, palladium, and copper, or an alloy of silver and magnesium may be used, for example. An alloy containing silver and copper is preferable because of its high heat resistance. Furthermore, a metal film or an alloy film may be stacked with a metal oxide film. For example, when a metal film or a metal oxide film is stacked so as to be in contact with an aluminum alloy film, oxidation of the aluminum alloy film can be inhibited. Other examples of the metal film or the metal oxide film are titanium and titanium oxide. Alternatively, as described above, the conductive film having a light-transmitting property and a film containing a metal material may be stacked. For example, a stacked-layer film of silver and indium tin oxide, a stacked-layer film of an alloy of silver and magnesium and indium tin oxide, or the like can be used.

As the conductive material having a light-transmitting property, a conductive oxide such as indium oxide, indium tin oxide, indium zinc oxide, zinc oxide, or zinc oxide to which gallium is added, or graphene can be used. Alternatively, as the conductive material having a light-transmitting property, an oxide conductor can be used. A metal material such as gold, silver, platinum, magnesium, nickel, tungsten, chromium, molybdenum, iron, cobalt, copper, palladium, or titanium, or an alloy material containing the metal material can also be used. Further alternatively, a nitride of the metal material (e.g., titanium nitride) or the like may be used. Note that in the case of using the metal material or the alloy material (or the nitride thereof), the thickness is set small enough to be able to transmit light. A stacked-layer film of any of the above materials can be used as a conductive layer. For example, a stacked-layer film of indium tin oxide and an alloy of silver and magnesium is preferably used for higher conductivity. These can also be used for conductive layers such as a variety of wirings and electrodes included in a display device, and conductive layers (conductive layers functioning as the lower electrode or the upper electrode) included in the light-emitting element.

Here, an oxide conductor, which is one type of metal oxide, is described. In this specification and the like, an oxide conductor may be referred to as OC (Oxide Conductor). As the oxide conductor, for example, an oxygen vacancy is formed in a metal oxide (typically, IGZO), which is an oxide containing at least indium or zinc, and hydrogen is added to the oxygen vacancy, so that a donor level is formed in the vicinity of the conduction band. As a result, the conductivity of the metal oxide is increased, so that the metal oxide can serve as a conductor. The metal oxide that can serve as a conductor can be referred to as an oxide conductor. A metal oxide (oxide semiconductor) having a function of semiconductor generally has a visible-light transmitting property because of their large energy gap. Meanwhile, the oxide conductor is a metal oxide having a donor level in the vicinity of the conduction band. Therefore, the influence of absorption due to the donor level is small in the oxide conductor, and the oxide conductor has a visible-light transmitting property comparable to that of an oxide semiconductor.

[EL layer]

As described above, the EL layer 23 includes at least a light-emitting layer. In addition to the light-emitting layer, the EL layer 23 may further include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

Either a low molecular compound or a high molecular compound can be used for the EL layer 23. The layers included in the EL layer 23 can each be formed by a method such as an evaporation method (including a vacuum evaporation method), a transfer method, a printing method, an inkjet method, or a coating method.

The EL layer 23 may contain an inorganic compound such as quantum dots. For example, when used for the light-emitting layer, the quantum dots can function as a light-emitting material.

[Adhesive Layer]

As the adhesive layer 41, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet may be used.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer that transmits light of a certain color and a film containing a material of a coloring layer that transmits light of another color can be used. It is preferable to use a material common to the coloring layer and the light-blocking layer, in which case common equipment can be used and a process can be simplified.

FIG. 3 is a cross-sectional view illustrating a structure example of the display device 10, and is a variation example of the display device 10 illustrated in FIG. 1. The display device 10 illustrated in FIG. 3 is different from the display device illustrated in FIG. 1 in that a layer 123 is provided between the layer 121 and the layer 125.

A transistor 70 is provided in the layer 123. The transistor 70 is provided in each of the pixel 50R, the pixel 50G, and the pixel 50B. In the display device 10 illustrated in FIG. 3, one of a source and a drain of the transistor 70 is electrically connected to the lower electrode 21 of the light-emitting element 20R, the lower electrode 21 of the light-emitting element 20G, or the lower electrode 21 of the light-emitting element 20B through the conductive layer 63 and the conductive layer 65.

A transistor containing a metal oxide in its channel formation region (OS transistor) can be used as the transistor 70. The metal oxide included in the OS transistor preferably contains at least indium or zinc. In particular, indium and zinc are preferably contained. In addition to them, aluminum, gallium, yttrium, tin, or the like is preferably contained. Furthermore, one or more kinds of boron, titanium, iron, nickel, germanium, zirconium, molybdenum, lanthanum, cerium, neodymium, hafnium, tantalum, tungsten, magnesium, cobalt, and the like may be contained.

Figure 4A:
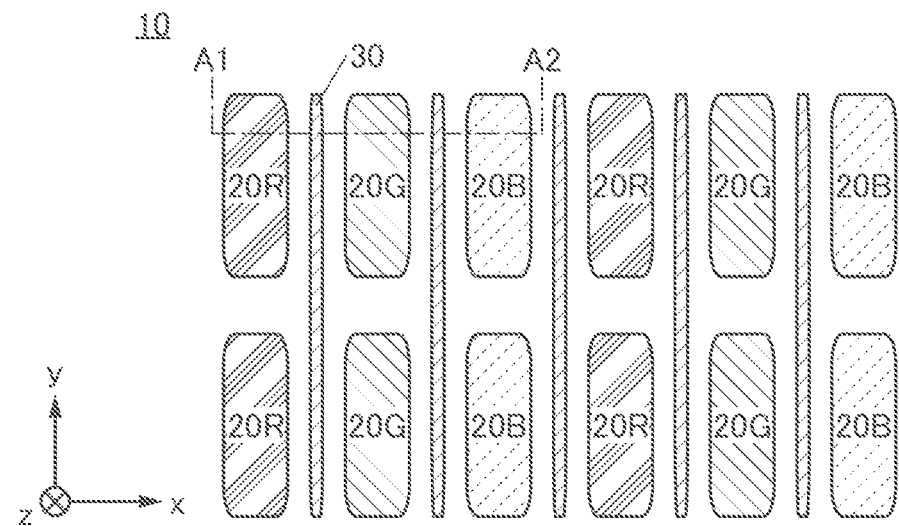
FIG. 4A and FIG. 4B are top views illustrating structure examples of a display device.

FIG. 4A is a schematic top view in the x and y directions of the display device 10. FIG. 4A illustrates the light-emitting element 20R, the light-emitting element 20G, the light-emitting element 20B, and the gap 30. FIG. 1 is a cross-sectional view taken along dashed-dotted line A1-A2 in FIG. 4A.

In the structure of FIG. 4A, the light-emitting element 20R, the light-emitting element 20G, and the light-emitting element 20B are arranged in this order in the x direction. Meanwhile, the light-emitting elements 20 emitting light of the same color are arranged in the y direction. Even when light of the same color is mixed, the quality of an image displayed by the display device is not greatly affected. Thus, as illustrated in FIG. 4A, the structure in which the gap 30 is not provided between the light-emitting elements 20 that emits light of the same color can be employed. In other words, the gap 30 is provided in the extending direction along the y direction, while the gap 30 is not provided in the extending direction along the x direction. In the structure illustrated in FIG. 4A, there is no particular limitation on the length in the x direction of the gap 30. For example, the length of the gap 30 in the x direction can be shorter than the length of the light-emitting element 20 in the x direction. The above applies to the structures described below as well.

Figure 4B:
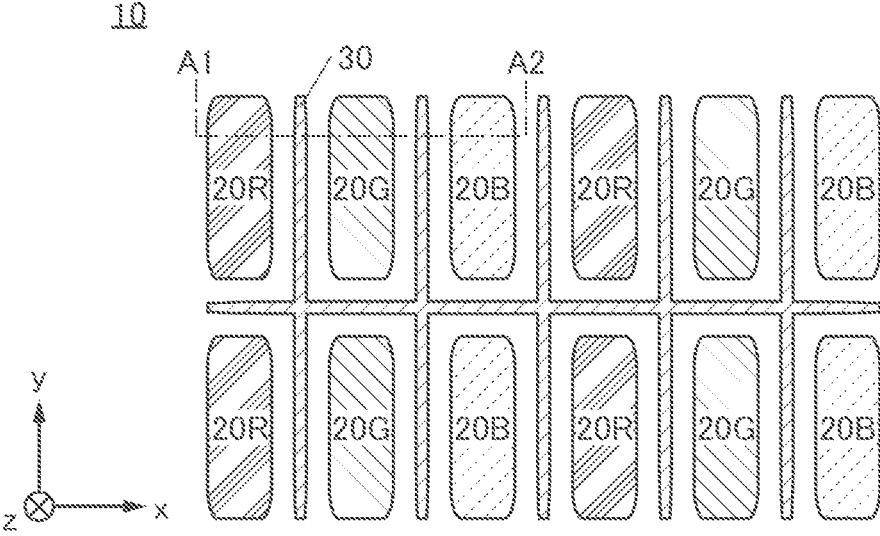

FIG. 4B is a variation example of FIG. 4A, and is different from the structure of FIG. 4A in that the gap 30 is provided between the light-emitting elements 20 emitting light of the same color as well as between the light-emitting elements 20 emitting light of different colors. In other words, in the structure illustrated in FIG. 4B, the gap 30 is provided in the extending direction along the x direction as well as in the extending direction along the y direction. Note that the gap extending in the y direction and the gap 30 extending in the x direction are connected to each other, but are not necessarily connected to each other in FIG. 4B.

The arrangement of the gaps 30 is not limited to the structure in FIG. 4A or FIG. 4B. For example, a structure may be employed in which the separated gap 30 is provided between two adjacent light-emitting elements 20R.

FIG. 5 is a perspective view illustrating a structure example of the display device 10 illustrated in FIG. 1. As illustrated in FIG. 5, the layer 121 is provided over the layer 125, and the microlens array 35 is provided over the layer 121. The gap 30 is provided between the adjacent pixels 50.

Figure 6:
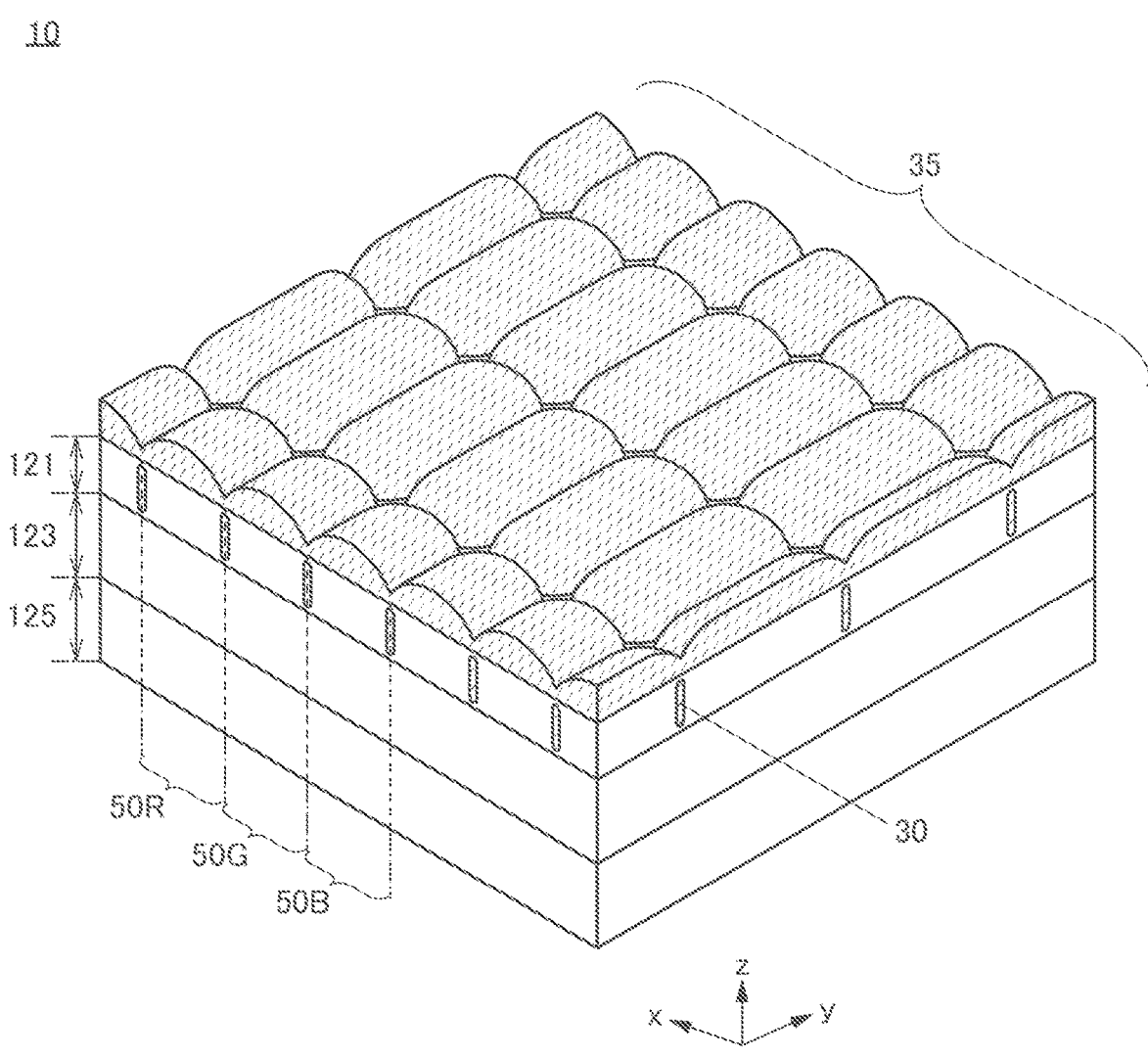
FIG. 6 is a perspective view illustrating a structure example of a display device.

FIG. 6 is a perspective view illustrating a structure example of the display device 10 illustrated in FIG. 3. As illustrated in FIG. 6, the layer 123 is provided over the layer 125, the layer 121 is provided over the layer 123, and the microlens array 35 is provided over the layer 121. The gap 30 is provided between the adjacent pixels 50.

Example_1 of Method for Manufacturing Display Device

An example of a method for manufacturing the display device 10 illustrated in FIG. 1 will be described below.

Note that an insulating layer, a semiconductor layer, a conductive layer for forming the electrode, the wirings, and the like, which are included in the display device, can be formed by a sputtering method, a CVD method, a vacuum evaporation method, a pulsed laser deposition (PLD) method, an ALD method, a plasma ALD (PEALD, Plasma Enhanced ALD) method, or the like. As the CVD method, a plasma-enhanced chemical vapor deposition (PECVD) method or a thermal CVD method may be used. As the thermal CVD method, for example, a metal organic chemical vapor deposition (MOCVD: Metal Organic CVD) method may be used.

In addition, the insulating layer, the semiconductor layer, the conductive layer used for forming electrodes and wirings, and the like included in the display device may be formed by a method such as spin coating, dipping, spray coating, ink-jetting, dispensing, screen printing, offset printing, slit coating, roll coating, curtain coating, and knife coating.

A PECVD method can provide a high-quality film at a relatively low temperature. With use of a deposition method that does not use plasma at the time of deposition, such as an MOCVD method, an ALD method, or a thermal CVD method, damage is not easily caused on a surface where the film is deposited. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. By contrast, in the case of a deposition method not using plasma, such plasma damage is not caused; thus, the yield of semiconductor devices can be increased. Moreover, since plasma damage during deposition is not caused, a film with few defects can be obtained.

Furthermore, when the oxide semiconductor film is formed by a sputtering method, a chamber of a sputtering apparatus is preferably evacuated to a high vacuum (to the degree of approximately $5 \times 10^{-7}$ Pa to $1 \times 10^{-4}$ Pa, for example) by an adsorption vacuum evacuation pump such as a cryopump, for example, so that water acting as an impurity for the oxide semiconductor film is removed as much as possible. In particular, the partial pressure of gas molecules corresponding to $H_2O$ (gas molecules corresponding to m/z=18) in the chamber in the standby mode of the sputtering apparatus is preferably lower than or equal to $1 \times 10^{-4}$ Pa, further preferably lower than or equal to $5 \times 10^{-5}$ Pa. The deposition temperature is preferably higher than or equal to RT (room temperature) and lower than or equal to 500° C., further preferably higher than or equal to RT and lower than or equal to 300° C., still further preferably higher than or equal to RT and lower than or equal to 200° C.

In addition, increasing the purity of a sputtering gas is necessary. For example, as an oxygen gas and an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture or the like into the oxide semiconductor film can be inhibited as much as possible.

In the case where the insulating layer, the conductive layer, the semiconductor layer, or the like is formed by a sputtering method using a sputtering gas containing oxygen, oxygen can be supplied to a surface over which such a layer is formed. As the amount of oxygen contained in the sputtering gas increases, the amount of oxygen supplied to the layer over which such a layer is formed tends to increase.

The layers (thin films) included in the display device can be processed using a photolithography method or the like, for example. Alternatively, island-shaped layers may be formed by a deposition method using a blocking mask.

Alternatively, the layers may be processed by a nanoimprinting method, a sandblasting method, a lift-off method, or the like. As a photolithography method, a method in which a resist mask is formed over a layer (thin film) to be processed, part of the layer (thin film) is selectively removed by using the resist mask as a mask, and the resist mask is removed, and a method in which a photosensitive layer is deposited, and then the layer is exposed to light and developed to be processed into a desired shape are given.

In the case of using light in the photolithography method, for example, an i-line (a wavelength of 365 nm), a g-line (a wavelength of 436 nm), and an h-line (a wavelength of 405 nm), or combined light of any of them can be used for light exposure. Besides, ultraviolet light, KrF laser light, ArF laser light, or the like can be used. Exposure may be performed by liquid immersion exposure technique. As the light used for the exposure, extreme ultraviolet (EUV) light or X-rays may be used. Furthermore, instead of the light used for the exposure, an electron beam can also be used. It is preferable to use extreme ultra-violet light, X-rays, or an electron beam because extremely minute processing can be performed. Note that when light exposure is performed by scanning of a beam such as an electron beam, a photomask is unnecessary.

For removal (etching) of the layers (thin films), a dry etching method or a wet etching method can be used. Alternatively, the etching methods may be used in combination.

In order to manufacture the display device 10 illustrated in FIG. 1, first, the element isolation layer 86, the transistor 80, the insulating layer 131, the insulating layer 133, the insulating layer 135, and the insulating layer 137 are formed over the substrate 81, and the conductive layer 67 is formed to be electrically connected to the transistor 80. Then, the insulating layer 71 is formed over the conductive layer 67 and the insulating layer 137. Then, an opening portion reaching the conductive layer 67 is formed in the insulating layer 71, and the conductive layer 69 is formed in the opening portion. Note that in the case where the display device 10 illustrated in FIG. 3 is manufactured, the transistor 70 is formed over the insulating layer 71.

Next, the conductive layer 63 is formed so as to be electrically connected to the transistor 80. In the case where the display device 10 illustrated in FIG. 3 is manufactured, the conductive layer 63 is formed so as to be electrically connected to the transistor 70.

Figures 7A, 7B, 7C, 7D, 7E:
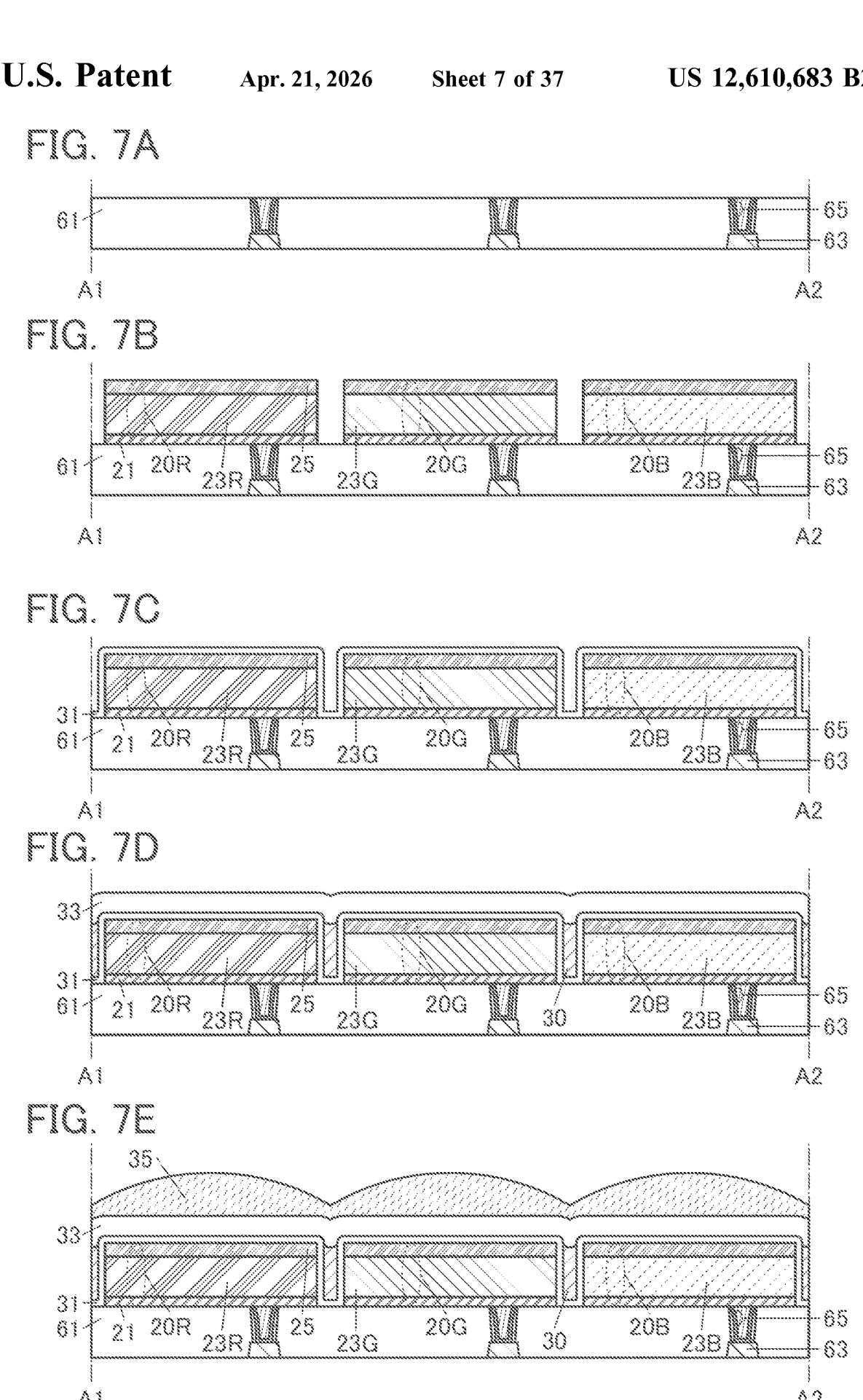
FIG. 7A to FIG. 7E are cross-sectional views illustrating an example of a method for manufacturing a display device.

After that, the insulating layer 61 is formed. Next, an opening portion reaching the conductive layer 63 is formed in the insulating layer 61, and the conductive layer 65 is formed in the opening portion (FIG. 7A). Note that illustration of the layers under the insulating layer 61 is omitted in FIG. 7A. The same applies to the other drawings illustrating an example of the method for manufacturing the display device 10.

Then, the light-emitting element 20R, the light-emitting element 20G, and the light-emitting element 20B are formed (FIG. 7B). At this time, the EL layer 23R, the EL layer 23G, and the EL layer 23B are preferably formed without using a metal mask, specifically a fine metal mask. For example, a layer to be the lower electrode 21, a layer to be the EL layer 23, a layer to be the upper electrode 25 are deposited, a resist mask is formed, the layers are etched, and then the resist mask is removed. In this manner, the lower electrodes 21, the EL layers 23, and the upper electrodes 25 can be separately formed between the light-emitting elements 20. The EL layer 23 is formed without using the fine metal mask, whereby the productivity of the display device 10 can be increased. In addition, a process in which the layer to be the lower electrode 21, the layer to be the EL layer 23, the layer to be the upper electrode 25 are deposited, a resist mask is formed, and the layers are etched together is employed to lower the manufacturing cost. This process allows the positions of the side surfaces of the lower electrode 21, the EL layer 23, and the upper electrode 25 to be in substantially the same position in a top view. Note that the EL layer 23 is formed on the side inner than the lower electrode 21 and the upper electrode 25 in the top view depending on etching conditions in some cases.

In addition, when the light-emitting element 20 is formed using the fine metal mask, it is difficult to set the distance between the light-emitting elements 20 to 20 µm or less due to dimensional accuracy limits. According to one embodiment of the present invention, the distance between adjacent light-emitting elements 20 can be 20 µm or less. Specifically, the distance between adjacent light-emitting elements 20 is greater than or equal to 0.5 µm and less than or equal to 15 µm, preferably greater than or equal to 0.5 µm and less than or equal to 10 µm, and further preferably greater than or equal to 0.5 µm and less than or equal to 5 µm. Thus, an increase in pixel aperture ratio, higher definition, a reduction in size, and the like can be achieved.

Note that in the case where the distance between the light-emitting elements 20 is 100 nm or less, typically 90 nm or less, an optimal light-exposure apparatus is needed to be used. As the light-exposure apparatus, a stepper, a scanner, or the like can be used, for example. Furthermore, as the wavelength of a light source that can be used in the light-exposure apparatus, 13 nm (EUV: Extreme Ultra Violet), 157 nm (F2), 193 nm (ArF), 248 nm (KrF), 308 nm (XeCl), 365 nm (i-line), 436 nm (g-line), and the like can be given. With use of the short wavelength as the wavelength of the light source, a display device having high definition or a miniaturized display device can be obtained.

Next, the protective layer 31 is formed (FIG. 7C). The protective layer 31 is formed using a deposition method providing high coverage. For example, the protective layer 31 is formed by an ALD method. Thus, the protective layer 31 is formed such that the opening portion isolating the adjacent light-emitting elements 20 from each other is coated with the protective layer 31. In other words, the protective layer 31 is formed to include regions in contact with the side surface of the upper electrode 25, the side surface of the EL layer 23, the side surface of the lower electrode 21, and a top surface of the insulating layer 61 in the opening portion. As described above, the protective layer 31 can be an insulating layer containing aluminum oxide, for example.

After that, the protective layer 33 is formed (FIG. 7D). The protective layer 33 is deposited by a method offering lower coverage than the coverage with the protective layer 31. For example, the protective layer 33 is formed by a sputtering method or a CVD method. Accordingly, an opening portion that isolates the adjacent light-emitting elements 20 from each other is not coated with the protective layer 33, and the gap 30 is formed. Particularly when the protective layer 33 is deposited by a PECVD method, the film can be deposited at a low temperature, specifically, a temperature of 100° C. or lower, or at room temperature, which is preferable for inhibitory of heat deterioration of the EL layer 23. As described above, the protective layer 33 can have a stacked-layer structure including a layer including silicon nitride and a layer including a metal oxide containing In, Ga, and Zn.

Next, the microlens array 35 is formed (FIG. 7E). The microlens array 35 can be formed in a manner in which a resist pattern is formed by a photolithography method, for example, and then the resist is reflowed by heating of the substrate 81.

Then, the substrate 47 is prepared, the insulating layer 45 is formed over the substrate 47, and the light-blocking layer 43 is formed over the insulating layer 45. Next, the adhesive layer 41 is formed over the insulating layer 45 and the light-blocking layer 43, so that the microlens array 35 is attached to the insulating layer 45 and the light-blocking layer 43 with the adhesive layer 41. The adhesive layer 41 can be formed by a screen printing method, a dispensing method, or the like. Through the above steps, the display device 10 illustrated in FIG. 1 can be manufactured.

Structure Example_2 of Display Device

Figure 8:
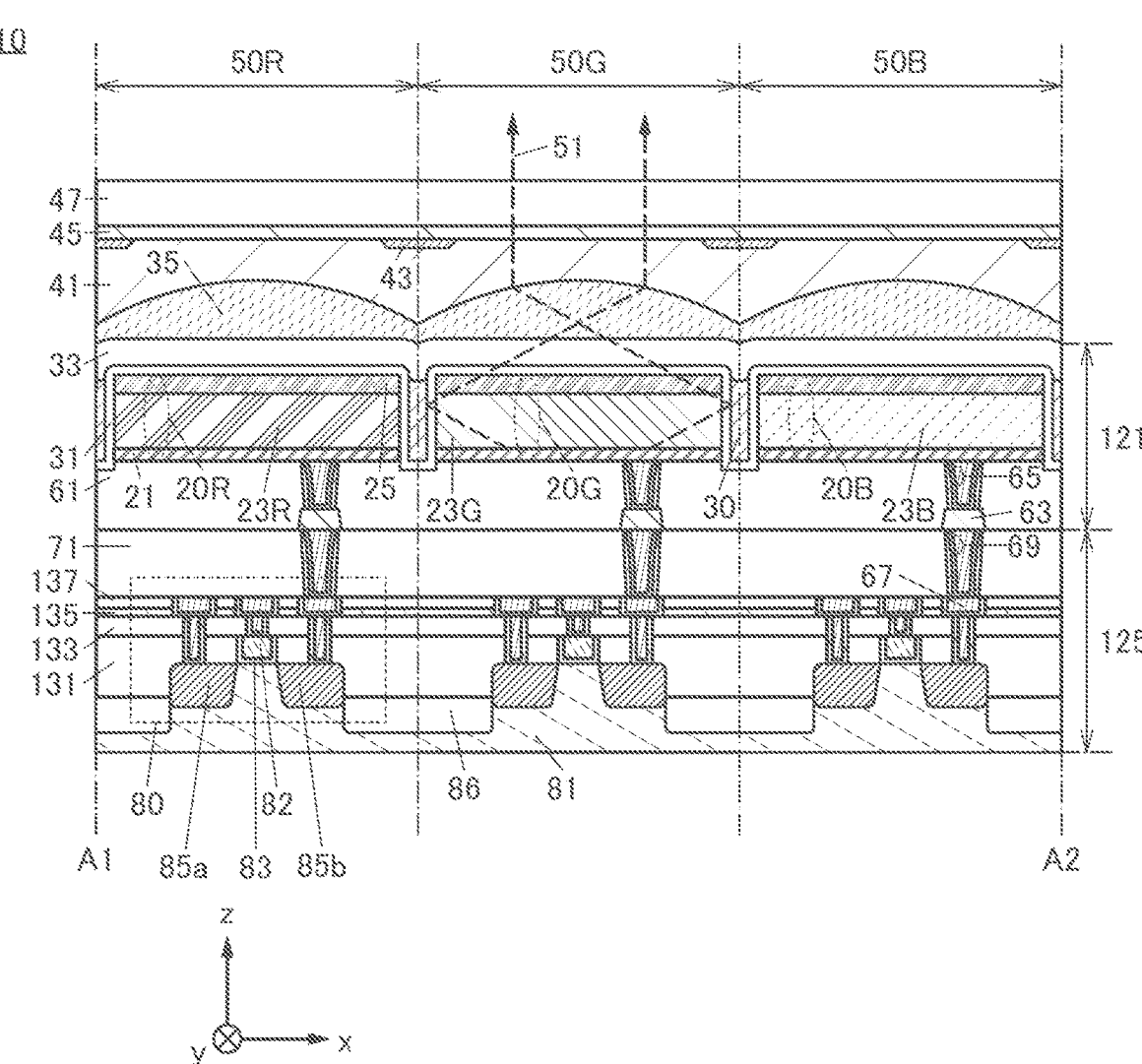
FIG. 8 is a cross-sectional view illustrating a structure example of a display device.

FIG. 8 is a cross-sectional view illustrating a structure example of the display device 10 and is a variation example of the display device 10 illustrated in FIG. 1. The display device 10 illustrated in FIG. 8 is different from the display device 10 illustrated in FIG. 1 in that the length (height) in the z direction of the insulating layer 61 in a region in contact with the protective layer 31 is shorter than the length (height) in the z direction of the insulating layer 61 in a region in contact with the lower electrode 21. The display device 10 in FIG. 8 includes regions in which the protective layer 31 is in contact with not only the top surface of the insulating layer 61 but also the side surface of the insulating layer 61 in the opening portion that isolates the adjacent light-emitting elements 20.

Figure 9:
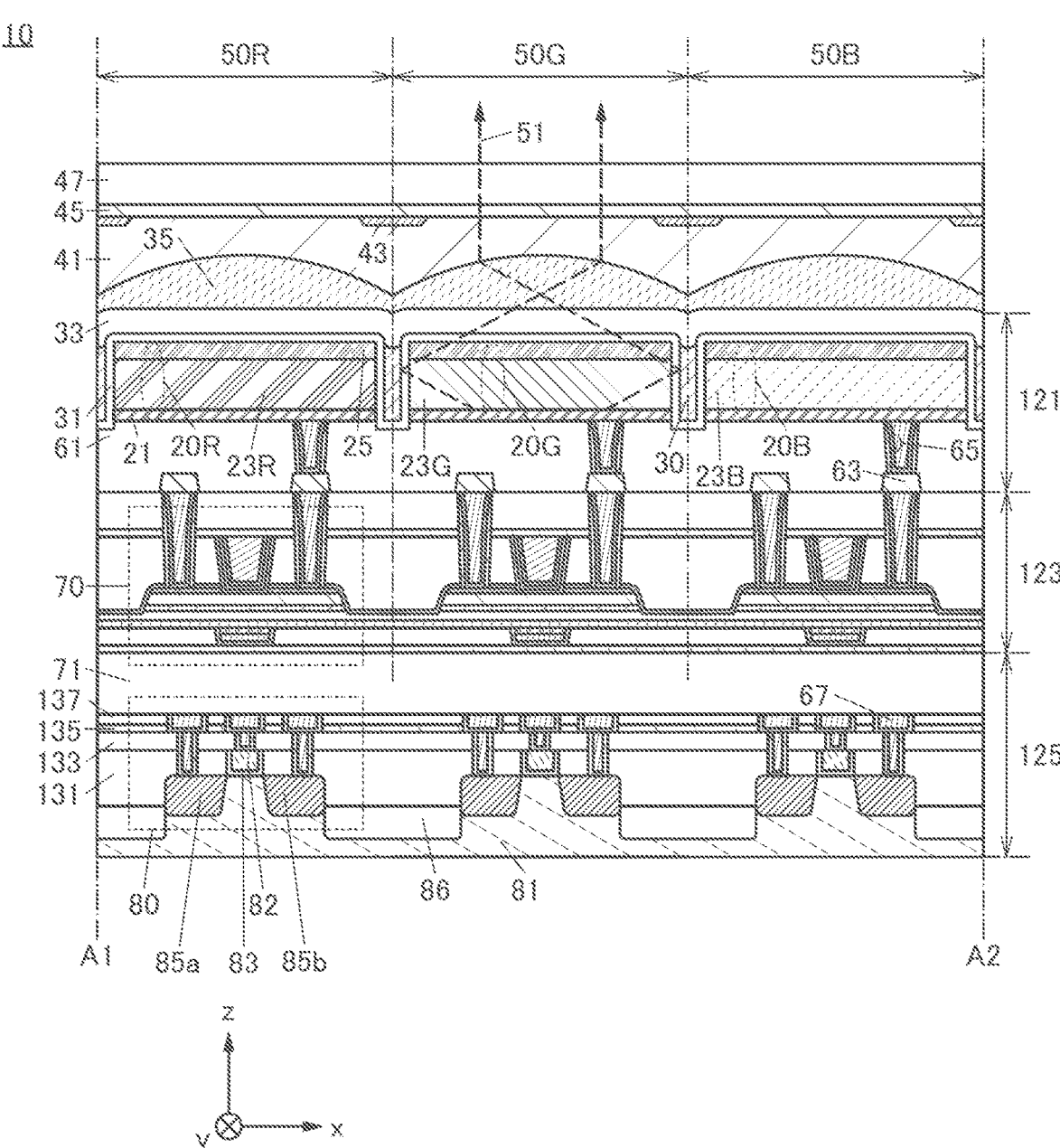
FIG. 9 is a cross-sectional view illustrating a structure example of a display device.

FIG. 9 is a schematic diagram illustrating a structure example of the display device 10 and is a variation example of the display device 10 illustrated in FIG. 8. The display device 10 illustrated in FIG. 9 is different from the display device 10 illustrated in FIG. 8 in that, for example, the transistor 70 that can be an OS transistor is included.

Figure 10:
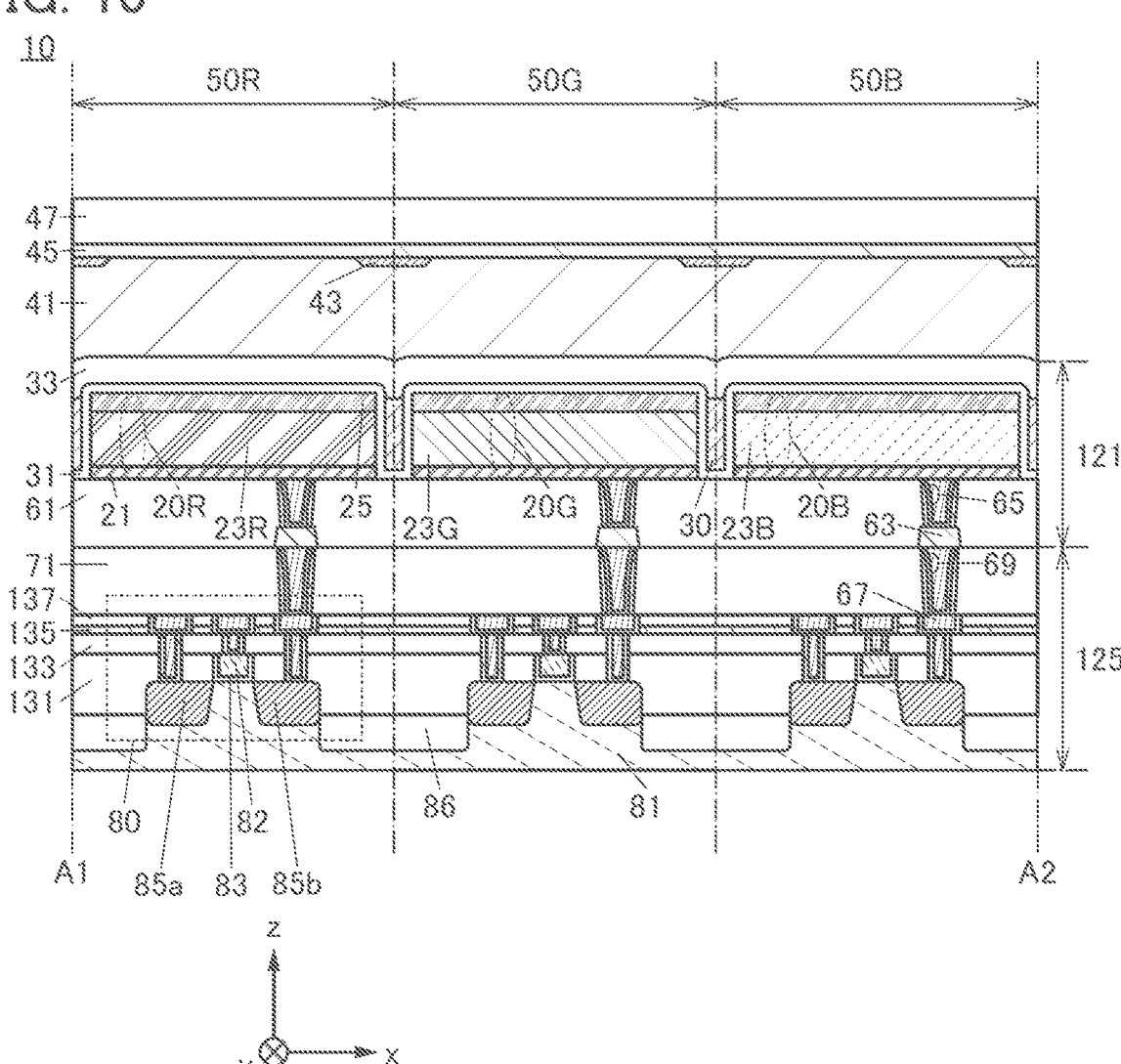
FIG. 10 is a cross-sectional view illustrating a structure example of a display device.

FIG. 10 is a cross-sectional view illustrating a structure example of the display device 10, and is a variation example of the display device 10 illustrated in FIG. 1. The display device in FIG. 10 is different from the display device 10 illustrated in FIG. 1 in that the microlens array 35 is not included. Since the display device 10 includes no microlens array 35, the manufacturing process of the display device 10 can be simplified. Thus, the manufacturing cost of the display device 10 can be lowered and the yield can be made increased. Accordingly, the cost of the display device 10 can be lowered.

FIG. 11 is a cross-sectional view illustrating a structure example of the display device 10, and is a variation example of the display device 10 illustrated in FIG. 1. The display device illustrated in FIG. 11 is different from the display device 10 illustrated in FIG. 1 in that a partition 37 is provided over the insulating layer 61. The partition 37 can be an insulating layer, for example.

The partition 37 is formed between adjacent pixels 50 and is formed to cover an end portion of the lower electrode 21. In the display device 10 illustrated in FIG. 11, the EL layer 23 is formed over the lower electrode 21 and the partition 37. The protective layer 31 is formed over the light-emitting element 20 and the partition 37. The partition 37 can inhibit electrically short-circuiting that might be caused between the EL layers 23. In contrast, a structure without the partition 37 can have a higher aperture ratio. For example, in the case where the partition 37 is not provided, the aperture ratio of the pixel can be 70% or higher, preferably 80% or higher, further preferably 90% or higher.

Figure 12:
FIG. 12 is a cross-sectional view illustrating a structure example of a display device.

FIG. 12 is a cross-sectional view illustrating a structure example of the display device 10 and is a variation example of the display device 10 illustrated in FIG. 11. The display device 10 in FIG. 12 is different from the display device 10 illustrated in FIG. 11 in that, for example, the transistor 70 that can be an OS transistor is included.

Figure 13:
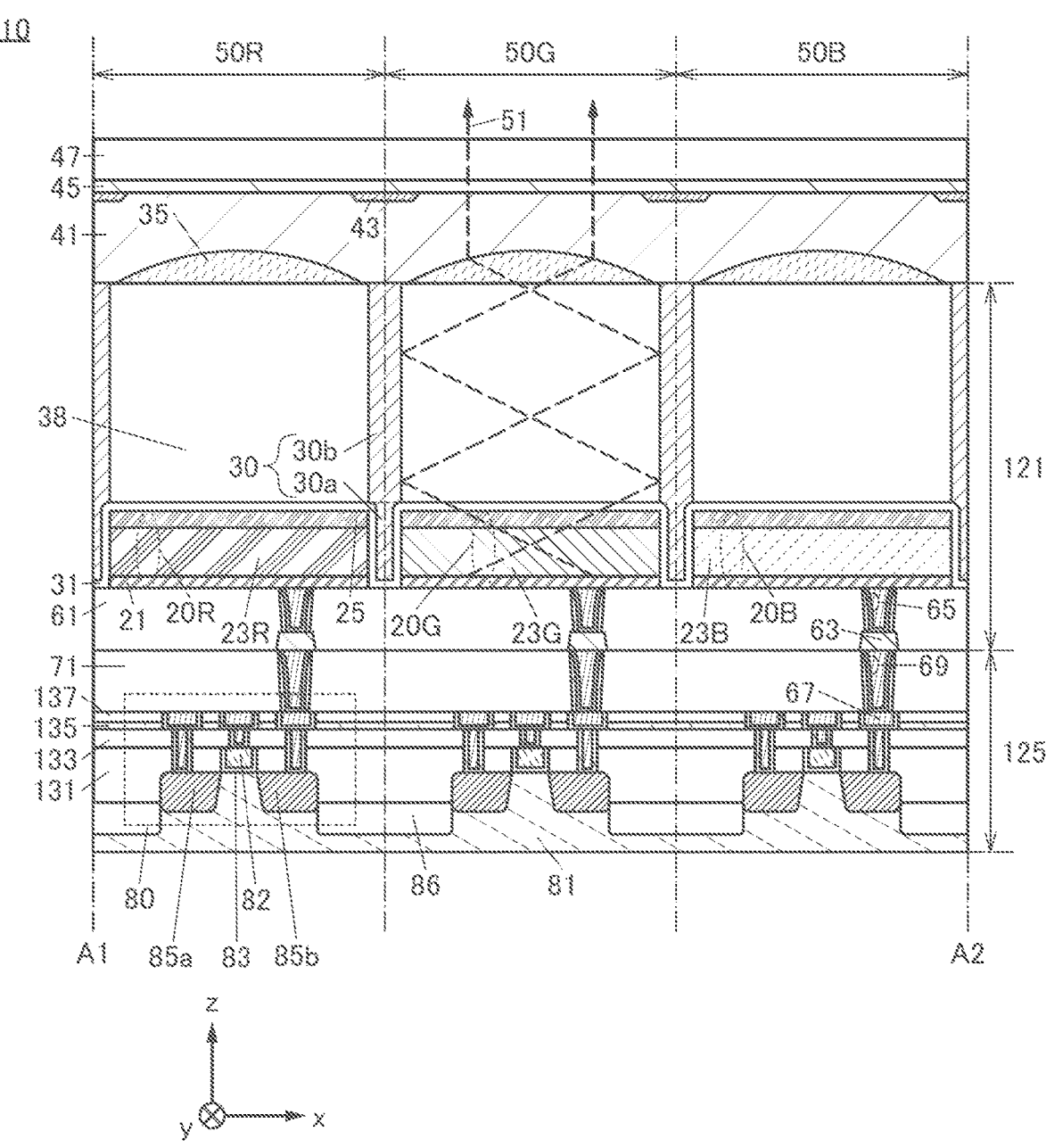
FIG. 13 is a cross-sectional view illustrating a structure example of a display device.

FIG. 13 is a cross-sectional view illustrating a structure example of the display device 10, and is a variation example of the display device 10 illustrated in FIG. 1. The display device illustrated in FIG. 13 is different from the display device 10 illustrated in FIG. 1 in that the protective layer 33 is not included but the insulating layer 38 is included.

The insulating layer 38 is formed over the protective layer 31. In addition, the gap 30 is provided so as to be in contact with not only the side surface of the protective layer 31 but also the side surface of the insulating layer 38.

In the display device 10 in FIG. 13, the insulating layer 38 is formed thick, whereby the height of the gap 30 (the length in the z direction) can be increased. By increasing the height of the gap 30, the light 51 emitted from the EL layer 23 can be prevented from entering the adjacent pixels 50. Thus, mixture of light of different colors can be inhibited, so that the display device can display a high-quality image.

The thickness of the insulating layer 38 over the light-emitting element 20 is preferably for example, once or more, preferably twice or more, preferably three or more times, preferably four or more times, preferably five or more times, preferably six or more times, or preferably ten or more times the total thickness of the thickness of the lower electrode 21, the thickness of the EL layer 23, and the thickness of the upper electrode 25. In contrast, when the thickness of the insulating layer 38 is too large, it takes a long time to deposit the insulating layer 38, so that the productivity of the display device 10 is decreased. The thickness of the insulating layer 38 over the light-emitting element 20 is preferably for example, 50 or less times, preferably 20 or less times, preferably 15 or less times, or preferably 12 or less times the total thickness of the thickness of the lower electrode 21, the thickness of the EL layer 23, and the thickness of the upper electrode 25. For example, in the case where the maximum value of the total thickness of the thickness of the lower electrode 21, the thickness of the EL layer 23, and the thickness of the upper electrode is 300 nm, the minimum thickness value of the insulating layer 38 over the light-emitting element 20 is preferably 300 nm or more, preferably 1000 nm or more, preferably 1500 nm or more, preferably 1800 nm or more, or preferably 2000 nm or more.

In order to form the gap 30 illustrated in FIG. 13, first, the insulating layer 38 is formed after the protective layer 31 is formed. Thus, in the gap 30, the gap 30 which is in a region in contact with the side surface of the protective layer 31 is formed. Then, an opening portion reaching the gap 30 is formed in the insulating layer 38. The opening portion can be formed by a photolithography method and an etching method, for example. The opening portion is formed in the insulating layer 38, and thus, in the gap 30, the gap 30 which is in a region in contact with the side surface of the insulating layer 38 is formed. As described above, the gap 30 having not only the region in contact with the side surface of the protective layer 31 but also the region in contact with the side surface of the insulating layer 38 can be formed. Note that the gap 30 which is in the region in contact with the side surface of the protective layer 31 is referred to as a gap 30*a* and the gap 30 which is in the region in contact with the side surface of the insulating layer 38 is referred to as a gap 30*b*.

At this time, when the insulating layer 38 is deposited, the insulating layer 38 gains entry into the gap 30 in some cases.

In this case, in forming the opening portion in the insulating layer 38, the insulating layer 38 included in the gap 30 in the region in contact with the side surface of the protective layer 31 can be removed. Thus, the gap 30 in the region in contact with the side surface of the protective layer 31 can be inhibited from being infilled with insulating layer 38.

The insulating layer 38 can include a resin. The insulating layer 38 can include one or more of an acrylic resin, a polyimide resin, an epoxy resin, a polyamide resin, a poly-imide-amide resin, a siloxane resin, a benzocyclobutene-based resin, a phenol resin, a novolac resin, precursors of these resins, for example. In the case where the insulating layer 38 includes a resin, the insulating layer 38 can be formed by spin coating, dipping, spray coating, ink-jetting, dispensing, screen printing, offset printing, a doctor knife, a slit coater, a roll coater, a curtain coater, or a knife coater, for example. The insulating layer 38 including a resin is pre-ferred because the thickness of the insulating layer 38 can be increased. Note that the insulating layer 38 may include a material similar to the material that can be used for the protective layer 33. In this case, the insulating layer 38 can be formed by a deposition method similar to that of the protective layer 33.

Figure 14:
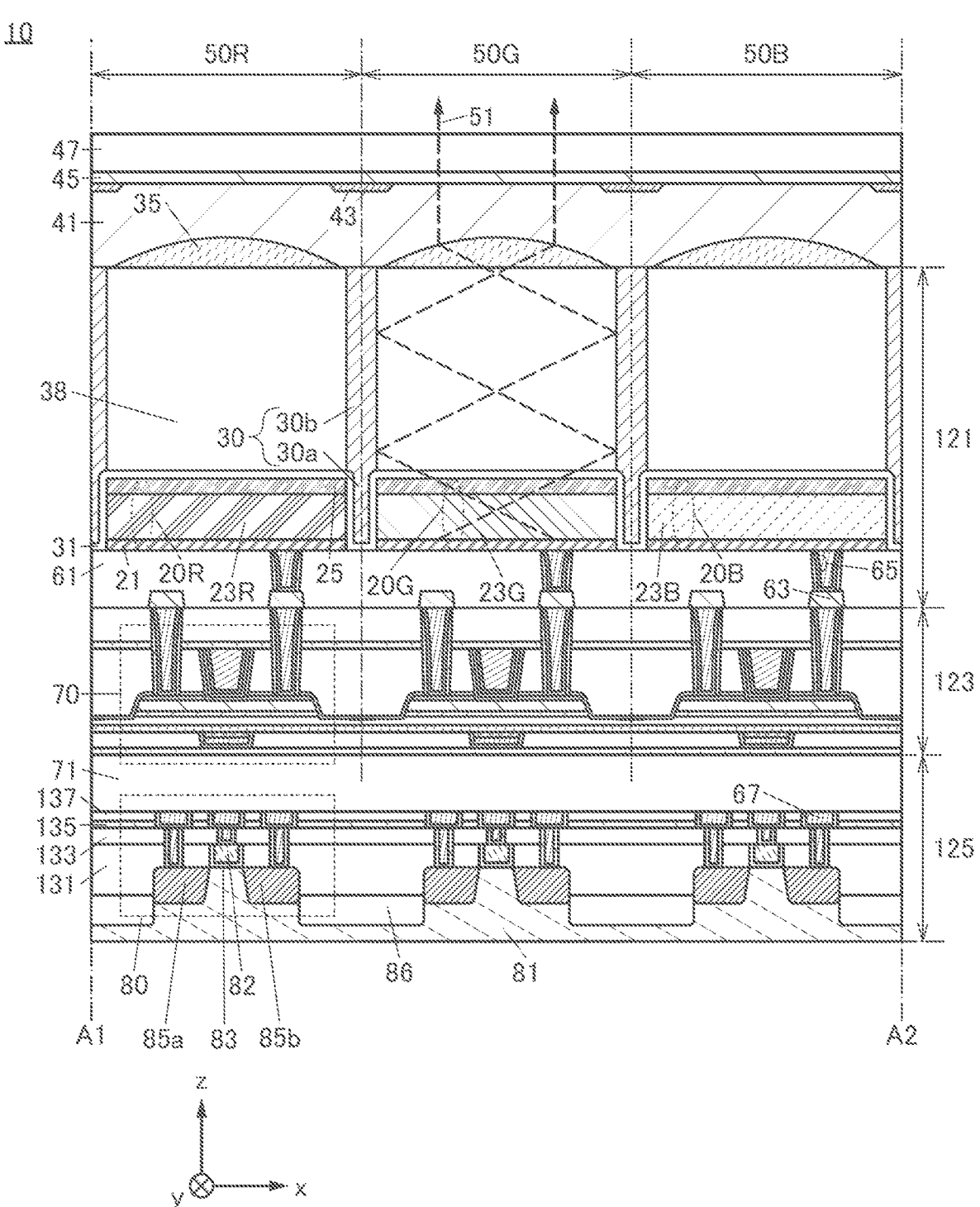
FIG. 14 is a cross-sectional view illustrating a structure example of a display device.

FIG. 14 is a cross-sectional view illustrating a structure example of the display device 10 and is a variation example of the display device 10 illustrated in FIG. 13. The display device 10 in FIG. 14 is different from the display device 10 illustrated in FIG. 13, for example, in that the transistor 70 that can be an OS transistor is included.

Figure 15:
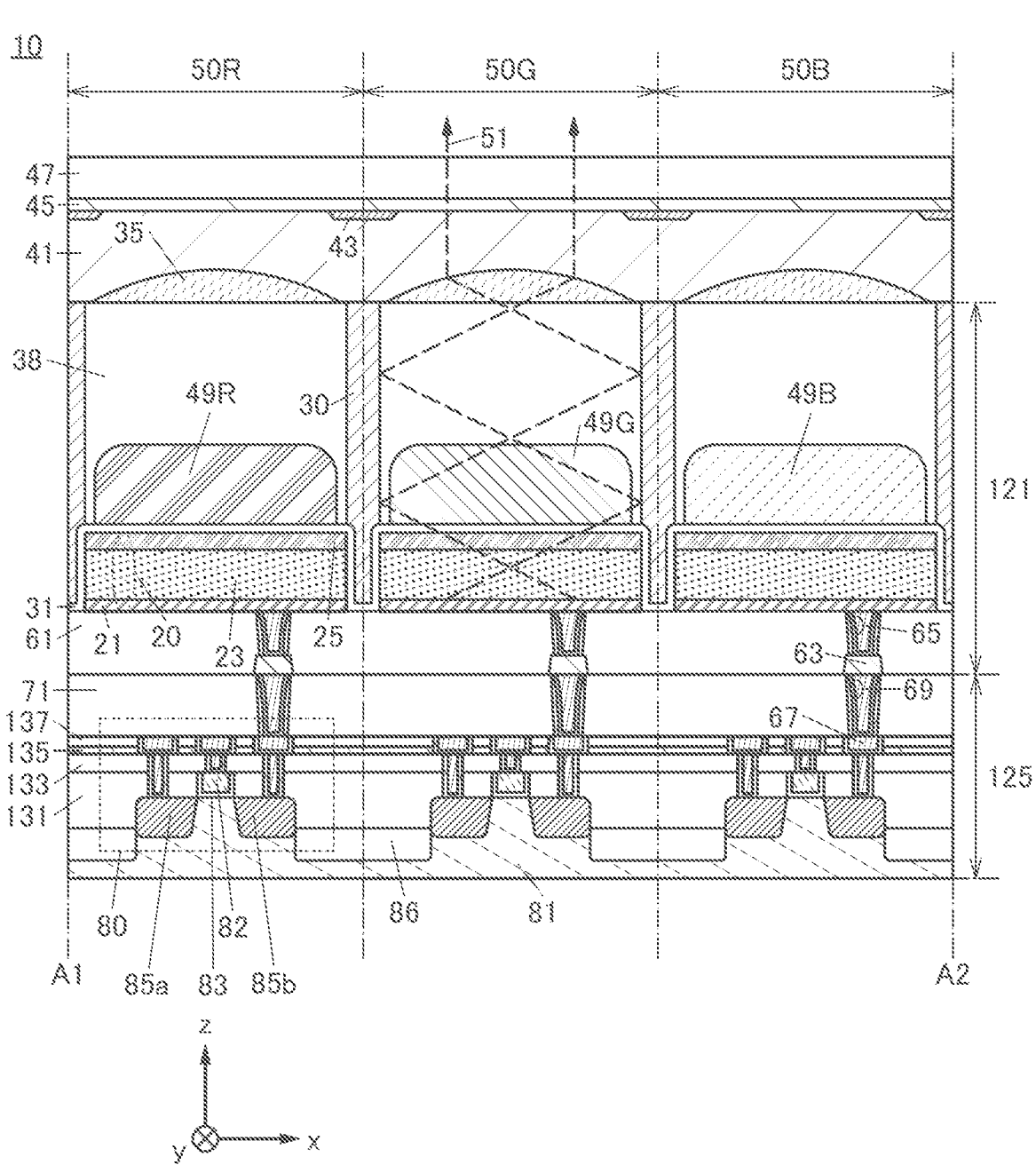
FIG. 15 is a cross-sectional view illustrating a structure example of a display device.

FIG. 15 is a cross-sectional view illustrating a structure example of the display device 10 and is a variation example of the display device 10 illustrated in FIG. 13. The display device 10 illustrated in FIG. 15 is different from the display device 10 illustrated in FIG. 13 in that the coloring layer 49R is provided for the pixel 50R, the coloring layer 49G is provided for the pixel 50G, and the coloring layer 49B is provided for the pixel 50B.

The coloring layer 49 is provided over the protective layer 31. The insulating layer 38 is provided over the coloring layer 49. In the display device 10 illustrated in FIG. 15, the insulating layer 38 is formed after the coloring layer 49 is formed.

The coloring layer 49 can change the hue of light passing therethrough. For example, the hue of light passing through the coloring layer 49R can be red, the hue of light passing through the coloring layer 49G can be green, and the hue of the light passing through the coloring layer 49B can be blue. Note that the coloring layer 49 may make the hue of light passing therethrough cyan, magenta, yellow, or the like.

The coloring layer 49 is provided in the display device 10, which can eliminate formation of the separate EL layers 23 for respective colors. For example, all the EL layers 23 can be layers that emit white light. Thus, the manufacturing process of the display device 10 can be simplified. Thus, the manufacturing cost of the display device 10 can be lowered and the yield can be increased. From the above, the cost of the display device 10 can be lowered. In the case where all the EL layers 23 are layers that emit white layers, the EL layers 23 can each have a tandem structure (a stack struc-ture), for example. For example, the EL layer 23 can emit white light with a stacked-layer structure of a layer emitting yellow light and a layer emitting blue light.

Examples of a material that can be used for the coloring layer 49 include a metal material, a resin material, and a resin material containing a pigment or a dye.

Figure 16:
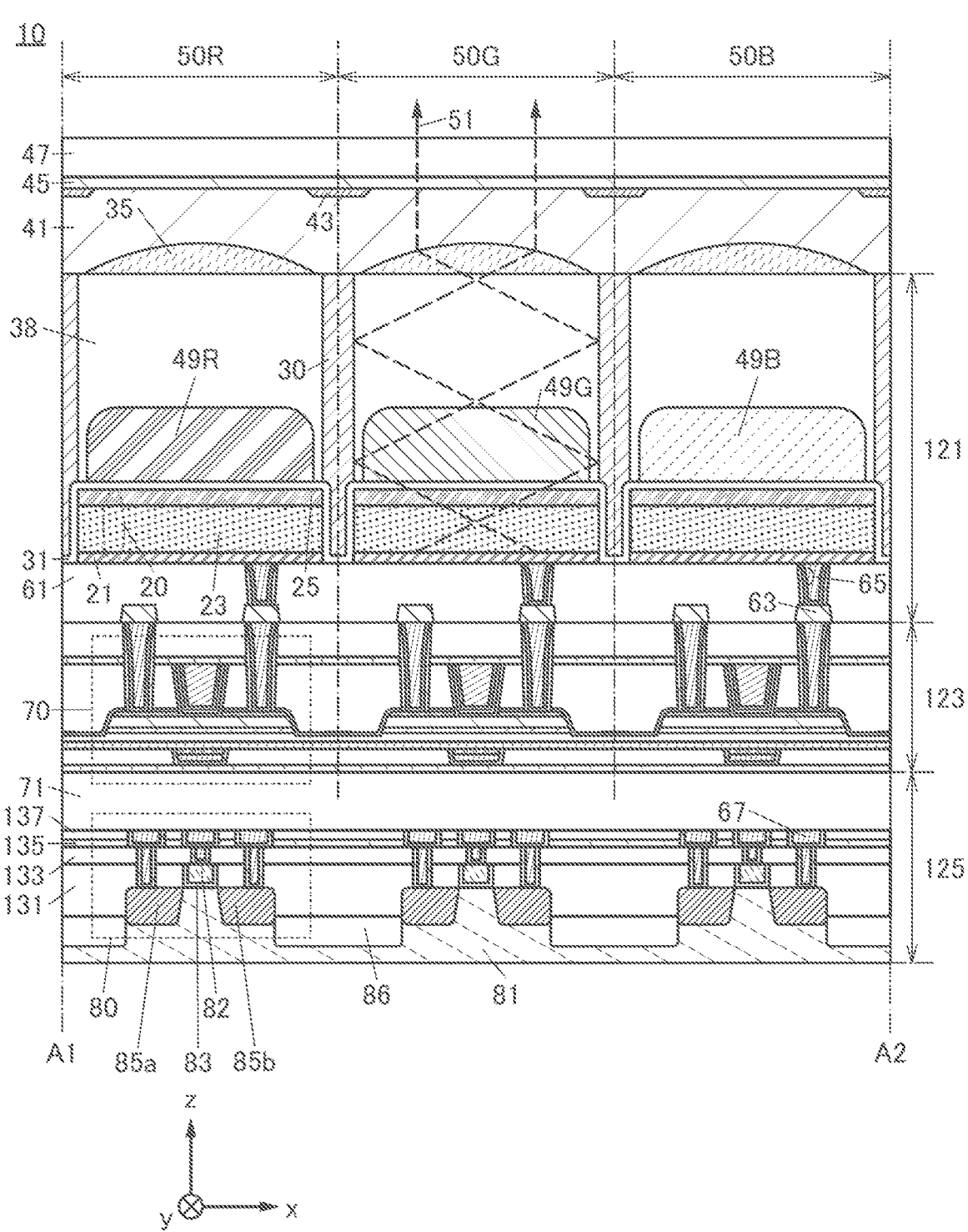
FIG. 16 is a cross-sectional view illustrating a structure example of a display device.

FIG. 16 is a cross-sectional view illustrating a structure example of the display device 10, and is a variation example of the display device 10 illustrated in FIG. 15. The display device in FIG. 16 is different from the display device 10 illustrated in FIG. 15 in that the transistor 70 that can be an OS transistor is included, for example.

Figure 17:
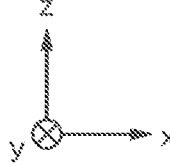
FIG. 17 is a cross-sectional view illustrating a structure example of a display device.

FIG. 17 is a cross-sectional view illustrating a structure example of the display device 10, and is a variation example of the display device 10 illustrated in FIG. 13. The display device 10 in FIG. 17 is different from the display device 10 in FIG. 13 in that the protective layer 39 is provided over the insulating layer 38.

The protective layer 39 can include a material similar to that of the protective layer 33. Like the protective layer 33, the protective layer 39 is preferably formed by a sputtering method or a CVD method, for example. As described above, the coverage with a film deposited by a sputtering method or a CVD method is lower than the coverage with a film deposited by an ALD method, for example. This can inhibit the gap 30 from being coated with the protective layer 39.

The protective layer 39 is provided over the insulating layer 38, whereby entry of the microlens array 35 or the adhesive layer 41 into the gap 30 can be inhibited. Thus, it can be said that the light-emitting element 20 is protected by the protective layer 39.

Structure Example_3 of Display Device

FIG. 18A is a perspective view illustrating a structure example of the display device 10. FIG. 18B is a cross-sectional view in the x direction illustrating a structure example of the display device 10. FIG. 18C is a cross-sectional view in they direction illustrating a structure example of the display device 10.

In FIG. 18A, only the lower electrode 21, the EL layer 23, and the upper electrode 25 of the light-emitting element 20 are illustrated, and the other components are not illustrated. Although the layers under the insulating layer 61 are not illustrated in FIG. 18B and FIG. 18C, the layers under the insulating layer 61 can be similar to those in FIG. 1 and the like. Furthermore, the conductive layer 63 and the conduc-tive layer 65 are not illustrated in FIG. 18B and FIG. 18C; however, the conductive layer 63 and the conductive layer 65 can be formed inside the insulating layer 61, for example.

The display device 10 illustrated in FIG. 18A to FIG. 18C includes, in addition to the components illustrated in FIG. 1, the protective layer 32, the protective layer 36, and the coloring layer 49 (the coloring layer 49R, the coloring layer 49G, and the coloring layer 49B). The display device 10 in FIG. 18A to FIG. 18C is provided with the protective layer 32 over the EL layer 23. The upper electrode 25 is provided over the protective layer 32 and the protective layer 36, and the protective layer 31 is provided over the upper electrode 25. The coloring layer 49 is provided between the light-blocking layers 43.

As described above, the coloring layer 49 is provided in the display device 10, which eliminates the need for sepa-rately forming the EL layers 23 of respective colors. For example, all the EL layers 23 can be layers that emit white light. Thus, the manufacturing process of the display device 10 can be simplified. Thus, the manufacturing cost of the display device 10 can be lowered and the yield can be increased. From the above, the cost of the display device 10 can be lowered.

Like the protective layer 31, the protective layer 32 is preferably a layer through which impurities such as water and hydrogen are less likely to diffuse, or a layer that can capture (also referred to as gettering) impurities such as water and hydrogen. Thus, the reliability of the display device 10 can be increased.

Here, the protective layer 32 is sufficiently thinned, whereby an electric continuity between the upper electrode 25 and the EL layer 23 can be established even when the protective layer 32 serves as the insulating layer. For example, the thickness of the insulating layer 23 is 5 nm or less, 3 nm or less, or 1 nm or less, whereby the electric continuity between the upper electrode 25 and the EL layer 23 can be established even when the protective layer 32 serves as the insulating layer.

The protective layer 32 can include a material similar to that of the protective layer 31 and can be formed by a deposition method similar to that of the protective layer 31. In other words, the protective layer 32 can be a layer containing aluminum oxide deposited by an ALD method, for example. The protective layer 36 can include a material similar to that of the protective layer 33 and can be formed by a deposition method similar to that of the protective layer 33. That is, the protective layer 36 can be a layer containing silicon nitride deposited by a sputtering method, for example.

In the cross-sectional view along the x direction as illustrated in FIG. 18B, the protective layer 31 includes regions that are in contact with the side surface of the lower electrode 21, the side surface of the EL layer 23, the side surface of the protective layer 32 and the side surface of the upper electrode 25. The gap 30 is provided between the protective layer 31 and the protective layer 33. In contrast, in the cross-sectional view along they direction as illustrated in FIG. 18C, the protective layer 32 includes regions that are in contact with the side surface of the lower electrode 21, the side surface of the EL layer 23, and the side surface of the protective layer 36. The gap 30 is provided between the protective layer 32 and the protective layer 36. Here, providing the protective layer 36 can inhibit the entry of the upper electrode 25 in the opening portion that isolates the adjacent light-emitting elements 20 from each other. Thus, it can be said that the light-emitting element 20 is protected by the protective layer 36.

In the display device 10 illustrated in FIG. 18A to FIG. 18C, the upper electrodes 25 different from each other are used between the light-emitting elements 20 arranged in the x direction. On the other hand, a common upper electrode is used between the light-emitting elements 20 arranged in the y direction.

Example_2 of Method for Manufacturing Display Device

An example of a method for manufacturing the display device 10 illustrated in FIG. 18A to FIG. 18C will be described below with reference to drawings.

Figure 19A:
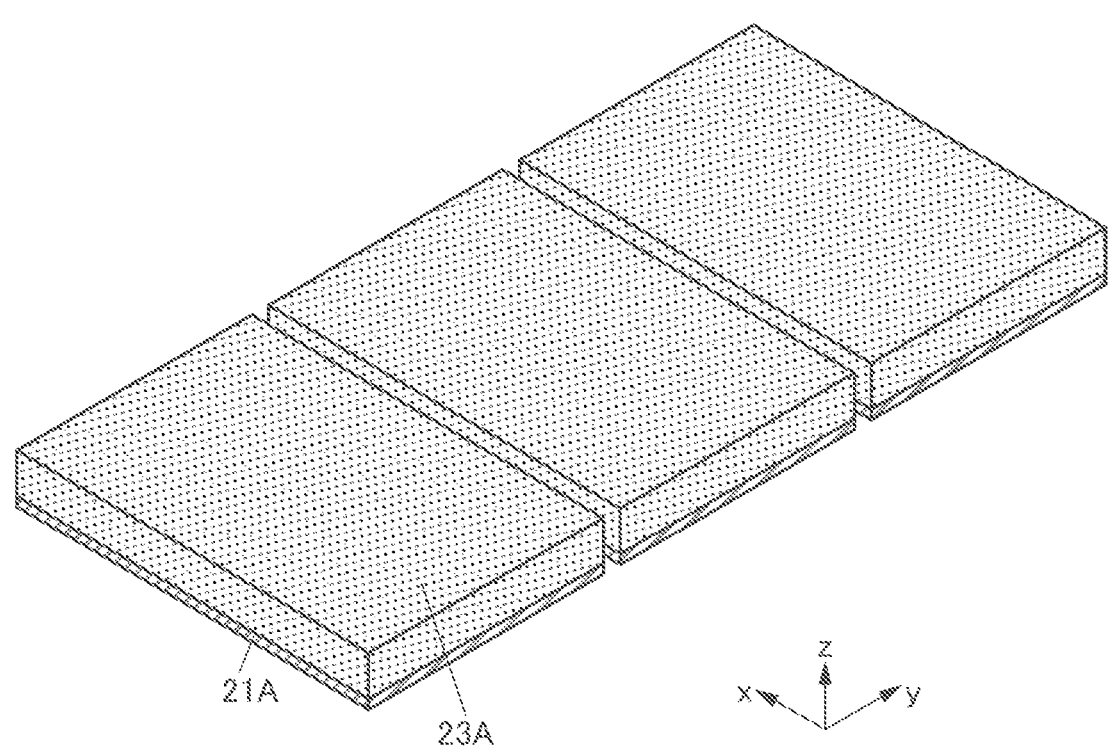
FIG. 19A is a perspective view illustrating an example of a method for manufacturing a display device.
Figure 19B:
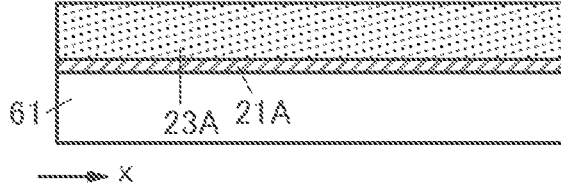
FIG. 19B and FIG. 19C are cross-sectional views illustrating an example of the method for manufacturing the display device.
Figure 19C:

First, the layer to be the lower electrode 21 and the layer to be the EL layer 23 are deposited over the insulating layer 61. Then, these layers are processed by a photolithography method and an etching method. A layer 23A is formed by processing the layer to be the EL layer 23, and a layer 21A is formed by processing the layer to be the lower electrode 21 (FIG. 19A to FIG. 19C). As illustrated in FIG. 19A to FIG. 19C, the layer 21A and the layer 23A each include an opening portion extending in the x direction.

Next, a layer 32A to be the protective layer 32 is deposited (FIG. 20A1 and FIG. 20A2). The layer 32A is formed by a deposition method providing high coverage. For example, the layer 32A is formed by an ALD method. Thus, the layer 32A is formed such that the opening portion that isolates the adjacent light-emitting elements 20 in they direction is coated with the layer 32A. In other words, the layer 32A is formed to include regions that are in contact with the side surface of the layer 21A, the side surface of the layer 23A, and the top surface of the insulating layer 61 in the opening portion. The layer 32A can be an insulating layer containing aluminum oxide, for example.

Then, a layer 36A to be the protective layer 36 is deposited (FIG. 20B1 and FIG. 20B2). The layer 36A is deposited by a method offering lower coverage than the coverage with the layer 32A. For example, the layer 36A is formed by a sputtering method or a CVD method. Accordingly, an opening portion that isolates the adjacent light-emitting elements 20 is not coated with the layer 36A, and thus the gap 30 is formed.

Then, the layer 36A over the layer 32A is processed. For example, the layer 36A is etched using the layer 32A as an etching stopper. In this manner, the protective layer 36 is formed (FIG. 20C1 and FIG. 20C2).

Figure 21A:
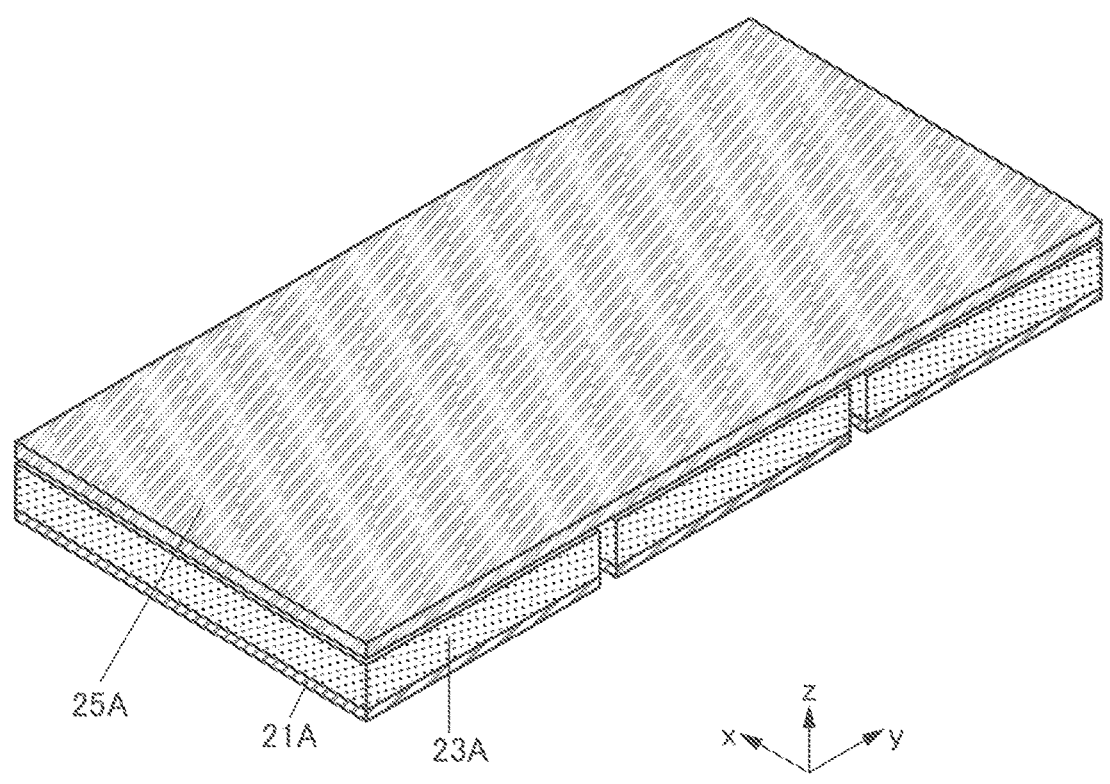
FIG. 21A is a perspective view illustrating an example of a method for manufacturing a display device.
Figures 21B, 21C:
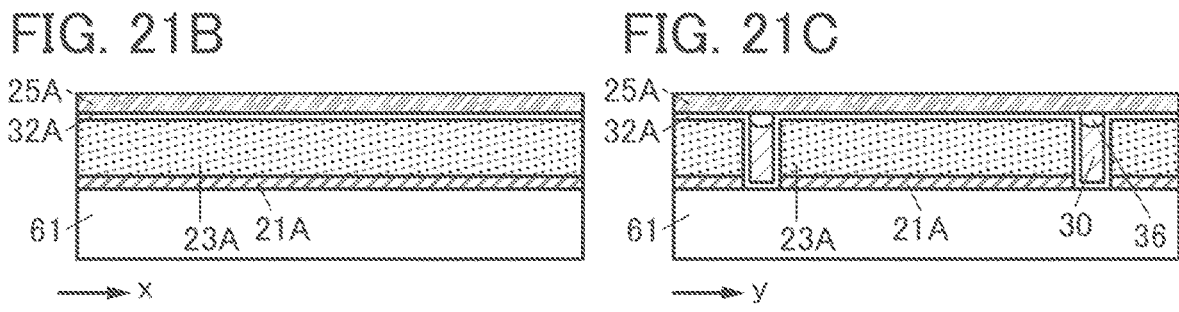
FIG. 21B and FIG. 21C are cross-sectional views illustrating an example of the method for manufacturing the display device.
Figure 22A:
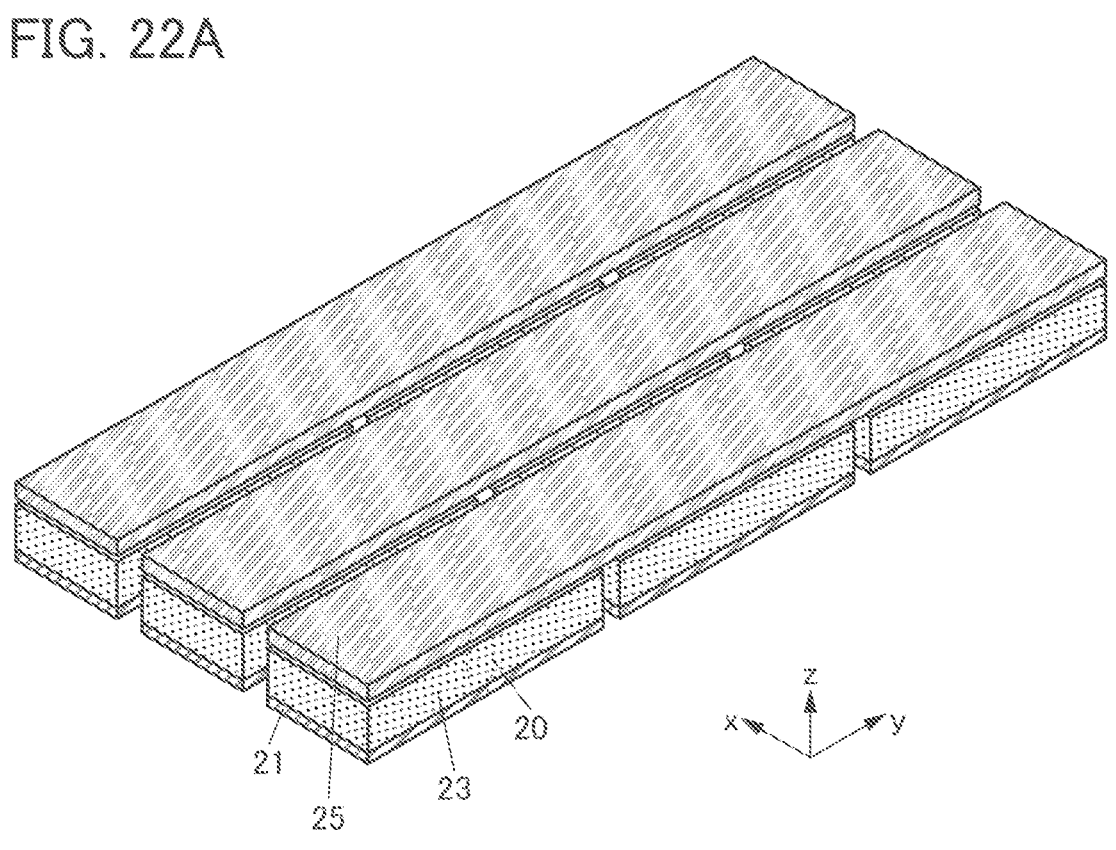
FIG. 22A is a perspective view illustrating an example of a method for manufacturing a display device.
Figure 22B:
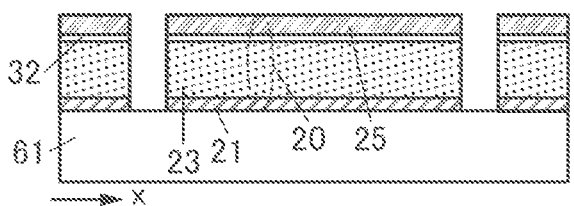
FIG. 22B and FIG. 22C are cross-sectional views illustrating an example of the method for manufacturing the display device.
Figure 22C:
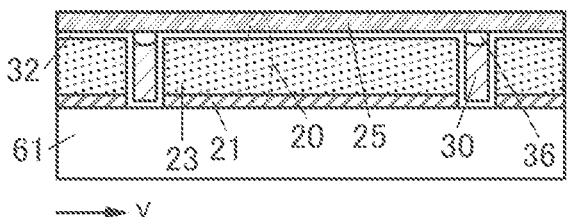

After that, a layer 25A to be the upper electrode 25 is deposited (FIG. 21A to FIG. 21C). The layer 25A, the layer 32A, the layer 23A, and the layer 21A are processed by a photolithography method and an etching method. The upper electrode 25 is formed by processing the layer 25A, the protective layer 32 is formed by processing the layer 32A, the EL layer 23 is formed by processing the layer 23A, and the lower electrode 21 is formed by processing the layer 21A (FIG. 22A to FIG. 22C). In the steps illustrated in FIG. 22A to FIG. 22C, an opening portion extending in the y direction is formed.

The opening portion extending in the x direction is formed in the steps shown in FIG. 19A to FIG. 19C, and the opening portion extending in the y direction is formed in the steps illustrated in FIG. 22A to FIG. 22C. In this manner, the light-emitting element 20 is formed.

By forming the light-emitting element 20 by the above-described method, the EL layer 23 can be formed without using a fine metal mask. As a result, the productivity of the display device 10 can be increased.

Figures 23A1, 23A2, 23B1, 23B2:
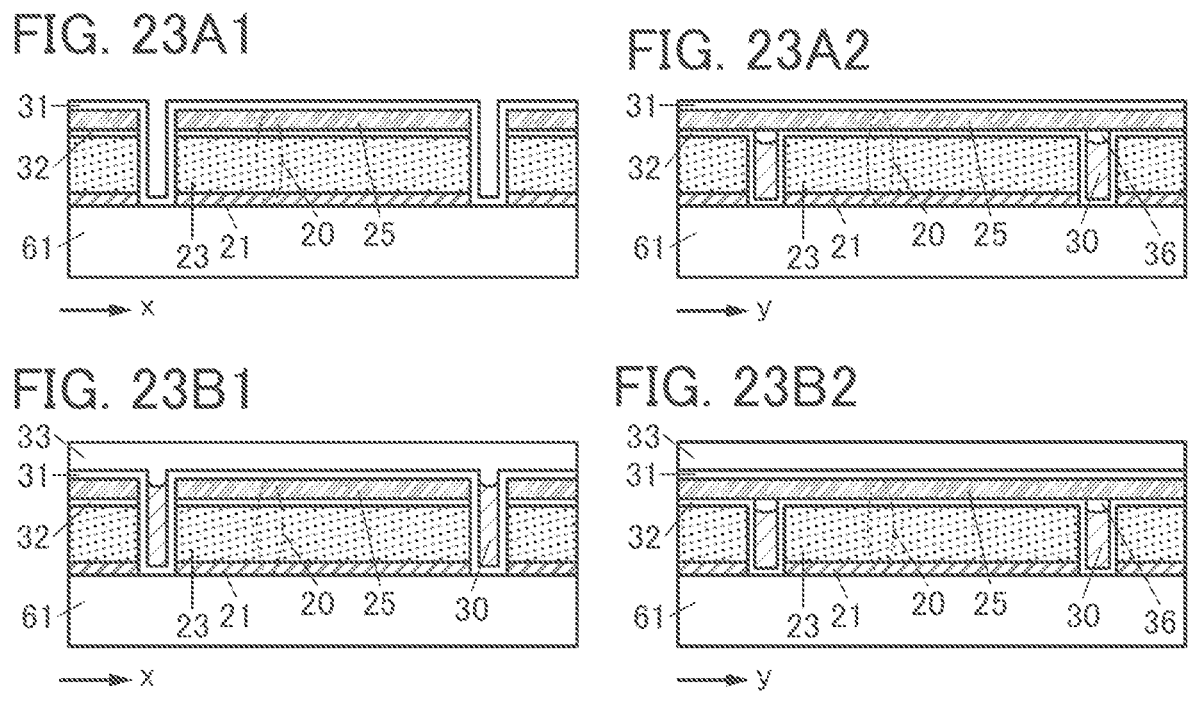

Next, the protective layer 31 is formed (FIG. 23A1 and FIG. 23A2). After that, the protective layer 33 is formed (FIG. 23B1 and FIG. 23B2). The opening portion that isolates the adjacent light-emitting elements 20 from each other is not coated with the protective layer 33 and thus the gap 30 is formed.

Then, the microlens array 35 is formed. Then, the substrate 47 is prepared, the insulating layer 45 is formed over the substrate 47, and the light-blocking layer 43 and the coloring layer 49 are formed over the insulating layer 45. Next, the adhesive layer 41 is formed over the coloring layer 49 and the light-blocking layer 43, so that the microlens array 35 is attached to the coloring layer 49 and the light-blocking layer 43 with the adhesive layer 41. Through the above steps, the display device 10 illustrated in FIG. 18A to FIG. 18C can be manufactured.

Structure Example_4 of Display Device

Figures 24A, 24B, 24C:
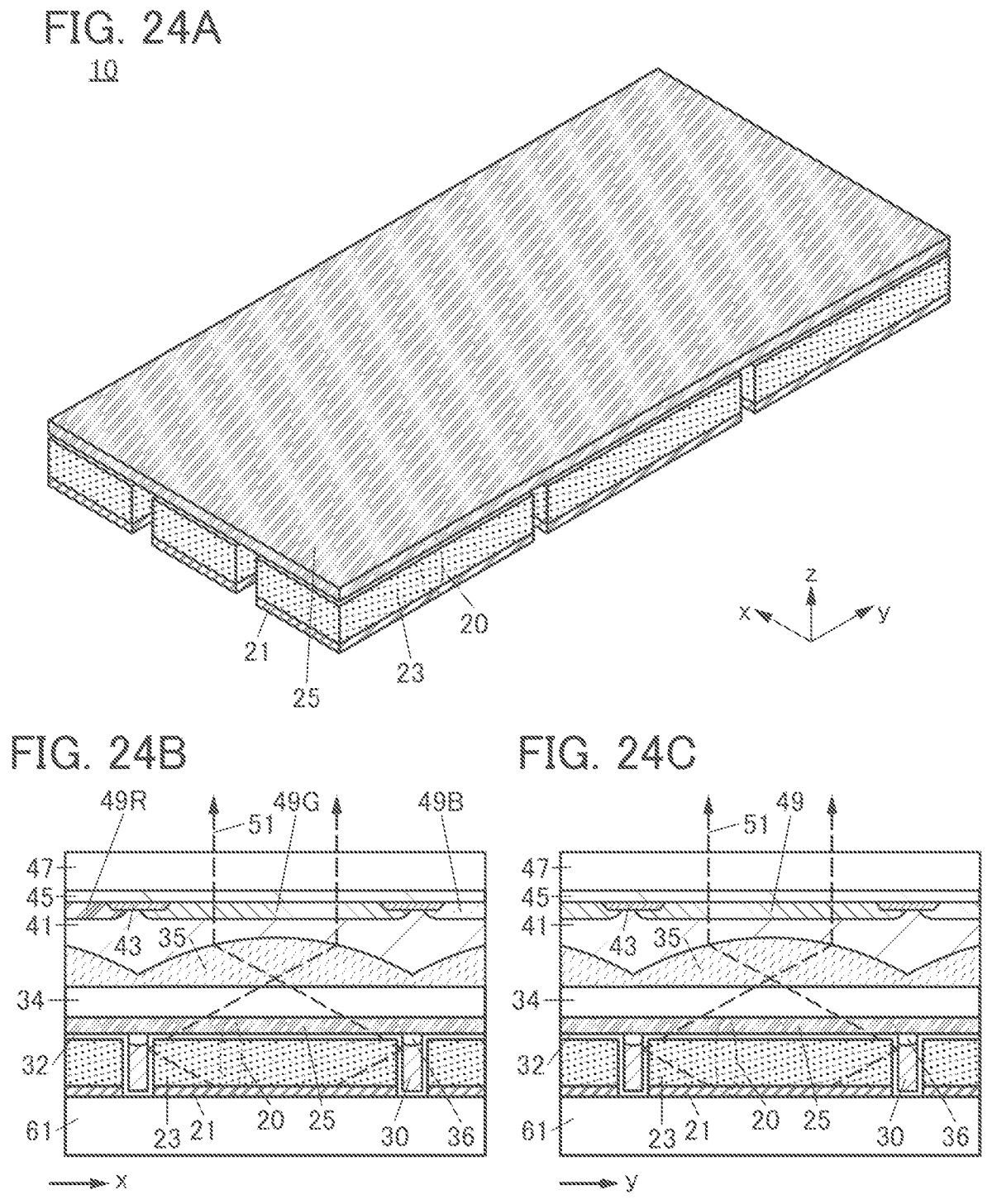

FIG. 24A is a perspective view illustrating a structure example of the display device 10. FIG. 24B is a cross-sectional view in the x direction illustrating a structure example of the display device 10. FIG. 24C is a cross-sectional view in they direction illustrating a structure example of the display device 10. The display device 10 illustrated in FIG. 24A to FIG. 24C is a variation example of the display device 10 illustrated in FIG. 18A to FIG. 18C.

The display device 10 illustrated in FIG. 24A to FIG. 24C is different from the display device 10 illustrated in FIGS. 18A to 18C in that the upper electrode 25 is used in common between the light-emitting elements 20 arranged in the x direction as well as the light-emitting elements 20 arranged in the y direction. That is, it can be said that the upper electrode 25 is a common electrode in the display device 10 illustrated in FIG. 24A to FIG. 24C.

The display device 10 illustrated in FIG. 24A to FIG. 24C includes a protective layer 34 in place of the protective layer 31 and the protective layer 33. The protective layer 34 is provided over the upper electrode 25. Furthermore, the microlens array 35 is provided over the protective layer 34. The protective layer 34 can be formed using a material similar to that of the protective layer 31 or the protective layer 33 by a deposition method similar to that of the protective layer 31 or the protective layer 33. The protective layer 34 can be a stacked-layer structure including a layer corresponding to the protective layer 31 and a layer corresponding to the protective layer 33.

As illustrated in FIG. 24B, also in the cross-sectional view in the x direction, the protective layer 32 includes regions that are in contact with the side surface of the lower electrode 21, the side surface of the EL layer 23, and the side surface of the insulating layer 36, as seen in the cross-sectional view in the y direction. The gap 30 is provided between the protective layer 32 and the protective layer 36.

Example_3 of Method for Manufacturing of Display Device

An example of a method for manufacturing the display device 10 illustrated in FIG. 24A to FIG. 24C will be described below with reference to drawings.

Figure 25A:
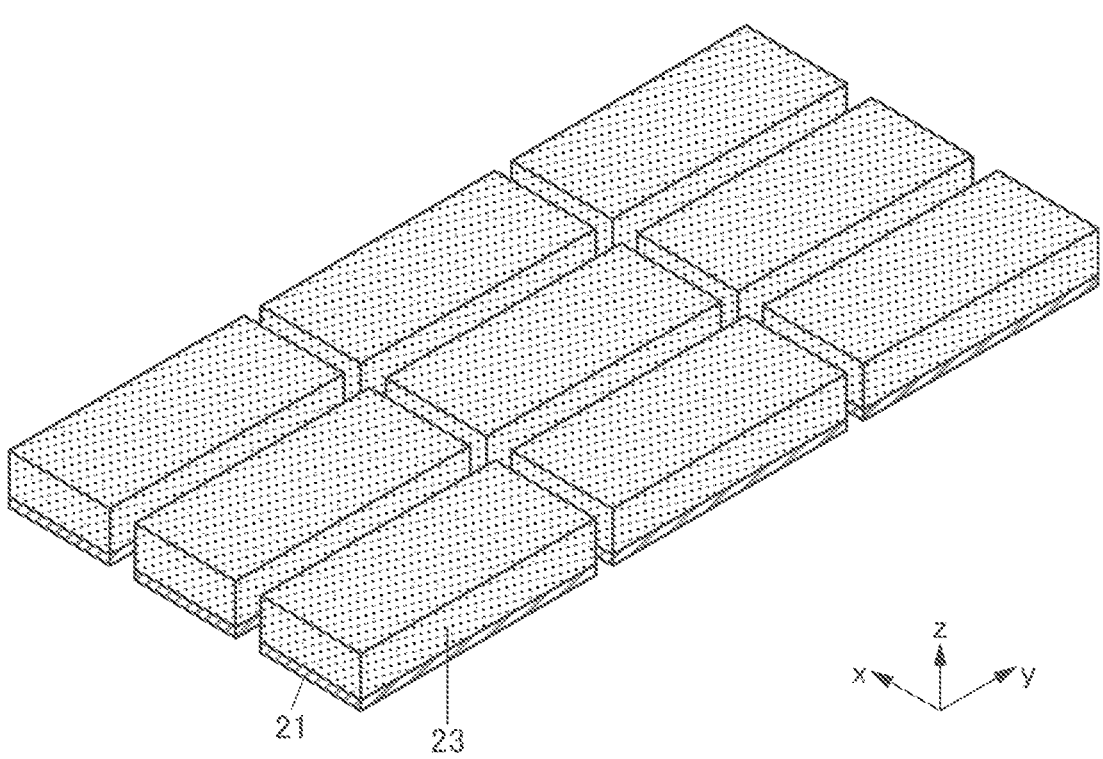
FIG. 25A is a perspective view illustrating an example of a method for manufacturing a display device.
Figure 25B:
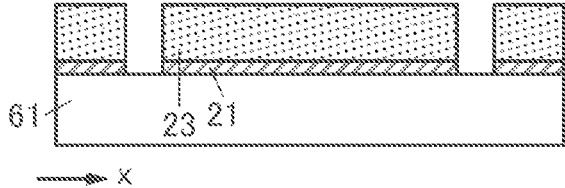
FIG. 25B and FIG. 25C are cross-sectional views illustrating an example of the method for manufacturing the display device.
Figure 25C:
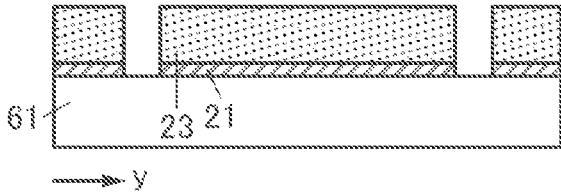

First, the layer to be the lower electrode 21 and the layer to be the EL layer 23 are deposited over the insulating layer 61. Then, these layers are processed by a photolithography method and an etching method. The EL layer 23 is formed by processing the layer to be the EL layer 23, and the lower electrode 21 is formed by processing the layer to be the lower electrode 21 (FIG. 25A to FIG. 25C). As illustrated in FIG. 25A to FIG. 25C, the lower electrode 21 and the EL layer 23 include opening portions extending in the x-direction and the y direction.

By forming the EL layer 23 by the above-described method, the EL layer 23 can be formed without using a fine metal mask. As a result, the productivity of the display device 10 can be increased.

After that, the protective layer 32 is formed (FIG. 26A1 and FIG. 26A2). The protective layer 32 is formed using a deposition method that provides high coverage. For example, the protective layer 32 is formed by an ALD method. Thus, the protective layer 32 is formed such that the opening portion isolating the adjacent light-emitting elements 20 from each other is coated with the protective layer 32. In other words, the protective layer 32 is formed to include regions that are in contact with the side surface of the lower electrode 21, the side surface of the EL layer 23, and the top surface of the insulating layer 61 in the opening portion. As described above, the protective layer 32 can be an insulating layer containing aluminum oxide, for example.

Next, a layer 36A to be the protective layer 36 is deposited (FIG. 26B1 and FIG. 26B2). As described above, the layer 36A is deposited by a method offering lower coverage than the coverage with the protective layer 32. For example, the layer 36A is formed by a sputtering method or a CVD method. The opening portion that isolates the adjacent light-emitting elements from each other is not coated with the layer 36A and thus the gap 30 is formed.

Then, the layer 36A over the protective layer 32 is processed. For example, the layer 36A is etched using the protective layer 32 as an etching stopper. In this manner, the protective layer 36 is formed (FIG. 26C1 and FIG. 26C2).

Figure 27A:
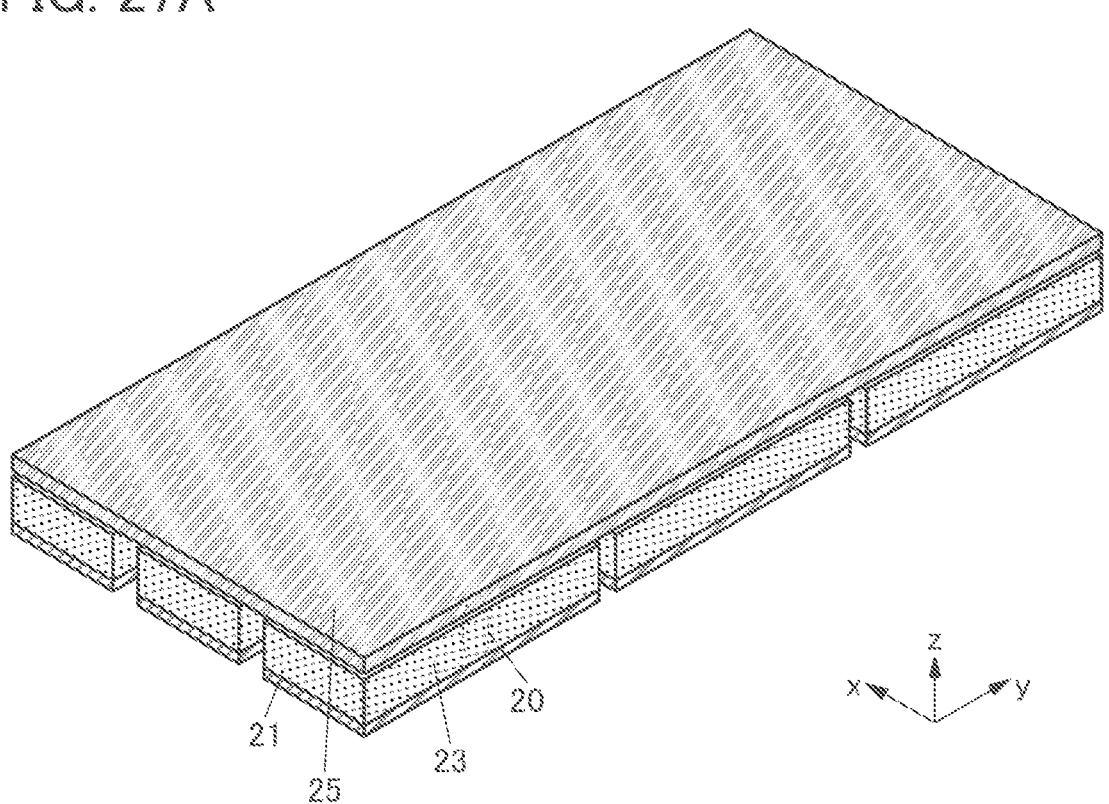
FIG. 27A is a perspective view illustrating an example of a method for manufacturing a display device.
Figure 27B:
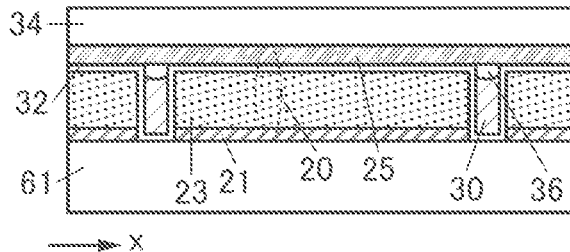
FIG. 27B and FIG. 27C are cross-sectional views illustrating an example of the method for manufacturing the display device.
Figure 27C:
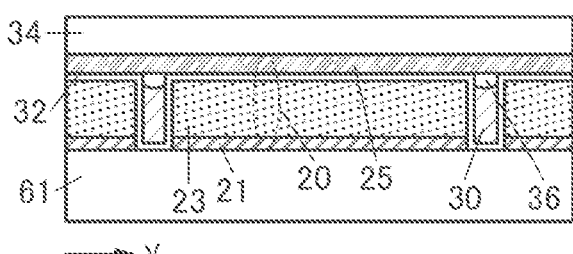

Next, the upper electrode 25 is formed. After that, the protective layer 34 is formed (FIG. 27A to FIG. 27C). The protective layer 34 can be formed by an ALD method or a sputtering method. The protective layer 34 can have a stacked-layer structure including a layer formed by an ALD method and a layer formed by a sputtering method.

Then, the microlens array 35 is formed. Next, the substrate 47 is prepared, the insulating layer 45 is formed over the substrate 47, and the light-blocking layer 43 and the coloring layer 49 are formed over the insulating layer 45. After that, the adhesive layer 41 is formed over the coloring layer 49 and the light-blocking layer 43, and the microlens array 35 is attached to the coloring layer 49 and the light-blocking layer 43 with the adhesive layer 41. Through the above steps, the display device 10 illustrated in FIG. 24A to FIG. 24C can be manufactured.

Structure Example_5 of Display Device

Figure 28:
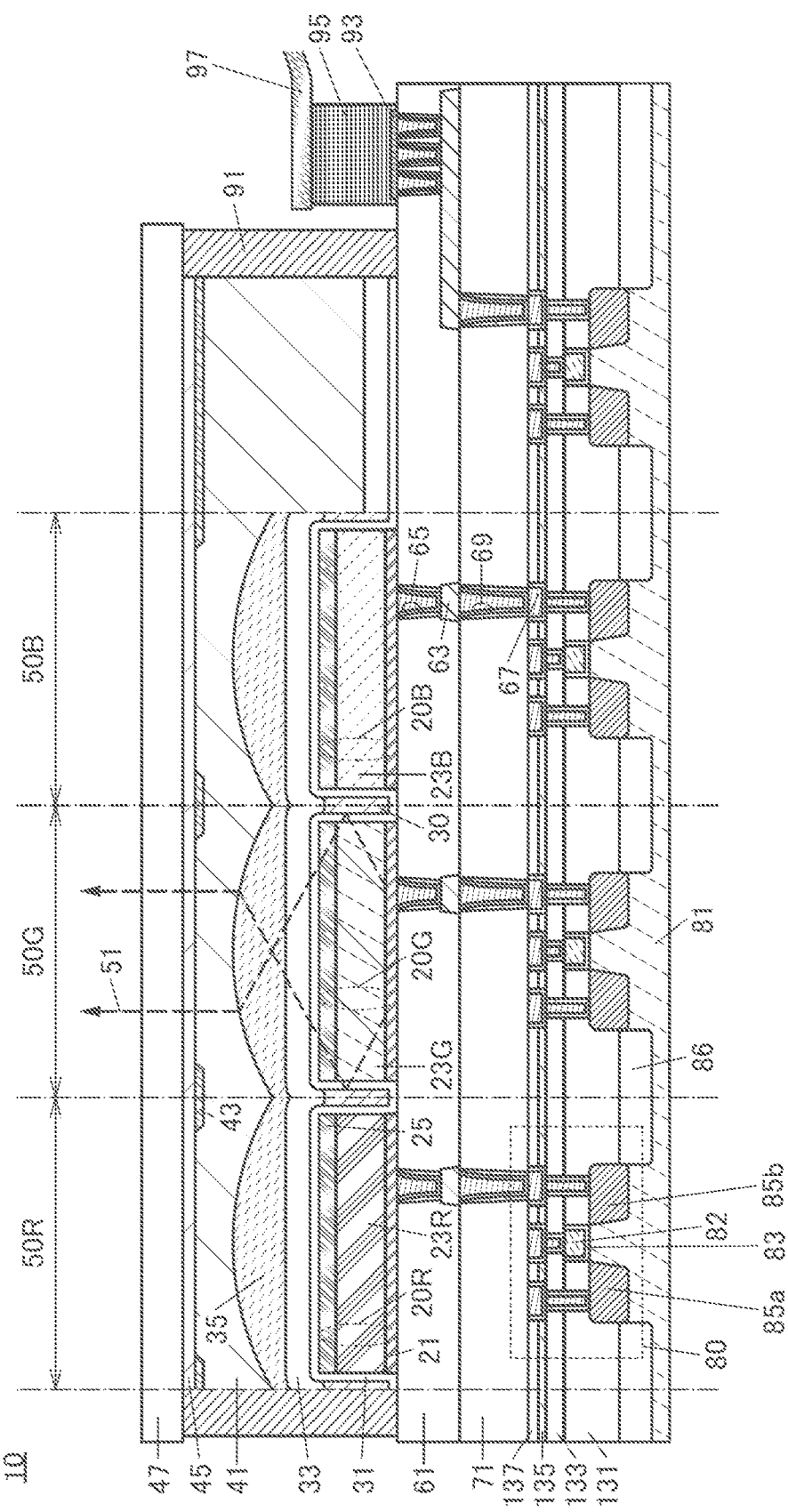
FIG. 28 is a cross-sectional view illustrating a structure example of a display device.

FIG. 28 is a cross-sectional view illustrating a structure example of the display device 10, and illustrates a sealant 91, a connection electrode 93, an anisotropic conductive layer 95, a flexible printed circuit (FPC) 97, and the like in addition to the structure illustrated in FIG. 1.

The substrate 47 and the insulating layer 61 are attached to each other with the sealant 91 as illustrated in FIG. 28. For example, the connection electrode 93 is provided over the insulating layer 61 and the conductive layer 65 so as to be electrically connected to one of the source and the drain of the transistor 80. The anisotropic conductive layer 95 is provided so as to be electrically connected to the connection electrode 93, and the FPC 97 is provided so as to be electrically connected to the anisotropic conductive layer 95. For example, a variety of signals are supplied to the display device 10 from the outside of the display device 10 through the FPC 97. The sealant 91 may be omitted, and the FPC 97 may be wire-bonded.

Figure 29:
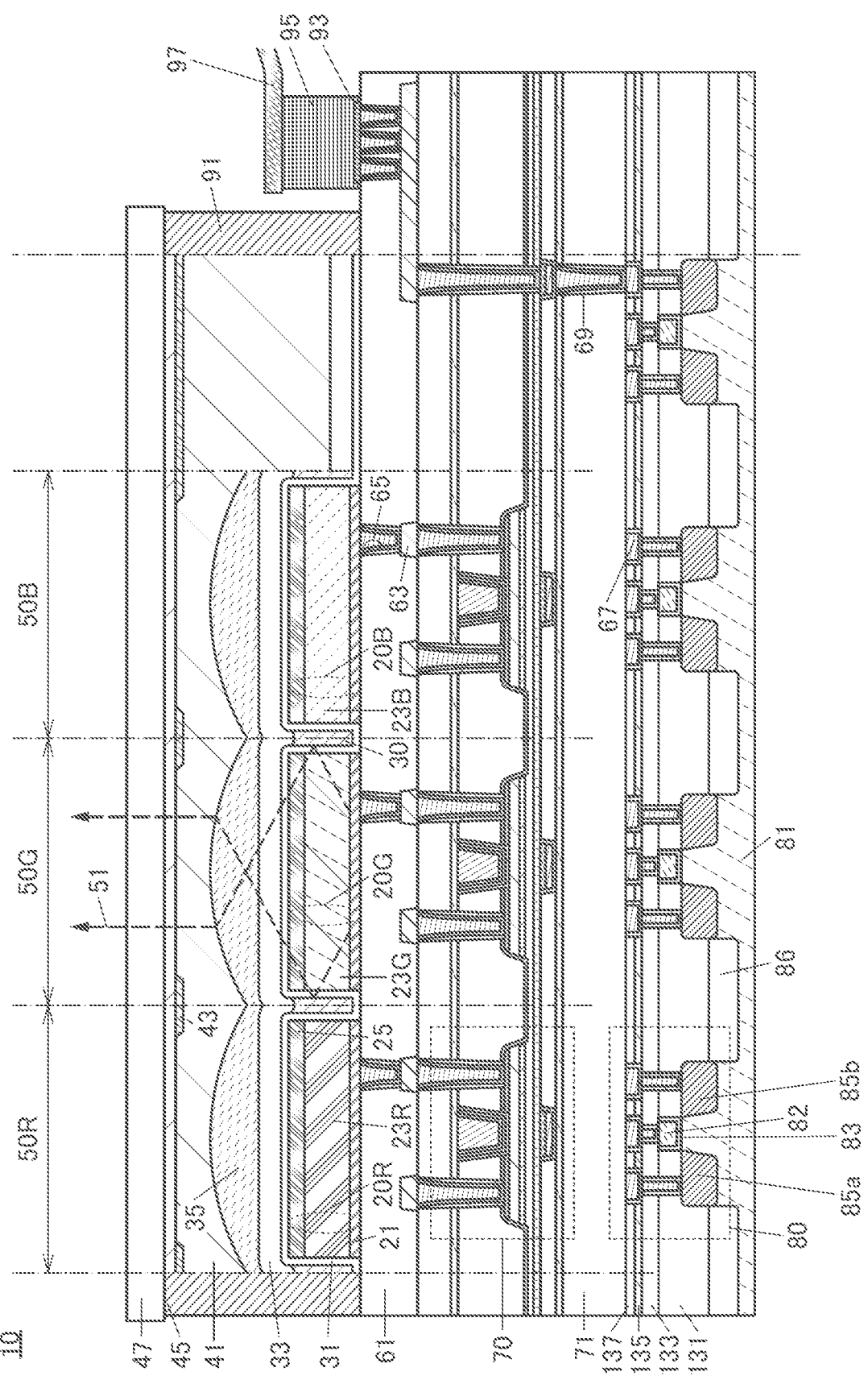
FIG. 29 is a cross-sectional view illustrating a structure example of a display device.

FIG. 29 is a cross-sectional view illustrating a structure example of the display device 10 and is a variation example of the display device 10 illustrated in FIG. 28. The display device 10 illustrated in FIG. 29 is different from the display device 10 illustrated in FIG. 28 in that, for example, the transistor 70 that can be used as an OS transistor is included.

Figure 30A:
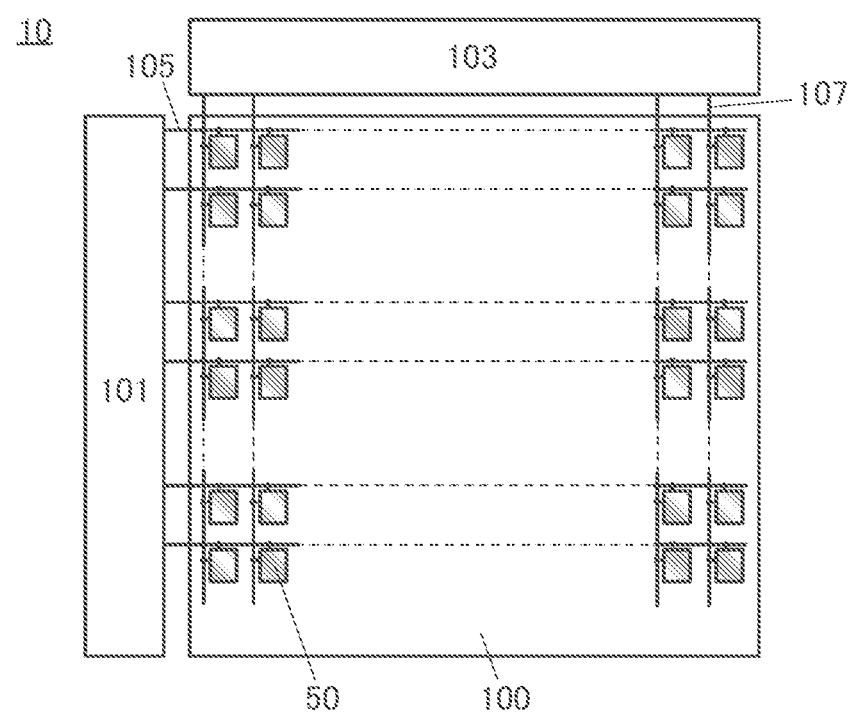
FIG. 30A is a block diagram illustrating a structure example of a display device.

FIG. 30A is a block diagram illustrating a structure example of the display device 10.

The display device 10 includes a display portion 100, a scan line driver circuit 101, and a data line driver circuit 103. Pixels 50 are arranged in a matrix in the display portion 100. The scan line driver circuit 101 and the data line driver circuit 103 can each include the transistor 80.

The scan line driver circuit 101 is electrically connected to the pixels 50 through a wiring 105. The data line driver circuit 103 is electrically connected to the pixels 50 through a wiring 107. The wiring 105 and the wiring 107 can extended in directions perpendicular to each other.

The scan line driver circuit 101 has a function of generating a selection signal for selecting the pixels 50 to which image data is written. The data line driver circuit 103 has a function of generating a signal (data signal) representing image data. The selection signal is supplied to the pixels 50 through the wiring 105, and the data signal is supplied to the pixels 50 through the wiring 107.

Figure 30B:
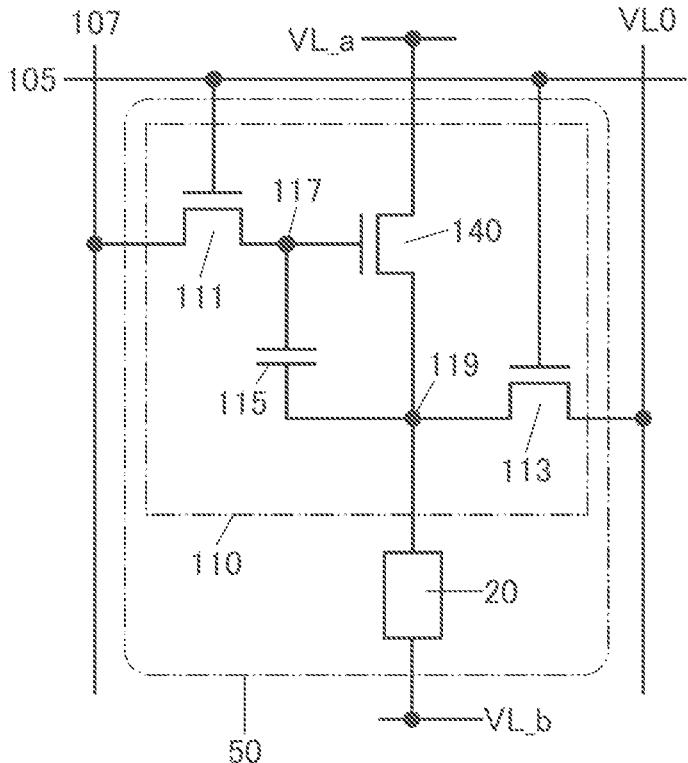
FIG. 30B is a circuit diagram illustrating a structure example of a pixel.

FIG. 30B is a circuit diagram illustrating a configuration example of the pixel 50. The pixel 50 includes the light-emitting element 20 and a pixel circuit 110.

The pixel circuit 110 includes the transistor 111, a transistor 140, a transistor 113, and a capacitor 115. The pixel circuit 110 is electrically connected to one electrode of the light-emitting element 20. Here, the transistor 140 can be the transistor 80 illustrated in FIG. 1 and the like or the transistor 70 illustrated in FIG. 3 and the like.

One of a source and a drain of the transistor 111 is electrically connected to a gate of the transistor 140. The gate of the transistor 140 is electrically connected to one electrode of the capacitor 115. One of a source and a drain of the transistor 140 is electrically connected to one of a source and a drain of the transistor 113. The one of the source and the drain of the transistor 113 is electrically connected to the other electrode of the capacitor 115. The other electrode of the capacitor 115 is electrically connected to one electrode of the light-emitting element 20. Here, a node to which the one of the source and the drain of the transistor 111, the gate of the transistor 140, and the one electrode of the capacitor 115 are electrically connected is referred to as a node 117. A node to which the one of the source and the drain of the transistor 140, the one of the source and the drain of the transistor 113, the other electrode of the capacitor 115, and the one electrode of the light-emitting element 20 are electrically connected is referred to as a node 119.

The other of the source and the drain of the transistor 111 is electrically connected to the wiring 107. A gate of the transistor 111 and a gate of the transistor 113 are electrically connected to the wiring 105. The other of the source and the drain of the transistor 140 is electrically connected to the potential supply line VL_a. The other of the source and the drain of the transistor 113 is electrically connected to the potential supply line VL0. The other electrode of the light-emitting element 20 is electrically connected to the potential supply line VL_b.

The transistor 111 has a function of controlling the writing of image data to the node 117. The capacitor 115 has the function of a storage capacitor for retaining data written to the node 117.

In the display device including the pixel circuit 110, the pixel circuit 110 in each row is sequentially selected to turn on the transistor 111 and the transistor 113 by the scan line driver circuit 101, whereby image data is written to the node 117.

The pixel circuit 110 in which image data has been written to the node 117 has a holding state, when the transistor 111 and the transistor 113 are turned off. In addition, the amount of current flowing between the drain and the source of the transistor 140 is controlled in accordance with the potential of the node 119 so that the light-emitting element 20 emits light with luminance corresponding to the amount of the current. This operation is sequentially performed row by row; thus, an image can be displayed on the display portion 100.

Structure Example of Transistor

FIG. 31A, FIG. 31B, and FIG. 31C are a top view and cross-sectional views of the transistor 70 and the peripheral portion of the transistor 70.

FIG. 31A is a top view of the transistor 70. FIG. 31B and FIG. 31C are cross-sectional views of the transistor 70.

Here, FIG. 31B is a cross-sectional view of a portion indicated by dashed-dotted line X1-X2 in FIG. 31A and is also a cross-sectional view of the transistor 70 in the channel length direction. FIG. 31C is a cross-sectional view of a portion indicated by a dashed-dotted line Y1-Y2 in FIG. 31A, and is also a cross-sectional view in the channel width direction of the transistor 70. Note that some components are omitted in the top view of FIG. 31A for clarity of the drawing.

As illustrated in FIG. 31B, FIG. 31B, and FIG. 31C, the transistor 70 includes a metal oxide 230a placed over a substrate (not illustrated); a metal oxide 230b placed over the metal oxide 230a; a conductor 242a and a conductor 242b that are placed apart from each other over the metal oxide 230b; the insulator 280 that is placed over the conductor 242a and the conductor 242b and has an opening between the conductor 242a and the conductor 242b; a conductor 260 placed in the opening; an insulator 250 placed between the conductor 260 and the metal oxide 230b, the conductor 242a, the conductor 242b, and the insulator 280; and a metal oxide 230c placed between the insulator 250 and the metal oxide 230b, the conductor 242a, the conductor 242b, and the insulator 280. Here, as illustrated in FIG. 31B and FIG. 31C, preferably, the top surface of the conductor 260 is substantially aligned with the top surfaces of the insulator 250, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 70, an angle formed between the side surfaces and bottom surfaces of the conductor 242a and the conductor 242b can be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 31B and FIG. 31C, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 31B and FIG. 31C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 70, three layers of the metal oxide 230a, the metal oxide 230b, and the metal oxide 230c are stacked in and around the region where the channel is formed (hereinafter also referred to as channel formation region); however, the present invention is not limited thereto. For example, a two-layer structure of the metal oxide 230b and the metal oxide 230c or a stacked-layer structure of four or more layers may be employed. Although the transistor 70 has a structure in which the conductor 260 has a stacked-layer structure of two layers, the present invention is not limited thereto. For example, the conductor 260 may have a single-layer structure or a stacked-layer structure of three or more layers. Furthermore, each of the metal oxide 230a, the metal oxide 230b, and the metal oxide 230c may have a stacked-layer structure of two or more layers.

For example, in the case where the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b each function as a source electrode or a drain electrode. As described above, the conductor 260 is formed to be embedded in the opening of the insulator 280 and the region interposed between the conductor 242a and the conductor 242b. Here, the positions of the conductor 260, the conductor 242a, and the conductor 242b are selected in a self-aligned manner with respect to the opening of the insulator 280. That is, in the transistor 70, the gate electrode can be positioned between the source electrode and the drain electrode in a self-aligned manner. Thus, the conductor 260 can be formed without an alignment margin, resulting in a reduction in the area occupied by the transistor 70. Accordingly, the display device can have higher resolution. In addition, the display device can have a narrow bezel.

As illustrated in FIG. 31B, the conductor 260 preferably includes a conductor 260a provided on the inner side of the insulator 250 and a conductor 260b provided to be embedded on the inner side of the conductor 260a.

The transistor 70 preferably includes an insulator 214 provided over the substrate (not illustrated); an insulator 216 provided over the insulator 214; a conductor 205 provided to be embedded in the insulator 216; an insulator 222 provided over the insulator 216 and the conductor 205; and the insulator 224 provided over the insulator 222. The metal oxide 230a is preferably placed over the insulator 224.

The insulator 274 and the insulator 281 functioning as interlayer films are preferably placed over the transistor 70. Here, the insulator 274 is preferably provided in contact with the top surfaces of the conductor 260, the insulator 250, the metal oxide 230c, and the insulator 280.

The insulator 222, the insulator 254, and the insulator 274 preferably have a function of inhibiting diffusion of hydrogen (e.g., at least one of a hydrogen atom, a hydrogen molecule, and the like). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of an oxygen atom, an oxygen molecule, and the like). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen contained in the insulator 280 and the insulator 281 into the insulator 224, the metal oxide 230, and the insulator 250 or excess oxygen into the insulator 224, the metal oxide 230a, the metal oxide 230b, and the insulator 250.

A conductor 240 (a conductor 240a and a conductor 240b) that is electrically connected to the transistor 70 and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. In addition, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 70 has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 70, a metal oxide functioning as an oxide semiconductor (hereinafter also referred to as an oxide semiconductor) is preferably used as the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, the element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 31B, the metal oxide 230b in a region that does not overlap with the conductor 242 sometimes have smaller thickness than the metal oxide 230b in a region that overlaps with the conductor 242. The thin region is formed when part of the top surface of the metal oxide 230b is removed at the time of forming the conductor 242a and the conductor 242b. When a conductive film to be the conductor 242 is deposited, a low-resistance region is sometimes formed on the top surface of the metal oxide 230b in the vicinity of the interface with the conductive film. Removing the low-resistance region positioned between the conductor 242a and the conductor 242b on the top surface of the metal oxide 230b in the above manner can prevent formation of the channel in the region.

According to one embodiment of the present invention, a display device that includes small-size transistors and has high resolution can be provided. A display device that includes a transistor with a high on-state current and has high luminance can be provided. A display device that includes a transistor operating at high speed and thus operates at high speed can be provided. A display device that includes a transistor having stable electrical characteristics and is highly reliable can be provided. A display device that includes a transistor with a low off-state current and has low power consumption can be provided.

The structure of the transistor 70 that can be used in the display device according to one embodiment of the present invention is described in detail.

The conductor 205 is placed to include a region overlapping with the metal oxide 230 and the conductor 260. Furthermore, the conductor 205 is preferably provided to be embedded in the insulator 216.

The conductor 205 includes the conductor 205a, the conductor 205b, and the conductor 205c. The conductor 205a is provided in contact with the bottom surface and a side wall of the opening provided in the insulator 216. The conductor 205b is provided to be embedded in a depressed portion formed in the conductor 205a. Here, the top surface of the conductor 205b is lower in level than the top surface of the conductor 205a and the top surface of the insulator 216. The conductor 205c is provided in contact with the top surface of the conductor 205b and the side surface of the conductor 205a. Here, the top surface of the conductor 205c is substantially level with the top-surface level of the conductor 205a and the top surface of the insulator 216. That is, the conductor 205b is surrounded by the conductor 205a and the conductor 205c.

Here, for the conductor 205a and the conductor 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a and the conductor 205c are formed using a conductive material having a function of inhibiting diffusion of hydrogen, impurities such as hydrogen contained in the conductor 205b can be inhibited from diffusing into the metal oxide 230 through the insulator 224 and the like. When the conductor 205a and the conductor 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a is a single layer or a stacked layer of the above conductive materials. For example, titanium nitride may be used for the conductor 205a.

A conductive material containing tungsten, copper, or aluminum as its main component is preferably used for the conductor 205b. For example, tungsten is used for the conductor 205b.

The conductor 260 sometimes functions as a first gate (also referred to as top gate) electrode. The conductor 205 sometimes functions as a second gate (also referred to as bottom gate) electrode. In that case, the threshold voltage of the transistor 70 can be controlled by changing a potential applied to the conductor 205 independently of a potential applied to the conductor 260. In particular, by applying a negative potential to the conductor 205, the threshold voltage of the transistor 70 can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 31C. In other words, the conductor 205 and the conductor 260 preferably overlap each other with the insulator placed therebetween, in a region outside the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

Furthermore, as illustrated in FIG. 31C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water or hydrogen to the transistor 70 from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, $NO_2$, or the like), or a copper atom (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

For example, aluminum oxide, silicon nitride, or the like is preferably used for the insulator 214. Accordingly, it is possible to inhibit diffusion of impurities such as water or hydrogen to the transistor 70 side from the substrate side through the insulator 214. It is also possible to inhibit diffusion of oxygen contained in the insulator 224 and the like toward the substrate through the insulator 214.

The permittivity of each of the insulator 216, the insulator 280, and the insulator 281 functioning as an interlayer film is preferably lower than that of the insulator 214. When a material with a low permittivity is used for the interlayer film, parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 70.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 31C, the insulator 224 is sometimes thinner in a region that overlaps with neither the insulator 254 nor the metal oxide 230b than in the other regions. In the insulator 224, the region that overlaps with neither the insulator 254 nor the metal oxide 230*b* preferably has a thickness with which the above oxygen can adequately diffuse.

Like the insulator 214 and the like, the insulator 222 preferably functions as a barrier insulating film that inhibits the entry of impurities such as water or hydrogen into the transistor 70 from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 70 from outside can be inhibited.

Furthermore, the insulator 222 preferably has a function of inhibiting diffusion of oxygen (e.g., at least one of an oxygen atom, an oxygen molecule, and the like) (it is preferable that oxygen be less likely to pass through the insulator 222). For example, the insulator 222 preferably has a lower oxygen permeability than the insulator 224. The insulator 222 preferably has a function of inhibiting diffusion of oxygen or impurities, in which case oxygen contained in the metal oxide 230 is less likely to diffuse to the substrate side. The insulator 222 can also inhibit the conductor 205 from reacting with oxygen contained in the insulator 224 or oxygen contained in the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. The insulator 222 formed using such a material functions as a layer inhibiting oxygen release from the metal oxide 230 and entry of impurities such as hydrogen into the metal oxide 230 from the periphery of the transistor 70.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

The insulator 222 may have a single-layer structure or a stacked-layer structure using an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness of the gate insulator is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230*a*, the metal oxide 230*b* over the metal oxide 230*a*, and the metal oxide 230*c* over the metal oxide 230*b*. When the metal oxide 230 includes the metal oxide 230*a* under the metal oxide 230*b*, it is possible to inhibit diffusion of impurities into the metal oxide 230*b* from the components formed below the metal oxide 230*a*. Moreover, when the metal oxide 230 includes the metal oxide 230*c* over the metal oxide 230*b*, it is possible to inhibit diffusion of impurities into the metal oxide 230*b* from the components formed above the metal oxide 230*c*.

Note that the metal oxide 230 preferably has a stacked-layer structure of a plurality of oxide layers that differ in the atomic ratio of metal atoms. For example, in the case where the metal oxide 230 contains at least indium (In) and the element M, the proportion of the number of atoms of the element M contained in the metal oxide 230*a* to the number of atoms of all elements that constitute the metal oxide 230*a* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*a* is preferably higher than the atomic ratio of the element M to In in the metal oxide 230*b*. Here, a metal oxide that can be used as the metal oxide 230*a* or the metal oxide 230*b* can be used as the metal oxide 230*c*.

The energy of the conduction band minimum of each of the metal oxide 230*a* and the metal oxide 230*c* is preferably higher than the energy of the conduction band minimum of the metal oxide 230*b*. In other words, the electron affinity of each of the metal oxide 230*a* and the metal oxide 230*c* is preferably smaller than the electron affinity of the metal oxide 230*b*. In this case, a metal oxide that can be used as the metal oxide 230*a* is preferably used as the metal oxide 230*c*. Specifically, the proportion of the number of atoms of the element M contained in the metal oxide 230*c* to the number of atoms of all elements that constitute the metal oxide 230*c* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*c* is preferably higher than the atomic ratio of the element M to In in the metal oxide 230*b*.

Here, the energy level of the conduction band minimum gently changes at junction portions between the metal oxide 230*a*, the metal oxide 230*b*, and the metal oxide 230*c*. In other words, the energy levels of the conduction band minimum at junction portions between the metal oxide 230*a*, the metal oxide 230*b*, and the metal oxide 230*c* continuously vary or are continuously connected. This can be achieved by decreasing the density of defect states in a mixed layer formed at the interface between the metal oxide 230*a* and the metal oxide 230*b* and the interface between the metal oxide 230*b* and the metal oxide 230*c*.

Specifically, when the metal oxide 230*a* and the metal oxide 230*b* or the metal oxide 230*b* and the metal oxide 230*c* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 230*a* and the metal oxide 230*c*, in the case where the metal oxide 230*b* is an In—Ga—Zn oxide. The metal oxide 230*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230*c* may have a stacked-layer structure of an In—Ga—Zn oxide and an oxide that does not contain In.

Specifically, as the metal oxide 230*a*, a metal oxide with In: Ga:Zn=1:3:4 [atomic ratio] or 1:1:0.5 [atomic ratio], or a composition in the vicinity thereof may be used. Moreover, as the metal oxide 230b, a metal oxide with In:Ga:Zn=4:2:3 [atomic ratio] or 3:1:2 [atomic ratio] or a composition in the vicinity thereof may be used. As the metal oxide 230c, a metal oxide with an atomic ratio of In: Ga:Zn=1:3:4 [atomic ratio], In: Ga:Zn=4:2:3 [atomic ratio], Ga:Zn=2:1 [atomic ratio], or Ga:Zn=2:5 [atomic ratio] or a composition in the vicinity thereof may be used.

Specific examples of a stacked-layer structure of the metal oxide 230c include a stacked-layer structure of a layer with In: Ga:Zn=4:2:3 [atomic ratio] or a composition in the vicinity thereof and a layer with Ga:Zn=2:1 [atomic ratio] or a composition in the vicinity thereof, a stacked-layer structure of a layer with In: Ga:Zn=4:2:3 [atomic ratio] or a composition in the vicinity thereof and a layer with Ga:Zn=2:5 [atomic ratio] or a composition in the vicinity thereof, and a stacked-layer structure of a layer with In: Ga:Zn=4:2:3 [atomic ratio] or a composition in the vicinity thereof and a layer of gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 70 can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element contained in the metal oxide 230c to the insulator 250 side can be expected. Specifically, the metal oxide 230c has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 230c having a stacked-layer structure allows a highly reliable display device to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, or an oxide containing lanthanum and nickel. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be formed in a self-aligned manner between the conductor 242a and the conductor 242b.

The insulator 250 functions as a gate insulator. The insulator 250 is preferably placed in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds of hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 has a two-layer structure in FIG. 31B and FIG. 31C, a single-layer structure or a stacked-layer structure of three or more layers may be employed.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, $NO_2$, or the like), or a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, it is possible to inhibit reduction of the conductivity due to oxidation of the conductor 260b by oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 31C, the side surface of the metal oxide 230 is covered with the conductor 260 in a region where the metal oxide 230b does not overlap with the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 70 can be increased and the frequency characteristics of the transistor 70 can be improved.

The insulator 254, like the insulator 214 and the like, preferably functions as a barrier insulating film that inhibits the entry of impurities such as water or hydrogen into the transistor 70 from the insulator 280 side. The insulator 254 preferably has lower hydrogen permeability than the insulator 224, for example. Furthermore, as illustrated in FIG. 31B and FIG. 31C, the insulator 254 is preferably in contact with the side surface of the metal oxide 230c, the top and side surfaces of the conductor 242a, the top and side surfaces of the conductor 242b, side surfaces of the metal oxide 230a and the metal oxide 230b, and the top surface of the insulator 224. Such a structure can inhibit the entry of hydrogen contained in the insulator 280 into the metal oxide 230 through the top surfaces or side surfaces of the conductor 242a, the conductor 242b, the metal oxide 230a, the metal oxide 230b, and the insulator 224.

Furthermore, the insulator 254 preferably has a function of inhibiting diffusion of oxygen (e.g., at least one of an oxygen atom, an oxygen molecule, and the like) (it is preferable that oxygen be less likely to pass through the insulator 254). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward diffusion of oxygen, oxygen can be prevented from diffusing from the metal oxide 230 into the insulator 280. Moreover, with the insulator 222 having a function of inhibiting downward diffusion of oxygen, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be inhibited from having normally-on characteristics.

As the insulator 254, an insulator containing an oxide of one or both of aluminum and hafnium is preferably deposited, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224 and the metal oxide 230 are covered with the insulator 254 having a barrier property against hydrogen, whereby the insulator 280 is isolated from the insulator 224, the metal oxide 230 by the insulator 254. This can inhibit entry of impurities such as hydrogen from the outside of the transistor 70, resulting in favorable electrical characteristics and high reliability of the transistor 70.

The insulator 280 is provided over the insulator 224 and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, or the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 240a and the conductor 240b are placed in openings formed in the insulator 281, the insulator 274, the insulator 280, and the insulator 254. The conductor 240a and the conductor 240b are placed to face each other with the conductor 260 therebetween. Note that the top surfaces of the conductor 240a and the conductor 240b may be on the same plane as the top surface of the insulator 281.

The insulator 241a is provided in contact with the inner walls of the openings in the insulator 281, the insulator 274, the insulator 280, and the insulator 254, and the first conductor of the conductor 240a is formed in contact with the side surface of the insulator 241a. The conductor 242a is positioned in at least part of the bottom portion of the opening, and the conductor 240a is in contact with the conductor 242a. Similarly, the insulator 241b is provided in contact with the inner walls of the openings in the insulator 281, the insulator 274, the insulator 280, and the insulator 254, and the first conductor of the conductor 240b is formed in contact with the side surface of the insulator 241b. The conductor 242b is positioned in at least part of the bottom portion of the opening, and the conductor 240b is in contact with the conductor 242b.

The conductor 240a and the conductor 240b are preferably formed using a conductive material containing tungsten, copper, or aluminum as the main component. The conductor 240a and the conductor 240b may have a stacked-layer structure.

In the case where the conductor 240 has a stacked-layer structure, the aforementioned conductor having a function of inhibiting diffusion of impurities such as water or hydrogen is preferably used as the conductor in contact with the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 280 from being absorbed by the conductor 240*a* and the conductor 240*b*. Moreover, impurities such as water or hydrogen can be inhibited from entering the metal oxide 230 through the conductor 240*a* and the conductor 240*b* from a layer above the insulator 281.

As the insulator 241*a* and the insulator 241*b*, for example, the insulator that can be used as the insulator 254 or the like can be used. Since the insulator 241*a* and the insulator 241*b* are provided in contact with the insulator 280, impurities such as water or hydrogen can be inhibited from entering the metal oxide 230 from the insulator 280 or the like through the conductor 240*a* and the conductor 240*b*. Furthermore, oxygen contained in the insulator 280 can be inhibited from being absorbed by the conductor 240*a* and the conductor 240*b*.

Although not illustrated, a conductor functioning as a wiring may be placed in contact with the top surface of the conductor 240*a* and the top surface of the conductor 240*b*. For the conductor functioning as a wiring, a conductive material containing tungsten, copper, or aluminum as its main component is preferably used. Furthermore, the conductor may have a stacked-layer structure and may be stacked layers of the above conductive material and titanium or titanium nitride, for example. Note that the conductor may be formed to be embedded in an opening provided in an insulator.

Structure Example of Light-Emitting Element

The EL layer 23 included in the light-emitting element 20 can be formed of a plurality of layers such as a layer 4420, a light-emitting layer 4411, and a layer 4430, as illustrated in FIG. 32A. The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes, can serve as a single light-emitting unit, and the structure in FIG. 32A is referred to as a single structure in this specification.

Note that the structure in which a plurality of light-emitting layers (the light-emitting layer 4411, a light-emitting layer 4412, and a light-emitting layer 4413) are provided between the layer 4420 and the layer 4430 as illustrated in FIG. 32B is another variation of the single structure.

The structure in which a plurality of light-emitting units (the EL layer 23*a* and the EL layer 23*b*) is connected in series with an intermediate layer (charge-generation layer) 4440 therebetween as illustrated in FIG. 32C is referred to as a tandem structure in this specification and the like. In this specification and the like, the structure illustrated in FIG. 32C is referred to as a tandem structure; however, without being limited to this, a tandem structure may be referred to as a stack structure, for example. The tandem structure enables a light-emitting element capable of high luminance light emission.

When the above-described white-light-emitting element (the single structure or the tandem structure) and a light-emitting element having the above-described SBS structure are compared, the light-emitting element having the SBS structure consumes lower power than the white-light-emitting element. To reduce power consumption, the light-emitting element having the SBS structure is preferably used. In contrast, the white light-emitting device is preferable in that the manufacturing cost is low or the manufacturing yield is high because a process for manufacturing the white light-emitting device is easier than that for the light-emitting device having an SBS structure.

The emission color of the light-emitting element 20 can be red, green, blue, cyan, magenta, yellow, white, or the like depending on the material that constitutes the EL layer 23. Furthermore, the color purity can be further increased when the light-emitting element 20 has a microcavity structure.

The light-emitting element that emits white light preferably contains two or more kinds of light-emitting substances in the light-emitting layer. To obtain white light emission, two or more kinds of light-emitting substances can be selected such that their emission colors are complementary.

The light-emitting layer preferably contains two or more kinds of light-emitting substances that emit light of R (red), G (green), B (blue), Y (yellow), O (orange), or the like.

At least part of this embodiment can be implemented in combination with any of the other embodiments or examples described in this specification as appropriate.

Embodiment 2

Described in this embodiment is a metal oxide that can be used in the OS transistor described in the above embodiment.

<Classification of Crystal Structures>

First, the classification of the crystal structures of an oxide semiconductor is described with reference to FIG. 33A. FIG. 33A is a diagram showing the classification of the crystal structures of an oxide semiconductor, typically IGZO (a metal oxide containing In, Ga, and Zn).

As shown in FIG. 33A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous (excluding single crystal and poly crystal). The term "Crystal" includes single crystal and poly crystal.

Note that the structures in the thick frame shown in FIG. 33A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 33B shows an XRD spectrum, which is obtained by GIXD (Grazing-Incidence XRD) measurement, of a CAAC-IGZO film classified into "Crystalline". Note that a GIXD method is also referred to as a thin film method or a Seemann—Bohlin method. The XRD spectrum that is shown in FIG. 33B and obtained by GIXD measurement is hereinafter simply referred to as an XRD spectrum. The CAAC-IGZO film in FIG. 33B has a composition of In: Ga:Zn=4:2:3 [atomic ratio] or the vicinity thereof. The CAAC-IGZO film in FIG. 33B has a thickness of 500 nm.

In FIG. 33B, the horizontal axis represents 2θ [deg.], and the vertical axis represents intensity [a.u.]. As shown in FIG. 33B, a clear peak indicating crystallinity is observed in the XRD spectrum of the CAAC-IGZO film. Specifically, a peak indicating c-axis alignment is observed at 2θ of at or around 31° in the XRD spectrum of the CAAC-IGZO film. As shown in FIG. 33B, the peak at 2θ of at or around 31° is asymmetric with the angle at which the peak intensity is observed as the axis. A crystal structure of a film or a substrate can also be evaluated with a diffraction pattern obtained by a nanobeam electron diffraction (NBED) method (such a pattern is also referred to as a nanobeam electron diffraction pattern). FIG. 33C shows a diffraction pattern of the CAAC-IGZO film. FIG. 33C shows a diffraction pattern obtained by the NBED method in which an electron beam is incident in the direction parallel to the substrate. The CAAC-IGZO film in FIG. 33C has a composition of In: Ga:Zn=4:2:3 [atomic ratio] or the vicinity thereof. In the nanobeam electron diffraction method, electron diffraction is performed with a probe diameter of 1 nm.

As shown in FIG. 33C, a plurality of spots indicating c-axis alignment are observed in the diffraction pattern of the CAAC-IGZO film.

[Structure of Oxide Semiconductor]

Oxide semiconductors may be classified in a manner different from the one in FIG. 33A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current or field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities or defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Composition of Oxide Semiconductor]

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal elements are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in an adjacent film is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by Secondary Ion Mass Spectrometry (SIMS) are each set lower than or equal to $2\times10^{18}$ atoms/cm³, preferably lower than or equal to $2\times10^{17}$ atoms/cm³.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is set lower than or equal to $1\times10^{18}$ atoms/cm³, preferably lower than or equal to $2\times10^{16}$ atoms/cm³.

An oxide semiconductor containing nitrogen easily becomes n-type by generation of electrons serving as carriers and an increase in carrier concentration. A transistor including, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is set lower than $5\times10^{19}$ atoms/cm³, preferably lower than or equal to $5\times10^{18}$ atoms/cm³, further preferably lower than or equal to $1\times10^{18}$ atoms/cm³, still further preferably lower than or equal to $5\times10^{17}$ atoms/cm³.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm³, preferably lower than $1\times10^{19}$ atoms/cm³, further preferably lower than $5\times10^{18}$ atoms/cm³, still further preferably lower than $1\times10^{18}$ atoms/cm³.

When an oxide semiconductor with sufficiently reduced impurities is used for a channel formation region in a transistor, stable electrical characteristics can be given.

At least part of this embodiment can be implemented in combination with any of the other embodiments or examples described in this specification as appropriate.

Embodiment 3

In this embodiment, electronic devices each including a display device of one embodiment of the present invention are described.

Figures 34A, 34B, 34C, 34D:
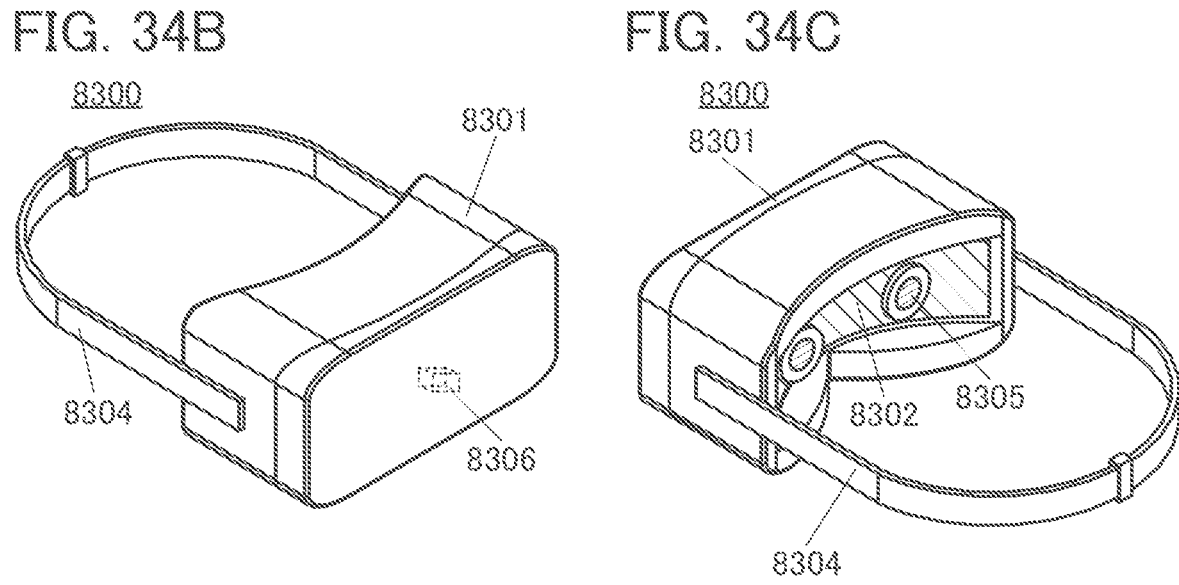
FIG. 34A to FIG. 34D are diagrams illustrating examples of electronic devices.

FIG. 34A is a diagram illustrating the appearance of a head-mounted display 8200.

The head-mounted display 8200 includes a mount part 8201, a lens 8202, a main body 8203, a display portion 8204, a cable 8205, and the like. A battery 8206 is incorporated in the mount part 8201.

The cable 8205 supplies electric power from the battery 8206 to the main body 8203. The main body 8203 includes a wireless receiver, for example, and can display an image corresponding to the received image data on the display portion 8204, for example. The movement of the eyeball or the eyelid of the user is captured by a camera provided in the main body 8203 and then coordinates of the sight line of the user are calculated using the information to utilize the sight line of the user as an input means.

A plurality of electrodes may be provided in the mount part 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The mount part 8201 may include various kinds of sensors such as a temperature sensor, a pressure sensor, or an acceleration sensor to have a function of displaying the user's biological information on the display portion 8204. The main body 8203 may, for example, sense the movement of the user's head to change an image displayed on the display portion 8204 in synchronization with the movement.

The display device of one embodiment of the present invention can be used for the display portion 8204. Thus, a high-quality image can be displayed on the display portion 8204.

FIG. 34B, FIG. 34C, and FIG. 34D are diagrams illustrating the appearance of a head-mounted display 8300. The head-mounted display 8300 includes a housing 8301, a display portion 8302, a band-shaped fixing unit 8304, and a pair of lenses 8305. A battery 8306 is incorporated in the housing 8301, and electric power can be supplied from battery 8306 to the display portion 8302, for example.

The user can see display on the display portion 8302 through the lenses 8305. It is preferable that the display portion 8302 be curved and placed. When the display portion 8302 is curved and placed, the user can feel a high realistic sensation. Note that although the structure in which one display portion 8302 is provided is described as an example in this embodiment, the structure is not limited thereto, and a structure in which two display portions 8302 are provided may also be employed. In that case, one display portion is placed for one eye of the user and the other display portion is placed for the other eye, so that three-dimensional display using parallax is possible, for example.

Note that the display device of one embodiment of the present invention can be used for the display portion 8302. Thus, a high-quality image can be displayed on the display portion 8302.

Figure 35A:
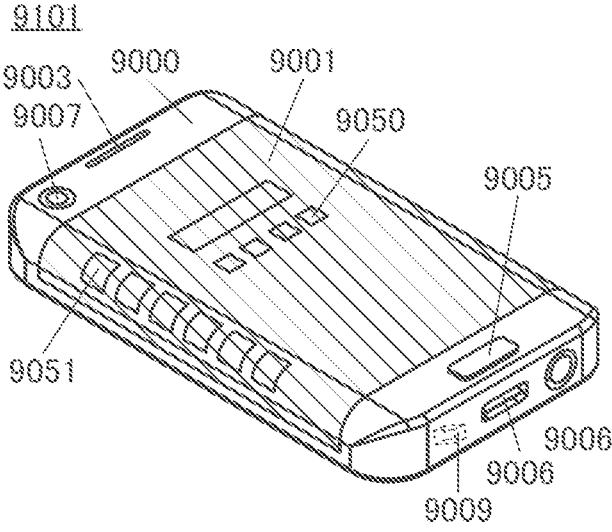
FIG. 35A and FIG. 35B are diagrams illustrating examples of electronic devices.
Figure 35B:
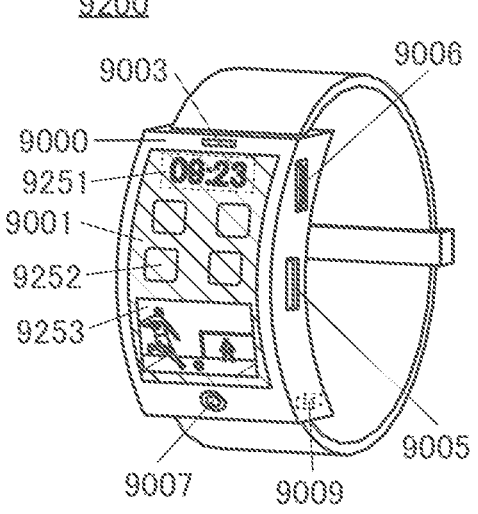

Next, FIG. 35A and FIG. 35B illustrate examples of electronic devices that are different from the electronic devices illustrated in FIG. 34A to FIG. 34D.

Electronic devices illustrated in FIG. 35A and FIG. 35B include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a battery 9009, and the like.

The electronic devices illustrated in FIG. 35A and FIG. 35B have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 35A and FIG. 35B are not limited thereto, and the electronic devices can have a variety of functions. Although not illustrated in FIG. 35A or FIG. 35B, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, and the like.

The details of the electronic devices illustrated in FIG. 35A and FIG. 35B are described below.

FIG. 35A is a perspective view illustrating a portable information terminal 9101. The portable information terminal 9101 has one or more functions selected from a telephone set, a notebook, an information browsing device, and the like, for example. Specifically, the portable information terminal 9101 can be used as a smartphone. The portable information terminal 9101 can display characters or an image on its plurality of surfaces. For example, an operation button 9050 (also referred to as an operation icon, or simply an icon) can be displayed on one surface of the display portion 9001. Information 9051 represented by a dotted line rectangle can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna.

Alternatively, the operation buttons 9050 or the like may be displayed on the position where the information 9051 is displayed, in place of the information 9051.

The display device of one embodiment of the present invention can be used for the portable information terminal 9101. Thus, a high-quality image can be displayed on the display portion 9001.

FIG. 35B is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved, and display is performed on the curved display surface. FIG. 35B illustrates an example in which time 9251, operation buttons 9252 (also referred to as operation icons or simply icons), and a content 9253 are displayed on the display portion 9001. The content 9253 can be a moving image, for example.

The portable information terminal 9200 can perform near field communication conformable to a communication standard. For example, mutual communication between the portable information terminal 9200 and a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used for the portable information terminal 9200. Thus, a high-quality image can be displayed on the display portion 9001.

At least part of this embodiment can be implemented in combination with any of the other embodiments or examples described in this specification as appropriate.

Example 1

In this example, a sample was fabricated and an image was captured with a scanning transmission electron microscope (STEM). The result is described.

Figure 36A:
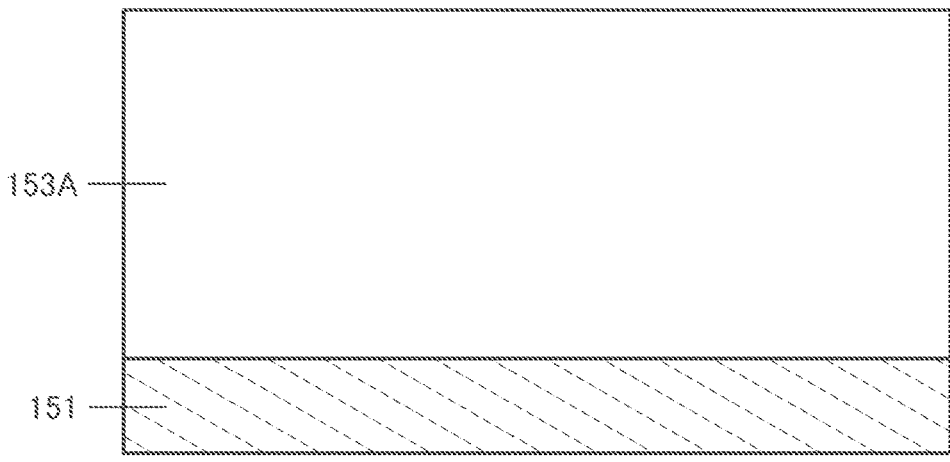
FIG. 36A to FIG. 36C are diagrams illustrating a method for manufacturing a sample in Example.
Figure 36B:
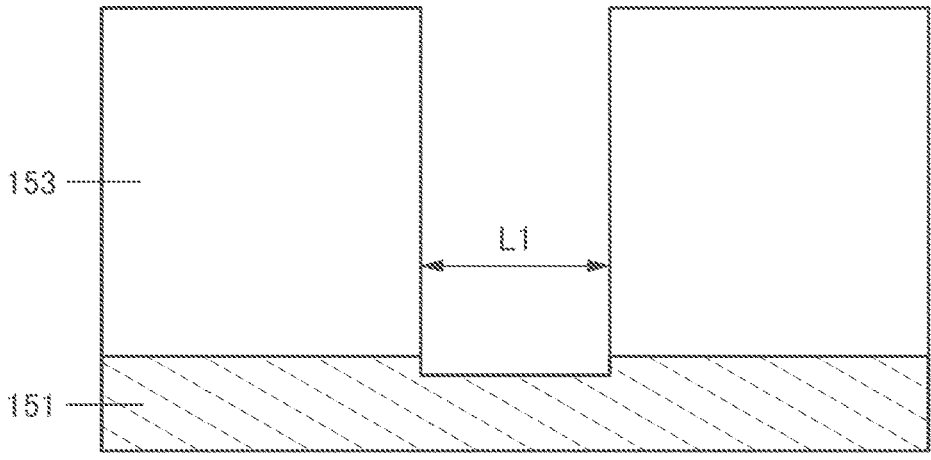
Figure 36C:
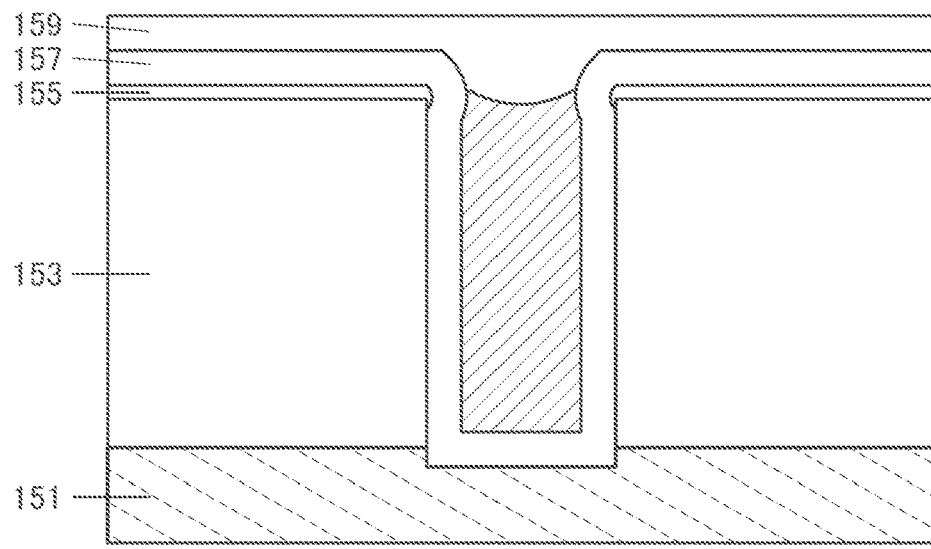

FIG. 36A to FIG. 36C illustrate a method for fabricating the sample of this example. In this example, a 500-nm-thick silicon oxynitride layer was deposited over a substrate 151, which was a semiconductor substrate using silicon as a material (a silicon substrate), by a PECVD method (FIG. 36A). The silicon oxynitride layer is referred to as a layer 153A.

Next, the layer 153A was processed by an etching method to form an opening portion with a length L1 of 90 nm in the cross-sectional direction, thereby forming the insulating layer 153 (FIG. 36B).

After that, a 20-nm-thick silicon nitride layer was deposited at room temperature by a sputtering method. The silicon nitride layer is referred to as an insulating layer 155. Next, a 50-nm-thick aluminum oxide layer was deposited method at 100° C. by an ALD. The aluminum oxide layer is referred to as a protective layer 157. After that, a 50-nm-thick silicon nitride layer was deposited at room temperature by a sputtering method. The silicon nitride layer is referred to as the protective layer 159 (FIG. 36C). By the above method, the sample was fabricated.

FIG. 37A is a scanning transmission electron microscopy (STEM) image of the fabricated sample. As shown in FIG. 37A, it is confirmed that a gap 160 surrounded by the protective layer 157 was formed in the sample in this example.

FIG. 37B1 is an enlarged view of a region 161 shown in FIG. 37A. The thickness L2 of the insulating layer 155, the thickness L3 of the protective layer 157, and the thickness L4 of the protective layer 159, which were over the insulating layer 153, were 20 nm, 48 nm, and 45 nm, respectively.

FIG. 37B2 is an enlarged view of a region 162 shown in FIG. 37A. The length L5 in the cross-sectional direction of the protective layer 157 was 29 nm.

At least part of this example can be implemented in combination with any of the other embodiments or examples described in this specification as appropriate.

REFERENCE NUMERALS

10: display device, 20B: light-emitting element, 20G: light-emitting element, 20R: light-emitting element, 20: light-emitting element, 21A: layer, 21: lower electrode, 23a: EL layer, 23A: layer, 23B: EL layer, 23b: EL layer, 23G: EL layer, 23R: EL layer, 23: EL layer, 25A: layer, 25: upper electrode, 30a: gap, 30b: gap, 30: gap, 31: protective layer, 32A: layer, 32: protective layer, 33: protective layer, 34: protective layer, 35: microlens array, 36A: layer, 36: protective layer, 37: partition, 38: insulating layer, 39: protective layer, 41: adhesive layer, 43: light-blocking layer, 45: insulating layer, 47: substrate, 49B: coloring layer, 49G: coloring layer, 49R: coloring layer, 49: coloring layer, 50B: pixel, 50G: pixel, 50R: pixel, 50: pixel, 51: light, 61: insulating layer, 63: conductive layer, 65: conductive layer, 67: conductive layer, 69: conductive layer, 70: transistor, 71: insulating layer, 80: transistor, 81: substrate, 82: conductive layer, 83: insulating layer, 85a: low-resistance region, 85b: low-resistance region, 86: element isolation layer, 87: semiconductor layer, 88: insulating layer, 91: sealant, 93: connection electrode, 95: anisotropic conductive layer, 97: FPC, 100: display portion, 101: scan line driver circuit, 103: data line driver circuit, 105: wiring, 107: wiring, 110: pixel circuit, 111: transistor, 113: transistor, 115: capacitor, 117: node, 119: node, 121: layer, 123: layer, 125: layer, 131: insulating layer, 133: insulating layer, 135: insulating layer, 137: insulating layer, 140: transistor, 151: substrate, 153A: layer, 153: insulating layer, 155: insulating layer, 157: protective layer, 159: protective layer, 160: gap, 161: region, 162: region, 205a: conductor, 205b: conductor, 205c: conductor, 205: conductor, 214: insulator, 216: insulator, 222: insulator, 224: insulator, 230a: metal oxide, 230b: metal oxide, 230c: metal oxide, 230: metal oxide, 240a: conductor, 240b: conductor, 240: conductor, 241a: insulator, 241b: insulator, 241: insulator, 242a: conductor, 242b: conductor, 242: conductor, 250: insulator, 254: insulator, 260a: conductor, 260b: conductor, 260: conductor, 274: insulator, 280: insulator, 281: insulator, 4411: light-emitting layer, 4412: light-emitting layer, 4413: light-emitting layer, 4420: layer, 4430: layer, 8200: head-mounted display, 8201: mount part, 8202: lens, 8203: main body, 8204: display portion, 8205: cable, 8206: battery, 8300: head-mounted display, 8301: housing, 8302: display portion, 8304: fixing unit, 8305: lens, 8306: battery, 9000: housing, 9001: display portion, 9003: speaker, 9005: operation key, 9006: connection terminal, 9007: sensor, 9009: battery, 9050: operation button, 9051: information, 9101: portable information terminal, 9200: portable information terminal, 9251: time, 9252: operation button, 9253: content

The invention claimed is:

1. A display device comprising a first light-emitting element, a second light-emitting element, a first protective layer, a second protective layer and a gap,
   wherein the first light-emitting element comprises a first lower electrode, a first EL layer over the first lower electrode, and a first upper electrode over the first EL layer,
   wherein the second light-emitting element comprises a second lower electrode, a second EL layer over the second lower electrode, and a second upper electrode over the second EL layer,
   wherein the first light-emitting element is adjacent to the second light-emitting element,
   wherein the first protective layer is positioned over the first light-emitting element and the second light-emitting element,
   wherein the first protective layer includes regions that are in contact with a side surface of the first EL layer and a side surface of the second EL layer,
   wherein the second protective layer is positioned over the first protective layer, and
   wherein the gap is positioned between the first EL layer and the second EL layer and between the first protective layer and the second protective layer.

2. The display device according to claim 1, comprising a region where a distance between the side surface of the first EL layer and the side surface of the second EL layer is less than or equal to 1 μm.

3. The display device according to claim 1, wherein the gap includes one or more of nitrogen, oxygen, carbon dioxide and a gas of a Group 18 element.

4. The display device according to claim 3, wherein the gas of the Group 18 element includes one or more of helium, neon, argon, xenon and krypton.

5. The display device according to claim 1, wherein a refractive index of the first protective layer is higher than a refractive index of the gap.

6. The display device according to claim 1, further comprising a microlens array,
   wherein the microlens array is positioned over the second protective layer.

7. The display device according to claim 1, wherein the first EL layer and the second EL layer are configured to emit light of different colors.

8. The display device according to claim 1, further comprising:
   a first transistor and a second transistor,
   wherein one of a source and a drain of the first transistor is electrically connected to the first lower electrode,
   wherein one of a source and a drain of the second transistor is electrically connected to the second lower electrode, and
   wherein each of the first transistor and the second transistor includes silicon in a channel formation region.

9. The display device according to claim 1, further comprising:
   a first transistor and a second transistor,
   wherein one of a source and a drain of the first transistor is electrically connected to the first lower electrode,
   wherein one of a source and a drain of the second transistor is electrically connected to the second lower electrode, and
   wherein each of the first transistor and the second transistor includes a metal oxide in a channel formation region.

10. An electronic device comprising:
the display device according to claim 1; and
a lens.

* * * * *